United States Patent
Guo et al.

(10) Patent No.: US 9,536,537 B2
(45) Date of Patent: Jan. 3, 2017

(54) SYSTEMS AND METHODS FOR SPEECH RESTORATION

(71) Applicant: QUALCOMM Incorporated, San Diego, CA (US)

(72) Inventors: Yinyi Guo, San Diego, CA (US); Shuhua Zhang, San Diego, CA (US); Erik Visser, San Diego, CA (US); Lae-Hoon Kim, San Diego, CA (US); Sanghyun Chi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/634,637

(22) Filed: Feb. 27, 2015

(65) Prior Publication Data

US 2016/0254007 A1 Sep. 1, 2016

(51) Int. Cl.
*G10L 21/0208* (2013.01)
*G10L 21/034* (2013.01)
*H03G 5/00* (2006.01)
*H03G 5/16* (2006.01)
*G10L 21/0232* (2013.01)

(52) U.S. Cl.
CPC ....... *G10L 21/0208* (2013.01); *G10L 21/0232* (2013.01); *G10L 21/034* (2013.01); *H03G 5/005* (2013.01); *H03G 5/165* (2013.01)

(58) Field of Classification Search
None
See application file for complete search history.

(56) References Cited

U.S. PATENT DOCUMENTS

| 5,764,516 | A  | * | 6/1998 | Thompson ............ G01V 1/362 367/54 |
| 7,539,615 | B2 |   | 5/2009 | Koistinen et al. |
| 8,463,599 | B2 |   | 6/2013 | Ramabadran et al. |
| 2008/0140396 | A1 |   | 6/2008 | Grosse-Schulte et al. |
| 2009/0271187 | A1 | * | 10/2009 | Yen ..................... G10L 21/0208 704/226 |
| 2013/0282369 | A1 |   | 10/2013 | Visser et al. |
| 2013/0282372 | A1 |   | 10/2013 | Visser et al. |
| 2013/0282373 | A1 |   | 10/2013 | Visser et al. |

(Continued)

FOREIGN PATENT DOCUMENTS

| WO | 2013162993 A1 | 10/2013 |
| WO | 2013162994 A2 | 10/2013 |

(Continued)

OTHER PUBLICATIONS

Co-pending U.S. Appl. No. 61/637,175, filed Apr. 23, 2012.

(Continued)

*Primary Examiner* — Marcellus Augustin
(74) *Attorney, Agent, or Firm* — Austin Rapp & Hardman

(57) ABSTRACT

A method for speech restoration by an electronic device is described. The method includes obtaining a noisy speech signal. The method also includes suppressing noise in the noisy speech signal to produce a noise-suppressed speech signal. The noise-suppressed speech signal has a bandwidth that includes at least three subbands. The method further includes iteratively restoring each of the at least three subbands. Each of the at least three subbands is restored based on all previously restored subbands of the at least three subbands.

28 Claims, 47 Drawing Sheets

(56) References Cited

U.S. PATENT DOCUMENTS

2014/0207443 A1 7/2014 Hosoya et al.
2015/0243284 A1* 8/2015 Guo .................... G10L 15/20
                                                          704/233

FOREIGN PATENT DOCUMENTS

WO       2013162995 A2    10/2013
WO    WO-2014070139 A2     5/2014

OTHER PUBLICATIONS

Co-pending U.S. Appl. No. 61/658,843, filed Jun. 12, 2012.
Co-pending U.S. Appl. No. 61/726,458, filed Nov. 14, 2012.
Co-pending U.S. Appl. No. 61/738,976, filed Dec. 18, 2012.
Co-pending U.S. Appl. No. 61/913,151, filed Dec. 6, 2013.
3rd Generation Partnership Project 2 (3GPP2), Enhanced Variable Rate Codec, Speech Service Options 3, 68, and 70 for Wideband Spread Spectrum Digital Systems, 3GPP2 C.S0014-C, Version 1.0, Jan. 2007, ch. 4, pp. 4-1 to 9-23.
Chennoukh S et al., "Speech enhancement via frequency bandwidth extension using line spectral frequencies", IEEE International Conference on Acoustics, Speech, and Signal Processing, (ICASSP '01), 2001, pp. 665-668, vol. 1.
International Search Report and Written Opinion—PCT/US2016/016314—ISA/EPO—Apr. 21, 2016.
Mustiere et al., "Efficient SNR-Based Subband Postprocessing for Residual Noise Reduction in Speech Enhancement Algorithms," EUSIPCO 2011, Proceedings of, Aug. 23, 2010, pp. 1558-1561, XP055101329.
Zavarehei E et al., "Noisy Speech Enhancement Using Harmonic-Noise Model and Codebook-Based Post-Processing", IEEE Transactions on Audio, Speech and Language Processing, IEEE Service Center, New York, NY, USA, vol. 15, No. 4, May 1, 2007 (May 1, 2007), pp. 1194-1203, XP011177226, ISSN: 1558-7916, DOI:10.1109/TASL.2007.894516.

* cited by examiner

SYSTEMS AND METHODS FOR SPEECH RESTORATION

TECHNICAL FIELD

The present disclosure relates generally to electronic devices. More specifically, the present disclosure relates to systems and methods for speech restoration.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform new functions and/or that perform functions faster, more efficiently or with higher quality are often sought after.

Some electronic devices (e.g., cellular phones, smartphones, audio recorders, camcorders, computers, etc.) capture and/or utilize audio signals. For example, a smartphone may capture a speech signal. The audio signals may be stored and/or transmitted.

In some cases, the audio signals may include a desired audio signal (e.g., a speech signal) and noise. High levels of noise in an audio signal can degrade the audio signal. This may render the desired audio signal unintelligible or difficult to interpret. As can be observed from this discussion, systems and methods that improve audio signal processing may be beneficial.

SUMMARY

A method for speech restoration by an electronic device is described. The method includes obtaining a noisy speech signal. The method also includes suppressing noise in the noisy speech signal to produce a noise-suppressed speech signal. The noise-suppressed speech signal has a bandwidth that includes at least three subbands. The method further includes iteratively restoring each of the at least three subbands. Each of the at least three subbands is restored based on all previously restored subbands of the at least three subbands.

All previously restored subbands may be lower in frequency than a current subband being restored. Each previously restored subband may be nested within a combined frequency range of any previously restored subband and a current subband being restored. Iteratively restoring each of the at least three subbands may reduce more distortions over the bandwidth than restoring the noise-suppressed speech signal over the bandwidth without a basis on a restored subband.

The method may include analyzing a first subband of the at least three subbands. The method may also include cleaning the first subband based on the analysis.

Restoring a first subband of the at least three subbands may include modeling an envelope of the first subband and modeling a phase of the first subband. Restoring the first subband may also include adjusting the first subband based on the envelope and the phase.

Iteratively restoring each of the at least three subbands may include searching a codebook based only on a first subband of the at least three subbands to determine a selected entry. Entries of the codebook may span a bandwidth of the first subband and a second subband of the at least three subbands. Iteratively restoring each of the at least three subband may also include adjusting the second subband of the noise-suppressed speech signal based on the selected entry.

Iteratively restoring each of the at least three subbands may include determining a modeling confidence and determining a scaling factor based on the modeling confidence. Iteratively restoring each of the at least three subbands may also include mixing envelopes corresponding to one or more of the at least three subbands based on the scaling factor.

Iteratively restoring each of the at least three subbands may include detecting a microphone level for voiced frames and detecting a processed speech level for the voiced frames. Iteratively restoring each of the at least three subbands may also include determining a gain based on the microphone level and the processed speech level and applying the gain to a processed speech signal over the bandwidth.

Iteratively restoring each of the at least three subbands may include restoring a first subband of the at least three subbands to produce a restored first subband and restoring, based on the restored first subband, a second subband of the at least three subbands to produce a restored second subband. Iteratively restoring each of the at least three subbands may also include restoring, based on the restored first subband and the restored second subband, a third subband of the at least three subbands to produce a restored third subband.

The method may include restoring each of the at least three subbands, which may include pooling a restored first subband and a restored second subband of the at least three subbands. The method may include restoring each of the at least three subbands, which may include pooling a previously restored first subband and a previously restored second subband of the at least three subbands and predicting a third subband of the at least three subbands based on the pooled restored first subband and restored second subband.

An electronic device for speech restoration is also described. The electronic device includes a processor and memory in electronic communication with the processor. The electronic device also includes instructions stored in memory. The instructions are executable to obtain a noisy speech signal. The instructions are also executable to suppress noise in the noisy speech signal to produce a noise-suppressed speech signal. The noise-suppressed speech signal has a bandwidth comprising at least three subbands. The instructions are further executable to iteratively restore each of the at least three subbands. Each of the at least three subbands is restored based on all previously restored subbands of the at least three subbands.

An apparatus for speech restoration is also described. The apparatus includes means for obtaining a noisy speech signal. The apparatus also includes means for suppressing noise in the noisy speech signal to produce a noise-suppressed speech signal. The noise-suppressed speech signal has a bandwidth comprising at least three subbands. The apparatus further includes means for iteratively restoring each of the at least three subbands. Each of the at least three subbands is restored based on all previously restored subbands of the at least three subbands.

A computer-program product for speech restoration is also described. The computer-program product includes a non-transitory computer-readable medium with instructions. The instructions include code for causing an electronic device to obtain a noisy speech signal. The instructions also include code for causing the electronic device to suppress noise in the noisy speech signal to produce a noise-suppressed speech signal. The noise-suppressed speech signal has a bandwidth comprising at least three subbands. The instructions further include code for causing an electronic device to iteratively restore each of the at least three subbands. Each of the at least three subbands is restored based on all previously restored subbands of the at least three subbands.

DETAILED DESCRIPTION

Systems and methods for speech restoration are described herein. Some configurations of the systems and methods disclosed herein may provide band-wise speech modeling-based noise suppression and speech envelope restoration.

Some problems of speech enhancement systems are given as follows. Speech enhancement systems may suffer from perceptually significant residue noise due to under-estimation of a noise reference from spatial filtering. The speech envelope may be corrupted in sub-bands due to low sub-band signal-to-noise ratio (SNR). Muffled speech may occur, due to low high-band SNR and over-estimation of a high-band noise reference. Speech enhancement systems may also suffer from high-band music noise leakage due to under-estimation of a highly non-stationary noise reference.

In some approaches, processed speech suffers from a large envelope deviation from the clean speech envelope. Accordingly, there is a need for an independent speech modeling systems and methods for restoring a speech envelope to approximately match a clean speech envelope in various SNR and noise conditions.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

Figure 1:
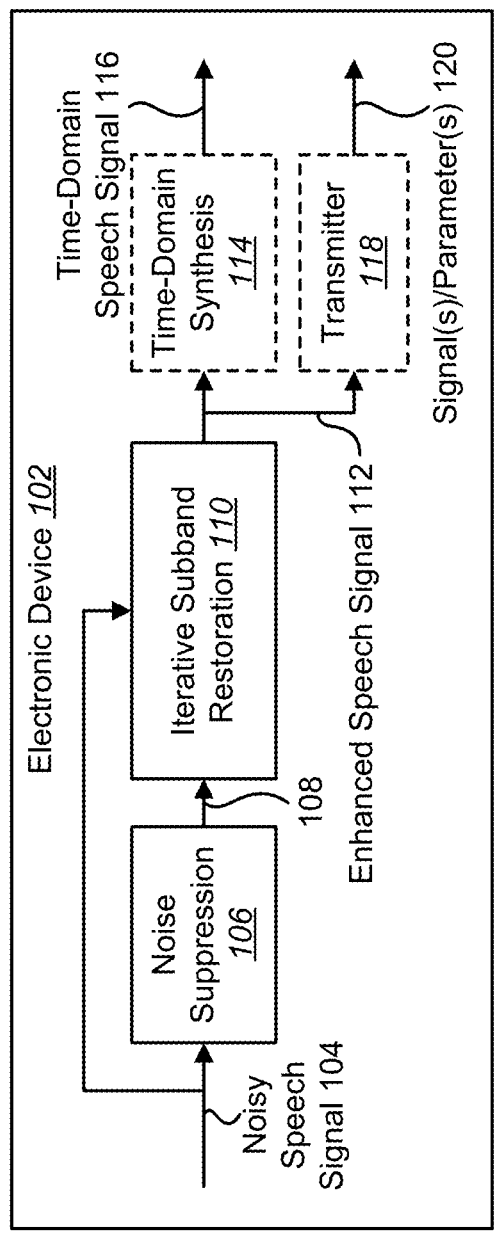
FIG. 1 is a block diagram illustrating one example of an electronic device in which systems and methods for speech restoration may be implemented.

FIG. 1 is a block diagram illustrating one example of an electronic device 102 in which systems and methods for speech restoration may be implemented. Examples of the electronic device 102 include cellular phones, smartphones, tablet devices, voice recorders, laptop computers, desktop computers, landline phones, camcorders, still cameras, in-dash electronics, game systems, televisions, appliances, etc. One or more of the components of the electronic device 102 may be implemented in hardware (e.g., circuitry) or a combination of hardware and software. As used herein, a "module" may be implemented in hardware (e.g., circuitry) or a combination of hardware and software.

Arrows and/or lines may denote couplings between components or elements in the block diagrams illustrated in the Figures. A "coupling" or variations of the term "couple" may denote a direct connection or indirect connection between components or elements. For example, a first component that is coupled to a second component may be connected directly to the second component (without intervening components) or may be indirectly connected to the second component (with one or more intervening components).

The electronic device 102 may include a noise suppression module 106 and an iterative subband restoration module 110. The electronic device 102 may obtain a noisy speech signal 104. For example, the electronic device 102 may capture the noisy speech signal 104 from one or more microphones included in the electronic device 102 (not shown in FIG. 1). In some configurations, the noisy speech signal 104 may be a sampled version of an analog audio signal that has be converted by an analog-to-digital converter (ADC) (not shown in FIG. 1) included in the electronic device 102. In another example, the electronic device 102 may obtain the noisy speech signal 104 from another device. For example, the electronic device 102 may receive the noisy speech signal 104 from a Bluetooth headset or some other remote device (e.g., smartphone, camera, etc.). In some configurations, the noisy speech signal 104 may be formatted (e.g., divided) into frames. The noisy speech signal 104 (e.g., one or more frames of the noisy speech signal 104) may be provided to the noise suppression module 106 and/or to the iterative subband restoration module 110. It should be noted that the noise suppression module 106 may be optional. For example, the systems and methods disclosed herein may work in conjunction with or independently from noise suppression.

It should be noted that one or more of the components of the electronic device 102 may be optional. For example, some implementations of the electronic device 102 may include only one of the components illustrated. Other implementations may include two or more of the components illustrated. In particular, some implementations of the electronic device 102 may include only one of the noise suppression module 106 and the iterative subband restoration module 110. Other implementations may include two or more of the components illustrated.

The noise suppression module 106 may suppress noise in the noisy speech signal 104. For example, the noise suppression module 106 may detect and/or remove one or more interfering signals or components thereof from the noisy speech signal 104. The noise suppression module 106 may produce a noise-suppressed speech signal 108. The noise-suppressed speech signal 108 may have a bandwidth (e.g., an entire bandwidth or frequency range) that includes one or more subbands (e.g., two, three or more subbands). For example, the bandwidth of the noise-suppressed speech signal 108 may range from 0 to 8 kilohertz (kHz) in frequency. In some configurations, the bandwidth of the noise-suppressed speech signal 108 may include three subbands, where a first subband ranges from 0-2 kHz, a second subband ranges from 2-4 kHz and a third subband ranges from 4-8 kHz. It should be noted that although examples of bandwidth and subbands are given herein, the systems and methods disclosed herein may be applied to other bandwidths and/or subbands. In another example, the noise-suppressed speech signal 108 may have a bandwidth of 16 kHz with four subbands in ranges of 0-1.9 kHz, 1.9-3.8 kHz, 3.8-7.8 kHz and 7.8-16 kHz.

The noise-suppressed speech signal 108 and/or the (original) noisy speech signal 104 may be provided to the iterative subband restoration module 110. The iterative subband restoration module 110 may iteratively restore each of the subbands of the noise-suppressed speech signal (and/or of the noisy speech signal 104). Each of the subbands (of the noise-suppressed speech signal 108, for example) may be restored based on all previously restored subbands (of the noise-suppressed speech signal 108, for example). For instance, the iterative subband restoration module 110 may restore each of the subbands, one at a time. Once a subband is restored, it may be utilized as a basis for restoring the next subband. For example, once a first subband is restored, a second subband may be restored based on the restored first subband. Furthermore, once a first subband and second subband are restored, a third subband may be restored based on both the restored first subband and the restored second subband (e.g., a combination of the restored first subband and the restored second subband). In some configurations, this procedure may iterate for more subbands. For example, a fourth subband may be restored based on the restored first subband, the restored second subband and the restored third subband. It should be noted that an initial subband to be restored (e.g., a first subband) may not be based on any previously restored subband (since no subband has been previously restored for that frame, for example). The iterative subband restoration module 110 may produce an enhanced speech signal 112 based on all of the restored subbands. For example, the enhanced speech signal 112 may be a combination of all of the restored subbands.

Additionally or alternatively, the iterative subband restoration module 110 may restore each of at least three subbands, including pooling two or more previously restored subbands. The pooled restored subbands may be utilized to predict another subband. Additionally or alternatively, the iterative subband restoration module 110 may restore at least three subbands, where each previously restored subband is nested within a combined frequency range of any previously restored subband and a current subband being restored.

In some configurations, all previously restored subbands are lower in frequency than a current subband being restored. For example, the iterative subband restoration may begin with a lowest subband frequency (e.g., lowest minimum frequency in a subband range) and then successively restore subbands in order of increasing frequency (e.g., increasing minimum frequencies in respective subband ranges). In some configurations, the lowest subband in the bandwidth (e.g., 0-2 kHz) may be an anchor point from which one or more additional subbands are iteratively restored. An anchor point subband may be a subband that is more resilient to noise than one or more other subbands included in the bandwidth.

Progressively or successively restoring subbands in an increasing order may be advantageous for one or more reasons. For example, speech structure is particularly robust to noise in lower bands (e.g., bands below 2 kHz). Harmonic speech peaks and their evolution in time can be clearly determined prior to and after noise suppression (e.g., denoising) so a lower band (e.g., a 0-2 kHz subband) may be beneficially utilized as an anchor point to look up remaining missing envelope subbands via a codebook approach. Accordingly, some configurations of the systems and methods disclosed herein may use a nested approach to recover a complete bandwidth (e.g., wide band speech signal, 0-8 kHz, 0-16 kHz etc.) based on iteratively restored subbands.

An example of iterative subband restoration in accordance with some configurations of the systems and methods disclosed herein is given as follows. First, a first subband (e.g., lowest subband, a 0-2 kHz subband, etc.) of the noisy speech signal 104 is de-noised (by the noise suppression module 106, for example). Speech structure of the first subband may be restored based on harmonic analysis. Second, the restored (e.g., recovered) first subband may be matched against a codebook to predict a corresponding second subband (e.g., 2-4 kHz) clean speech envelope. The de-noised second subband envelope may in turn be restored by applying a gain to the de-noised second subband spectrum such that the resulting envelope approximates (e.g., is as close as possible to) the predicted clean speech codebook envelope. Third, the results from the first and second steps (e.g., the restored first subband and the restored second subband) may be pooled or nested to predict a third subband (e.g., a 4-8 kHz high band) clean speech envelope. A gain may be applied to the de-noised third subband speech signal to approximate the clean speech signal predicted envelope (e.g., match the predicted envelope as closely as possible).

This approach may provide more robust results due to initial reliance on the most robust speech subband information in noisy environments, which may be gradually extended to higher subbands in iterative steps. As more confidence is attained with each restored subband and the result of each previous subband restoration is pooled together to provide a basis for prediction for the next subband, a robust speech restoration approach is obtained.

In some configurations of the systems and methods disclosed herein, a restored subband may not be a synthetic signal generated by blind bandwidth extension. For example, some blind bandwidth extension approaches rely on artificial excitation signals to produce synthetic speech in a frequency range where no original speech signal is available or in replacement of an original speech signal. However, some configurations of the systems and methods disclosed herein may restore a damaged (e.g., noise-suppressed) speech signal (in one or more subbands, for example) by adjusting (e.g., correcting, scaling, etc.) the original damaged speech signal in the envelope domain. This is distinct from some bandwidth extension approaches, which rely on artificial excitation signals to resynthesize speech (e.g., to create a synthetic signal in a frequency range where no speech signal is available). It may be advantageous to avoid directly estimating excitation signals to produce synthetic speech, as this may be prone to lead to artifacts due to speech parameter estimation errors, since most blind bandwidth extension applications assume high SNR conditions for accurate pitch/parameter estimation. Instead, in order to estimate an artifacts-free speech signal, the de-noised signals (e.g., the noise-suppressed speech signals 108) may be corrected via scaling to attempt matching ideal clean speech envelopes. Restoring speech in the envelope domain may be more efficient in terms of spectral energy and/or may also be less sensitive to audible artifacts.

In some configurations, the enhanced speech signal 112 may be optionally provided to an optional time-domain synthesis module 114. The time-domain synthesis module 114 may generate a time-domain speech signal 116 based on the enhanced speech signal 112. The time-domain speech signal may be obtained, for example, by applying a frequency-to-time transform for each frame, and then applying a weighted overlap-and-add operation to the transformed signal for each frame.

In some configurations, the enhanced speech signal 112 (and/or one or more signals and/or parameters utilized to derive the enhanced speech signal 112 may be optionally provided to an optional transmitter 118. The transmitter 118 may transmit the enhanced speech signal 112 and/or one or more signals and/or parameters utilized to derive the enhanced speech signal 112. In some configurations, one or more of the signals and/or parameters 120 may be quantized before transmission.

Figure 2:
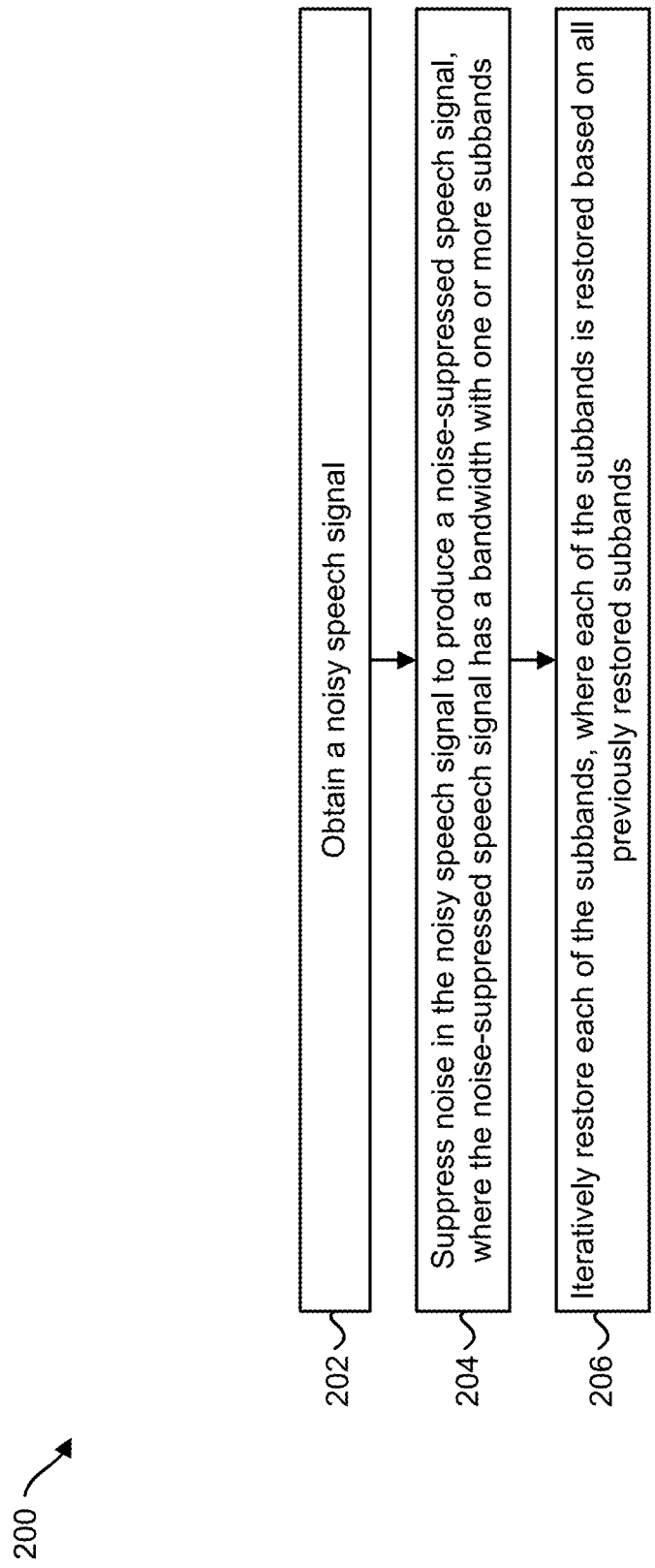
FIG. 2 is a flow diagram illustrating an example of a method for speech restoration.

FIG. 2 is a flow diagram illustrating an example of a method 200 for speech restoration. The method 200 may be performed by the electronic device 102. The electronic device 102 may obtain 202 a noisy speech signal 104. This may be accomplished as described above in connection with FIG. 1.

The electronic device 102 may suppress 204 noise in the noisy speech signal 104 to produce a noise-suppressed speech signal 108. This may be accomplished as described above in connection with FIG. 1. The noise-suppressed speech signal 108 (and/or the noisy speech signal 104) may have a bandwidth with one or more subbands (e.g., two, three or more subbands). For example, the bandwidth may include one or more subbands, where each subband is a part of the bandwidth. In some configurations, the electronic device 102 may analyze a first subband of the bandwidth and clean the first subband based on the analysis. More specific examples of approaches for analyzing and/or cleaning a subband are given in connection with FIG. 10.

The electronic device 102 may iteratively restore 206 each of the subbands. Each of the subbands may be restored based on all previously restored subbands. This may be accomplished as described above in connection with FIG. 1. In some configurations, all previously restored subbands may be lower in frequency than a current subband being restored. Iteratively restoring 206 each of the at least three subbands may reduce more distortions over the bandwidth than restoring the noise-suppressed speech signal 108 over the bandwidth without a basis on a restored subband.

In some configurations, restoring each of the subbands may include pooling two or more previously restored subbands (of the at least three subbands, for instance). For example, pooling two or more previously restored subbands may include combining (e.g., concatenating) the two or more previously restored subbands, where the combined restored subbands (e.g., pooled subbands) may be a basis for predicting another subband. The electronic device 102 may restore each of the subbands. Restoring each of the subbands may include pooling a restored first subband and a restored second subband.

Pooled restored subbands may be used to predict one or more additional subbands. For example, pooled restored subbands may be used as a basis for searching a codebook (where the codebook extends into a frequency range outside of the pooled subbands) and/or extending the bandwidth of the pooled subbands to a frequency range outside of the pooled subbands. In some configurations, the electronic device 102 may restore each of the subbands by pooling a previously restored first subband and a previously restored second subband of the at least three subbands. A third subband may be predicted based on the pooled restored first subband and the restored second subband. In some configurations, the pooled subbands may be contiguous in a frequency range.

Additionally or alternatively, each previously restored subband may be nested within a combined frequency range of any previously restored subband and a current subband being restored. For example, each iteration of subband restoration may restore a subband based on any previously restored subband(s), where all of the previously restored subband(s) are within the combined frequency range of the previously restored subband(s) and the subband being restored. Accordingly, each iteration may enlarge the total (e.g., contiguous) frequency range of restored subbands.

One example of iteratively restoring 206 each of the subbands is given as follows, where the bandwidth includes three subbands. First, the electronic device 102 may restoring a first subband of the three subbands to produce a restored first subband. Second, the electronic device 102 may restore, based on the restored first subband, a second subband of the at least three subbands to produce a restored second subband. Third, the electronic device 102 may restore, based on the restored first subband and the restored second subband, a third subband of the three subbands to produce a restored third subband.

In some configurations, restoring 206 a first subband of the bandwidth may include modeling an envelope of the first subband and modeling a phase of the first subband. The first subband may be adjusted based on the envelope and the phase. More specific examples of approaches for modeling an envelope and/or modeling a phase are given in connection with FIG. 11.

In some configurations, iteratively restoring 206 each of the subbands may include searching a codebook based only on a first subband (of the bandwidth) to determine a selected entry. Entries of the codebook may span a bandwidth of (e.g., a frequency range of) the first subband and a second subband. The first subband and second subband may be subbands of the entire bandwidth and the span of the first subband and the second subband may be a sub-bandwidth (e.g., a sub-frequency range) of the entire bandwidth. The second subband of the noise-suppressed speech signal may be adjusted based on the selected entry. More specific examples of approaches for searching a codebook and adjusting a subband are given in connection with FIG. 13.

In some configurations, iteratively restoring 206 each of the subbands may include determining a modeling confidence and determining a scaling factor based on the modeling confidence. Envelopes corresponding to one or more of the subbands may be mixed based on the scaling factor. More specific examples of approaches for determining the modeling confidence, determining the scaling factor and/or mixing envelopes are given in connection with one or more of FIG. 13 and FIG. 15.

In some configurations, iteratively restoring 206 each of the subbands may include detecting a microphone level for voiced frames and detecting a processed speech level for the voiced frames. A gain may be determined based on the microphone level and the processed speech level. The gain may be applied to a processed speech signal over the bandwidth. More specific examples of approaches for determining the microphone level, determining the processed speech level, determining the gain and/or applying the gain are given in connection with FIG. 17.

In some configurations, the electronic device 102 may provide an enhanced speech signal 112. This may be accomplished as described above in connection with FIG. 1. For example, the electronic device 102 may generate a time-domain speech signal 116 based on the enhanced speech signal 112. Additionally or alternatively, the electronic device 102 may transmit the enhanced speech signal 112 and/or one or more signals and/or parameters 120 utilized to derive the enhanced speech signal 112.

Figure 3:
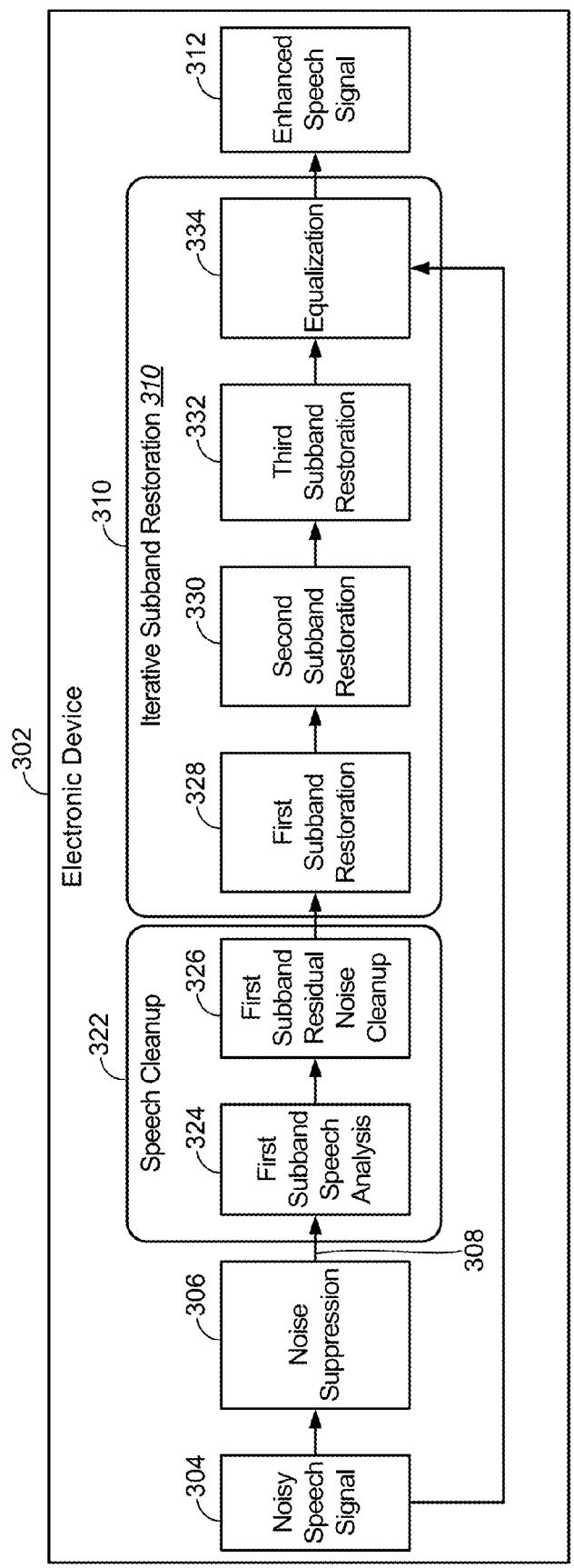
FIG. 3 is a block diagram illustrating a more specific example of an electronic device in which systems and methods for speech restoration may be implemented.

FIG. 3 is a block diagram illustrating a more specific example of an electronic device 302 in which systems and methods for speech restoration may be implemented. The electronic device 302 described in connection with FIG. 3 may be one example of the electronic device 102 described in connection with FIG. 1.

Some configurations of the systems and methods disclosed herein may follow a single-channel band-wise approach that removes residual noise and/or reconstructs a speech envelope by harmonic analysis and speech modeling, where the approach does not depend on spatial information and/or a noise estimate (e.g., a noise estimate from spatial processing). In some configurations, the band-wise two-phases processing may be performed after noise suppression processing.

The electronic device 302 may include a noise suppression module 306, an optional speech cleanup module 322 and/or an iterative subband restoration module 310. The electronic device 302 may obtain a noisy speech signal 304. This may be accomplished as described in connection with FIG. 1, for example. The noisy speech signal 304 (e.g., one or more frames of the noisy speech signal 304) may be provided to the noise suppression module 306 and to the iterative subband restoration module 310.

The noise suppression module 306 may suppress noise in the noisy speech signal 304. This may be accomplished as described in connection with FIG. 1, for example. The noise suppression module 306 may produce a noise-suppressed speech signal 308. The noise-suppressed speech signal 308 may have a bandwidth that includes at least three subbands (e.g., three or more subbands). For example, the bandwidth of the noise-suppressed speech signal 308 may range from 0-8 kHz, where a first subband ranges from 0-2 kHz, a second subband ranges from 2-4 kHz and a third subband ranges from 4-8 kHz. As noted above, other bandwidths and/or subband ranges may be utilized. While the noise suppression module 306 may suppress noise in the noisy speech signal, the resulting noise-suppressed speech signal 308 may still include some residual noise and/or may include a damaged speech signal as a result of the noise suppression. It may be beneficial to further remove noise and/or enhance the resulting noise-suppressed speech signal 308 after noise suppression.

The noise suppressed speech signal 308 may be provided to the optional speech cleanup module 322. The speech cleanup module 322 may include a first subband speech analysis module 324 and/or a first subband residual noise cleanup module 326. In some configurations, the operations performed by the speech cleanup module 322 may be considered a first phase (of two phases) of processing for improving the noise-suppressed speech signal 308. For example, this first phase (which may be optional) may include harmonic analysis and/or speech cleanup for a first subband (e.g., a subband ranging from 0-2 kHz).

The noise-suppressed speech signal 308 may be provided to the first subband speech analysis module 324. The first subband speech analysis module 324 may analyze the first subband. For example, the first subband speech analysis module 324 may perform one or more of peak analysis (e.g., picking peaks and/or refining peaks) and harmonic analysis (e.g., computing a harmonicity and/or selecting pitch candidates) based on the first subband of the noise-suppressed speech signal 308. One or more examples of approaches for first subband speech analysis may be given in connection with one or more of FIGS. 10, 20-28 and 37-38.

The first subband residual noise cleanup module 326 may remove one or more non-speech peaks from the first subband of the noise-suppressed speech signal 308, may clean up speech valleys (e.g., regions between speech peaks) and/or may whiten non-speech frames. One or more examples of approaches for first subband residual noise cleanup may be given in connection with one or more of FIGS. 10, 20-28 and 37-38. Performing the first subband speech analysis and/or first subband residual noise cleanup may produce a cleaned first subband of the noise-suppressed speech signal 308. The cleaned first subband (and the remaining bandwidth of the noise-suppressed speech signal 308, for example) may be provided to the iterative subband restoration module 310 (e.g., to a first subband restoration module 328).

The iterative subband restoration module 310 may restore each of the subbands of the noise-suppressed speech signal 308. The iterative subband restoration module 310 may include a first subband restoration module 328, a second subband restoration module 330, a third subband restoration module 332 and/or an equalization module 334.

In some configurations, the first subband restoration module 328 may restore the first subband by performing speech enrichment (e.g., low-band speech enrichment for 0-2 kHz). A more specific example of an approach for speech enrichment is given in connection with FIG. 11.

In some configurations, the second subband restoration module 330 may restore the second subband by performing speech anti-muffling (e.g., low-band speech anti-muffling for 2-4 kHz). A more specific example of an approach for speech anti-muffling is given in connection with FIG. 13.

In some configurations, the third subband restoration module 332 may restore the third subband by performing envelope adjustment (e.g., high-band envelope correction for 4-8 kHz). A more specific example of an approach for envelope adjustment is given in connection with FIG. 15.

In some configurations, the equalization module 334 may equalize the bandwidth (e.g., performing speech-level equalization for 0-8 kHz). A more specific example of an approach for bandwidth equalization is given in connection with FIG. 17.

It should be noted that one or more of the operations of the iterative subband restoration module 310 (e.g., subband speech restoration module) may be considered a second phase of processing for improving the noise-suppressed speech signal 308 (e.g., speech envelope restoration for 0-8 kHz) in some configurations. The iterative subband restoration module 310 may produce an enhanced speech signal 312.

Figure 4:
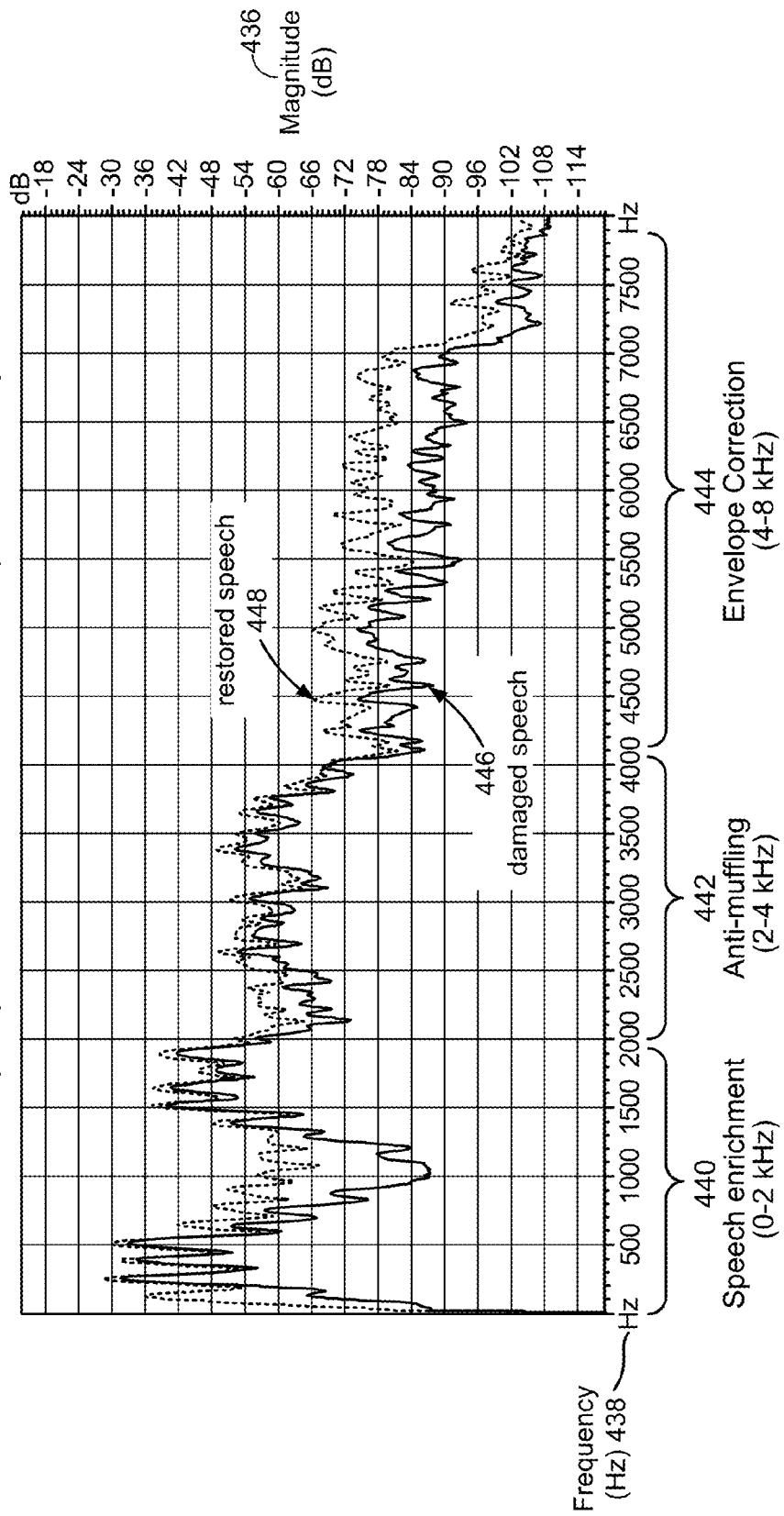
FIG. 4 is a graph illustrating one example of speech frames before and after speech envelope restoration in accordance with the systems and methods disclosed herein.

FIG. 4 is a graph illustrating one example of speech frames before and after speech envelope restoration in accordance with the systems and methods disclosed herein. The graph is illustrated in signal magnitude 436 (in decibels (dB)) over frequency 438 (in Hertz (Hz)). In particular, the graph illustrates a plot of damaged speech 446 (e.g., a noise-suppressed speech signal) and a plot of restored speech 448. As illustrated in FIG. 4, speech enrichment 440, anti-muffling 442 and envelope correction 444 may improve speech signal structure.

Some benefits of the systems and methods disclosed herein are given as follows. In some configurations of the systems and methods disclosed herein, the modeling approach is independent of spatial information and a noise reference estimate, which may not be reliable (when a device is in a non-optimal talking position and/or in poor SNR scenarios, for example). Speech envelope restoration may be conducted in a band-by-band manner from lower to higher frequencies. It may be more reliable to gradually match the clean speech envelope than directly restoring the whole band envelope. Accordingly, restoration may begin from a more reliable spectral subband (e.g., 0-2 kHz), where prominent harmonic and/or peak content may be obtained. This may be followed by speech cleanup and enrichment 440. Speech cleanup and enrichment 440 may be performed in the lowest subband first. Based on the restored first subband speech envelope, a second subband (e.g., 2-4 kHz) envelope may be modeled with codebook-based approach in order to restore muffled speech caused by a worse subband SNR condition than in the first subband (e.g., 0-2 kHz). As SNR may become even worse in the third subband (e.g., 4-8 kHz), especially in pink and music noise cases, the third (e.g., high) subband speech envelop maybe restored and adjusted (e.g., approximately matched) to a clean speech envelope with the help of recovered lower band (e.g., first subband and second subband, such as 0-4 kHz) speech. Quantitative evaluation has demonstrated a significant improvement using the speech envelope restoration approach in comparison with another approach. FIGS. 5-9 illustrate improvements in a noise-suppressed speech spectrum corresponding to some of the operations described in connection with FIG. 3.

Figure 5:
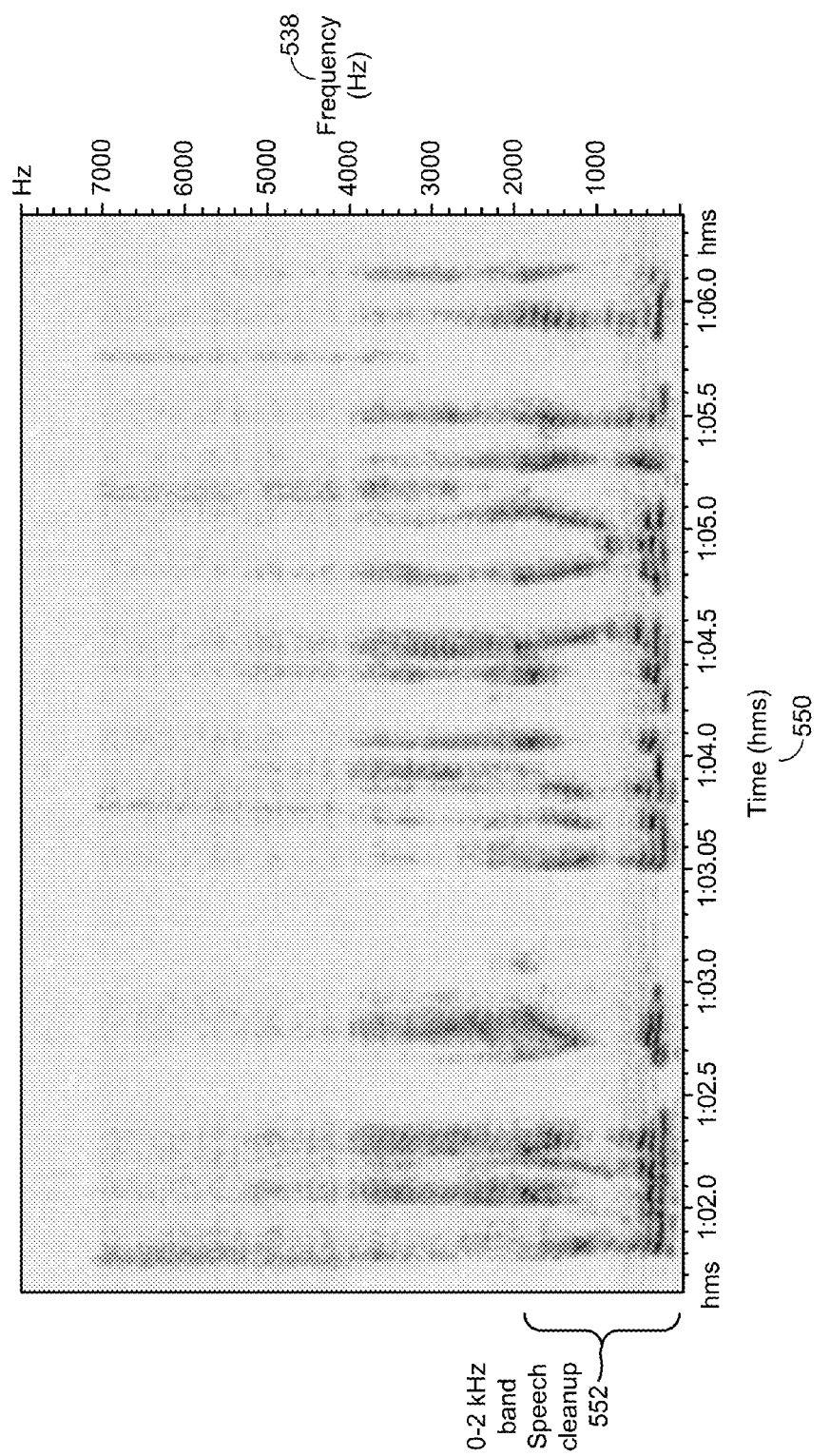
FIG. 5 is a graph illustrating an example of a processed speech spectrogram after speech cleanup.

FIG. 5 is a graph illustrating an example of a processed speech spectrogram after speech cleanup. The graph is illustrated in frequency (Hz) 538 over time (hours, minutes and seconds (hms)) 550. Specifically, FIG. 5 illustrates first phase speech cleanup 552 in a 0-2 kHz subband for a 6 dB pink noise case. This may be one example of a signal resulting from the first subband residual noise cleanup described in connection with FIG. 3.

Figure 6:
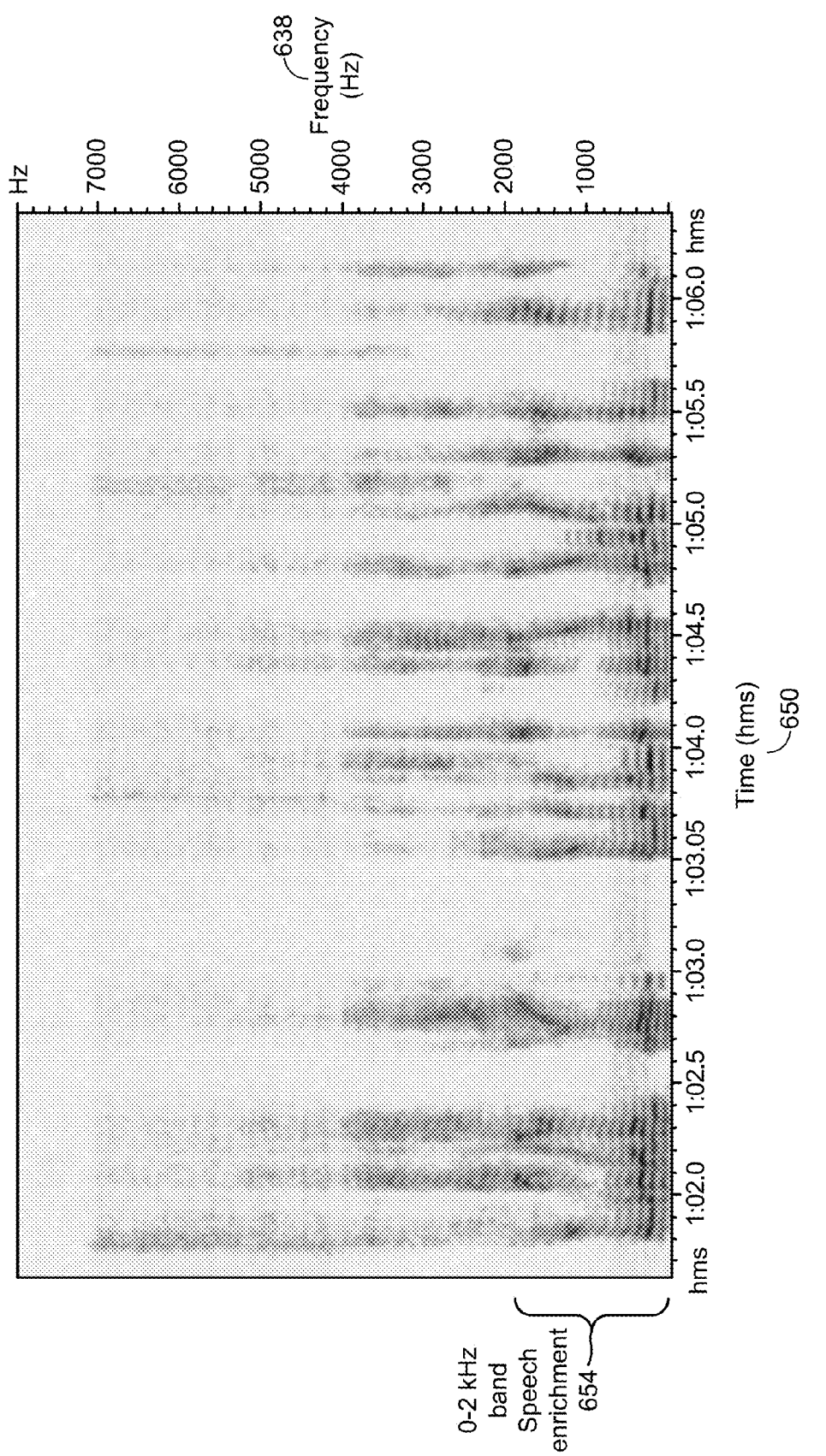
FIG. 6 is a graph illustrating an example of a processed speech spectrogram after first subband restoration.

FIG. 6 is a graph illustrating an example of a processed speech spectrogram after first subband restoration. The graph is illustrated in frequency (Hz) 638 over time (hms) 650. Specifically, FIG. 6 illustrates second phase speech enrichment 654 in a 0-2 kHz subband for a 6 dB pink noise case. This may be one example of a signal resulting from the first subband restoration described in connection with FIG. 3.

Figure 7:
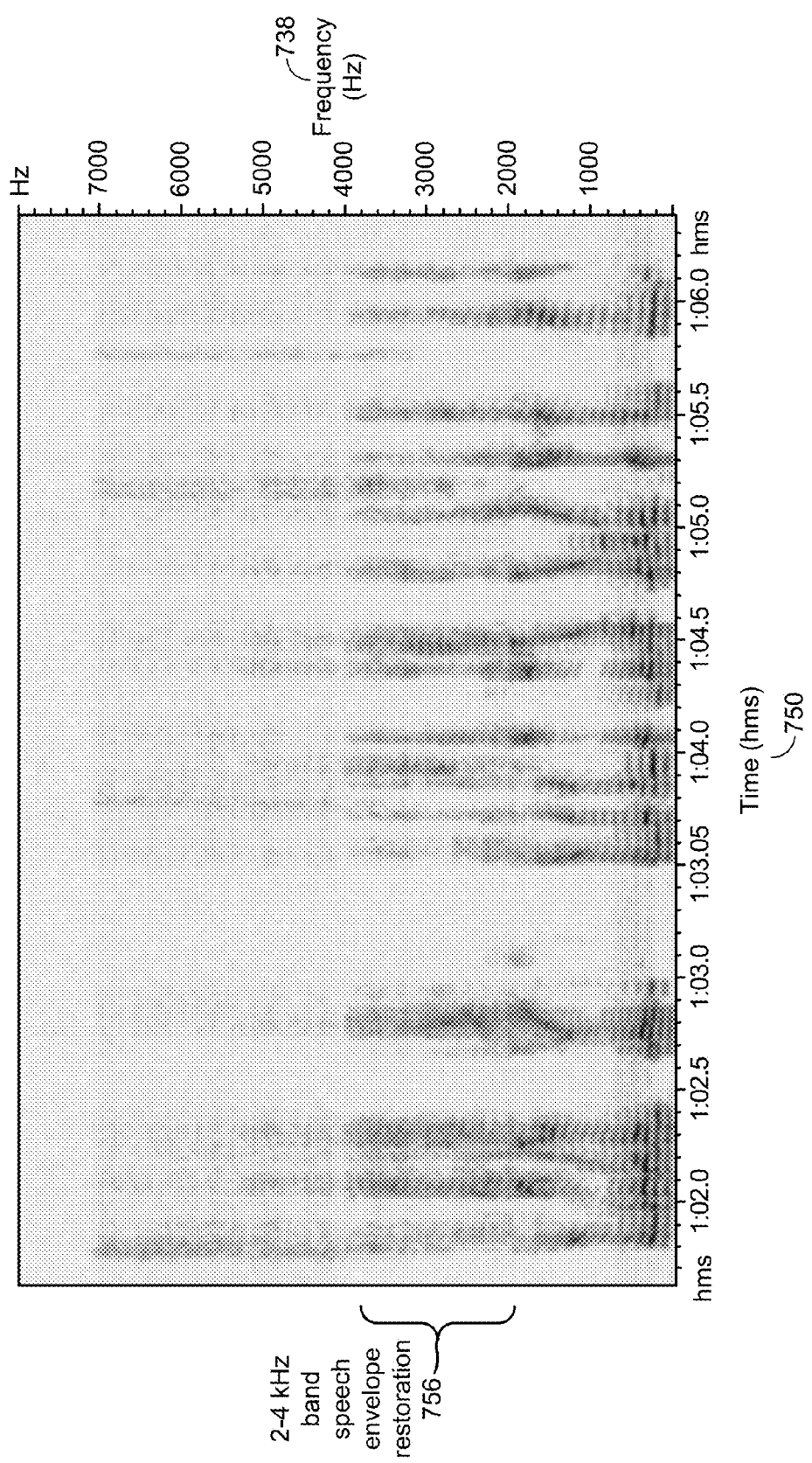
FIG. 7 is a graph illustrating an example of a processed speech spectrogram after second subband restoration.

FIG. 7 is a graph illustrating an example of a processed speech spectrogram after second subband restoration. The graph is illustrated in frequency (Hz) 738 over time (hms) 750. Specifically, FIG. 7 illustrates second phase speech anti-muffling in a 2-4 kHz subband for a 6 dB pink noise case. This may be one example of a signal resulting from the second subband restoration 756 described in connection with FIG. 3.

Figure 8:
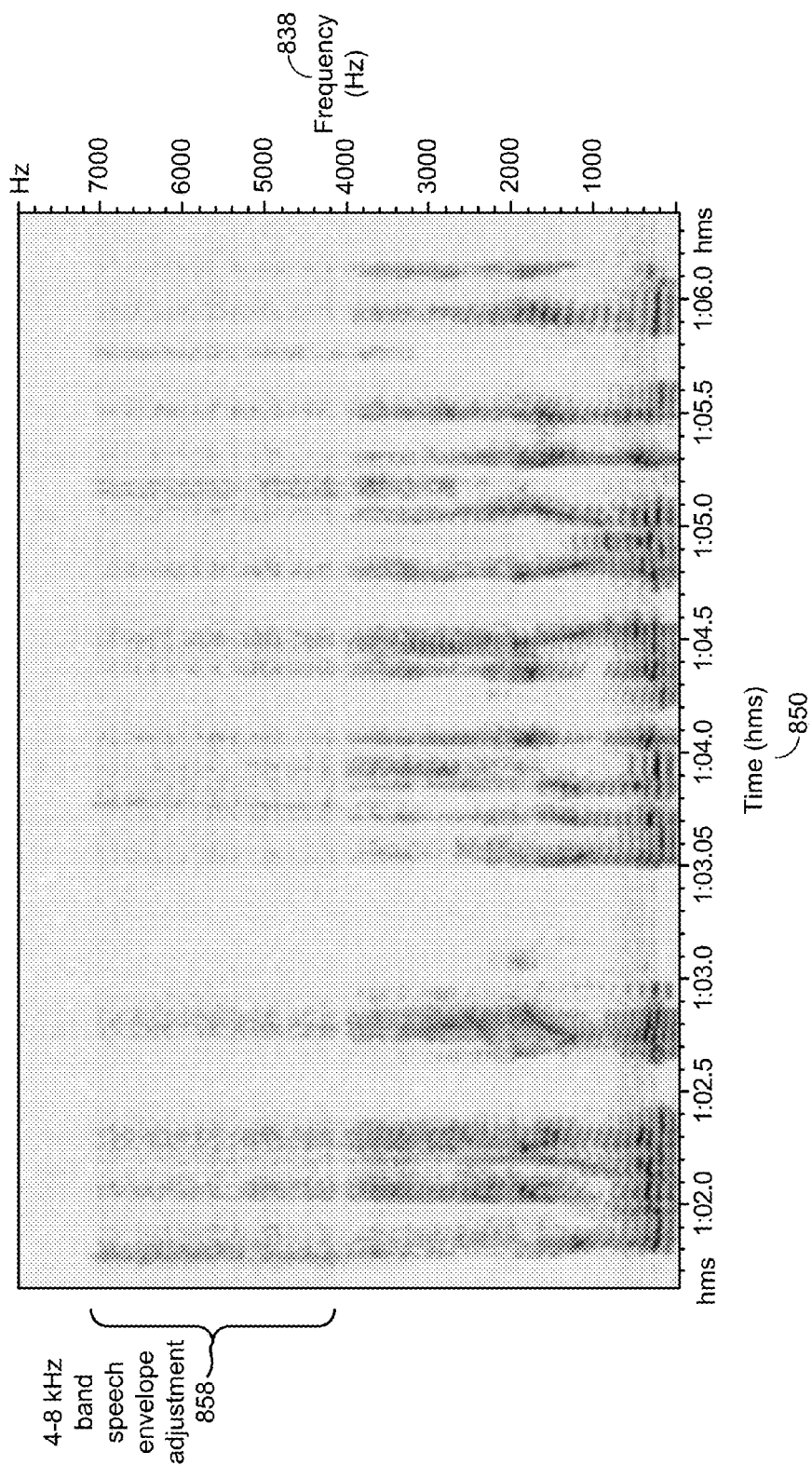
FIG. 8 is a graph illustrating an example of a processed speech spectrogram after third subband restoration.

FIG. 8 is a graph illustrating an example of a processed speech spectrogram after third subband restoration. The graph is illustrated in frequency (Hz) 838 over time (hms) 850. Specifically, FIG. 8 illustrates second phase high-band envelope adjustment (e.g., correction) 858 in a 4-8 kHz subband for a 6 dB pink noise case. This may be one example of a signal resulting from the third subband restoration described in connection with FIG. 3.

Figure 9:
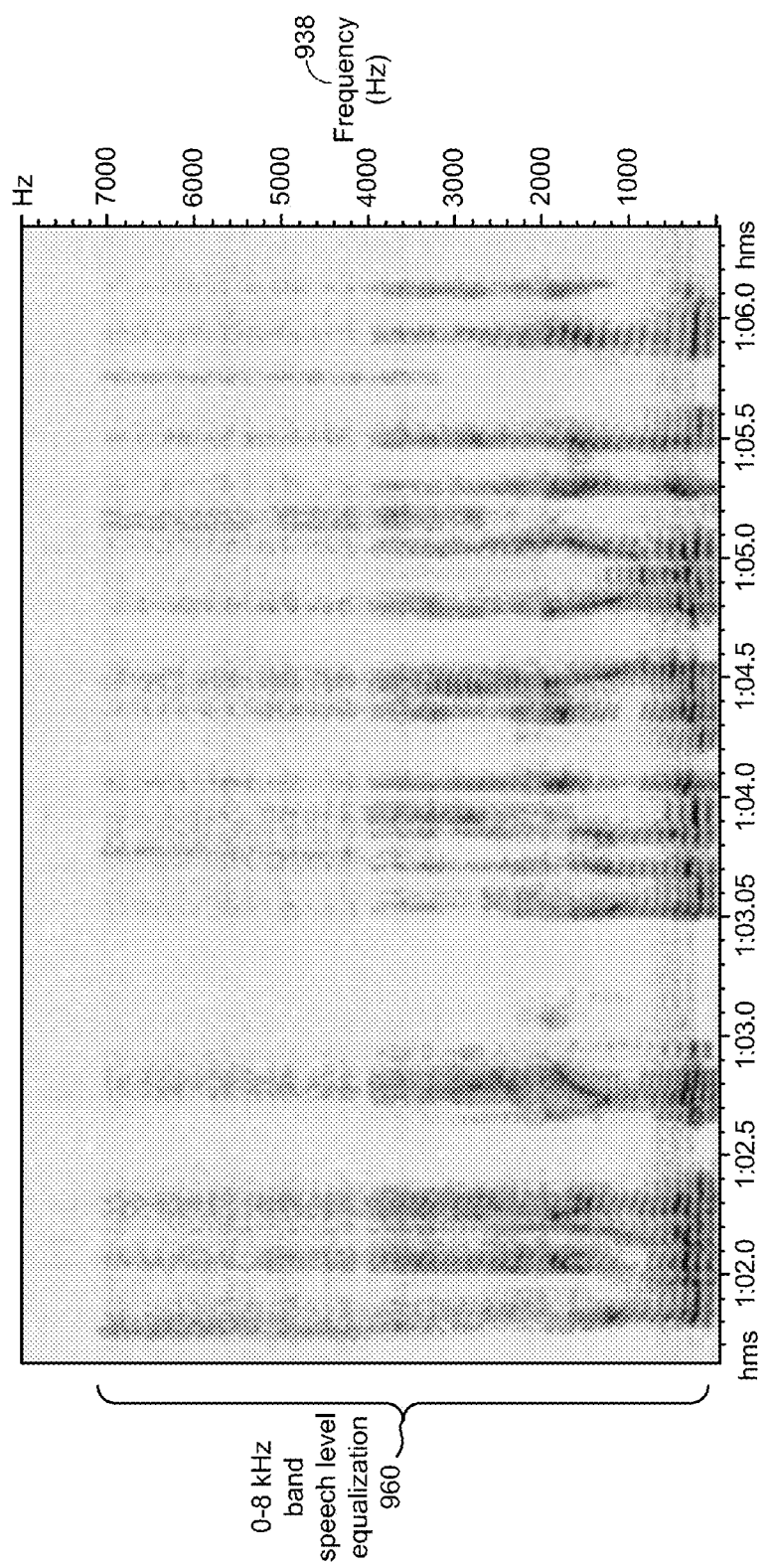
FIG. 9 is a graph illustrating an example of a processed speech spectrogram after third subband restoration.

FIG. 9 is a graph illustrating an example of a processed speech spectrogram after third subband restoration. The graph is illustrated in frequency (Hz) 938 over time (hms) 950. Specifically, FIG. 8 illustrates second phase speech-level equalization 960 in a 0-8 kHz bandwidth for a 6 dB pink noise case. This may be one example of a signal resulting from the equalization described in connection with FIG. 3.

Figure 10:
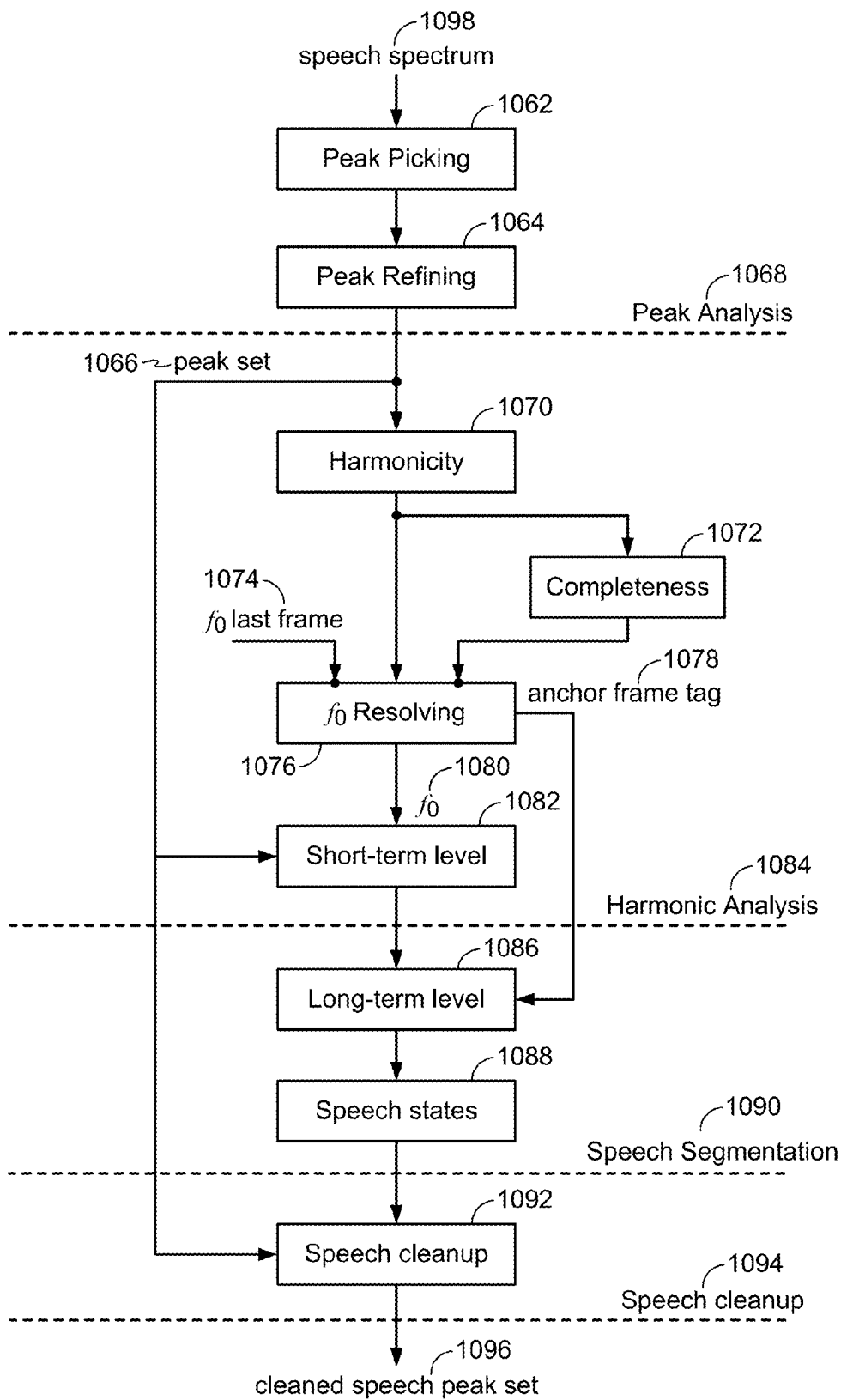
FIG. 10 is a block diagram illustrating more specific examples of approaches for harmonic analysis and speech cleanup.

FIG. 10 is a block diagram illustrating more specific examples of approaches for harmonic analysis and speech cleanup. One or more of the modules described in connection with FIG. 10 may be implemented in the speech cleanup module 322 described in connection with FIG. 3 in some configurations. For example, FIG. 10 may provide more specific examples of approaches for first subband speech analysis and first subband residual noise cleanup. In some configurations, the operations described in connection with FIG. 10 may be considered first phase operations.

An electronic device 302 may perform peak analysis 1068. For example speech spectrum 1098 (e.g., a noise-suppressed speech signal 308) may be provided to a peak picking module 1062. The peak picking module 1062 may pick (e.g., determine, select) prominent peaks in the speech spectrum 1098. A peak refining module 1064 may refine the peaks based on peak properties (e.g., magnitude, frequency, phase, center of mass and group delay). In some configurations, the refining may be performed to refine peaks beyond fast Fourier transform (FFT) resolution. The peak refining module 1064 may produce a peak set 1066, which may be provided to a harmonicity module 1070, a short-term level module 1082 and a speech cleanup module 1092.

The electronic device 302 may perform harmonic analysis 1084. The harmonicity module 1070 may compute the degree (e.g., harmonicity $h_p$) of spectral peaks conforming to each pitch hypotheses and/or may select pitch hypotheses with high harmonicity as pitch candidates. The harmonicity may be provided to a completeness module 1072 and a pitch (e.g., fundamental frequency $f_0$) resolving module 1076.

For each pitch (e.g., $f_0$) candidate, the completeness module 1072 may compute a completeness measure (e.g., $c_p$). The completeness measure may indicate a degree of presence of speech partials in the spectrum. The completeness measure may be provided to the pitch resolving module 1076.

The pitch resolving module 1076 may resolving pitch candidates based on one or more features (e.g., harmonicity, completeness measure and/or a last frame pitch 1074 (e.g., $f_0$)). In particular, the pitch resolving module 1076 may select a pitch 1080 that meets one or more conditions based on harmonicity, the completeness measure and/or a last frame pitch 1074. The selected pitch 1080 may be provided to the short term level module 1082. The pitch resolving module 1076 may also label or tag an anchor frame. An anchor frame may be a frame that exhibits high harmonicity (e.g., harmonicity that is greater than a harmonicity threshold) and completeness (e.g., completeness that is greater than a completeness threshold). The anchor frame tag 1078 may be provided to a long-term level module 1086. The short-term level module 1082 may determine a short-term time-domain peak level from the harmonic speech peaks 1066. The short-term time-domain peak level may be provided to the long-term level module 1086.

The electronic device 302 may perform speech segmentation 1090. In particular, the long-term level module 1086 may determine a long-term level as a smoothed short term level over anchor frames. The long-term level may be provided to a speech states module 1088. The speech states module 1088 may determine any speech state transitions (between voiced, voiced onset, voiced offset and/or unvoiced/non-speech, for example). For example, the speech states module 1088 may operate as a finite state machine that is driven by the long-term level and the anchor frame tag 1078. The speech states module 1088 may indicate the speech state to the speech cleanup module 1092.

The electronic device 302 may perform speech cleanup 1094. In particular, the speech cleanup module 1092 may remove any non-speech peaks, clean up one or more speech valleys and/or whiten one or more non-speech frames. The speech cleanup module 1092 may produce a cleaned speech peak set 1096. It should be noted that the speech cleanup module 1092 may be implemented as an element or component of the speech cleanup module 322 described in connection with FIG. 3.

Figure 11:
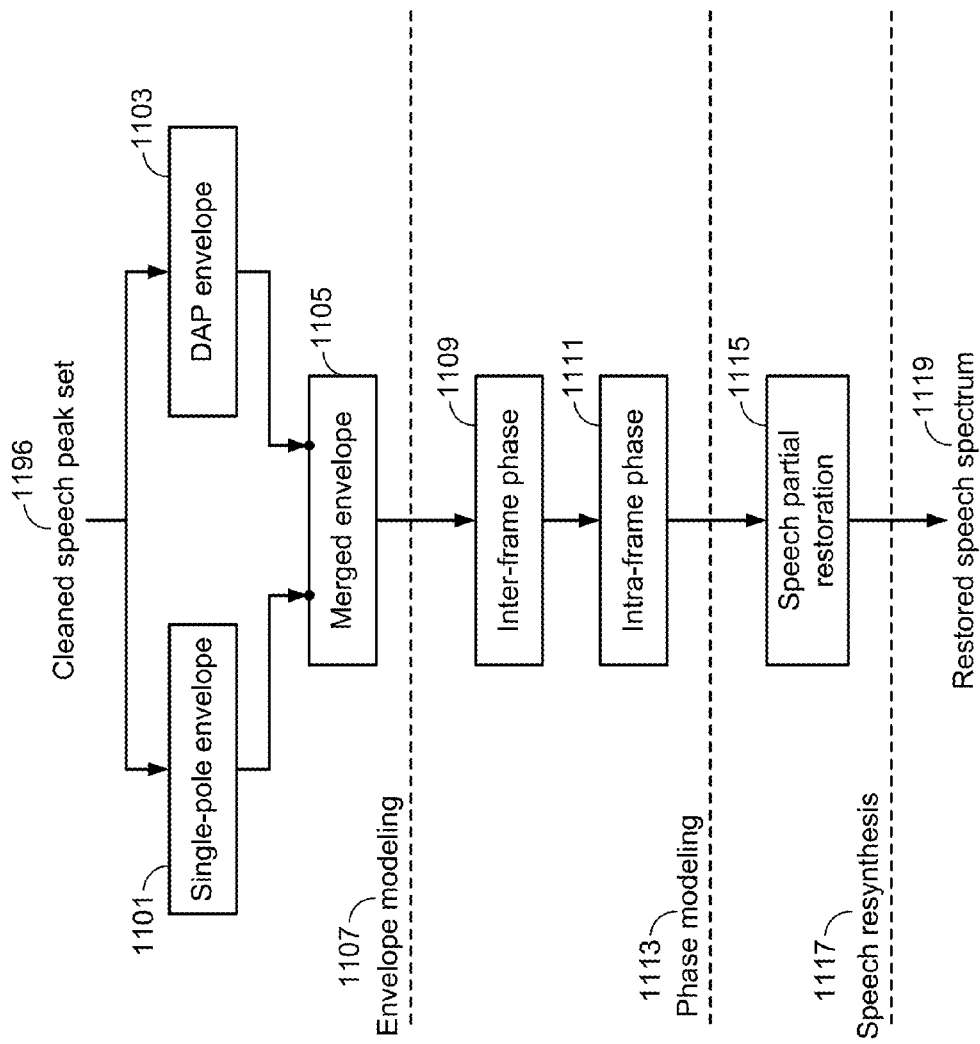
FIG. 11 is a block diagram illustrating a more specific example of an approach for first subband restoration.

FIG. 11 is a block diagram illustrating a more specific example of an approach for first subband restoration. For example, one or more of the modules described in connection with FIG. 11 may be implemented in the first subband restoration module 328 described in connection with FIG. 3. In some configurations, first subband restoration may be low-band (e.g., 0-2 kHz) speech enrichment and/or may be considered a part of second phase speech envelope restoration processing.

The electronic device 302 may perform envelope modeling 1107 (e.g., modeling a speech spectrum envelope). A cleaned speech peak set 1196 (provided from a first subband residual noise cleanup module 326 as described in connection with FIG. 3 and/or from a speech cleanup module 1092 as described in connection with FIG. 10, for example) may be provided to a single-pole envelope module 1101 and a discrete all-pole (DAP) envelope module 1103. The single-pole envelope module 1101 may perform single-pole modeling using an existing speech partial to generate a fallback envelope. The DAP envelope module 1103 may perform DAP modeling based on speech formants detected from existing partial(s). The DAP modeling may be guarded by single-pole modeling for stability. The merged envelope 1105 module may merge the single-pole envelope and the DAP envelope to produce a merged envelope.

The electronic device 302 may perform phase modeling 1113 or modeling speech partial phases. For example, the merged envelope may be provided to an inter-frame phase module 1109. The inter-frame phase module 1109 may perform inter-frame phase modeling to constrain frame-to-frame speech wave continuity. Furthermore, an intra-frame phase module 1111 may perform intra-frame phase modeling to enforce coherence across speech partials.

The electronic device 302 may also perform speech spectrum resynthesis 1117. In particular, a speech partial restoration module 1115 may use a standard speech peak or existing speech peaks as a template to restore the missing partials with reconstructed magnitudes and phases. Accordingly, the speech partial restoration module 1115 may produce restored speech spectrum 1119 (e.g., a restored first subband).

It should be noted that additional examples of one or more of the modules, functions, procedures, structures and/or elements of FIGS. 10-11 may be provided in connection with one or more of FIGS. 20-44 in some configurations. For example, one or more of the modules, functions, procedures, structures and/or elements described in connection with one or more of FIGS. 20-44 may be implemented in addition to or alternatively from one or more of the modules, functions, procedures, structures and/or elements described in connection with one or more of FIGS. 10-11 in accordance with the systems and methods disclosed herein in some configurations.

Figure 12A:
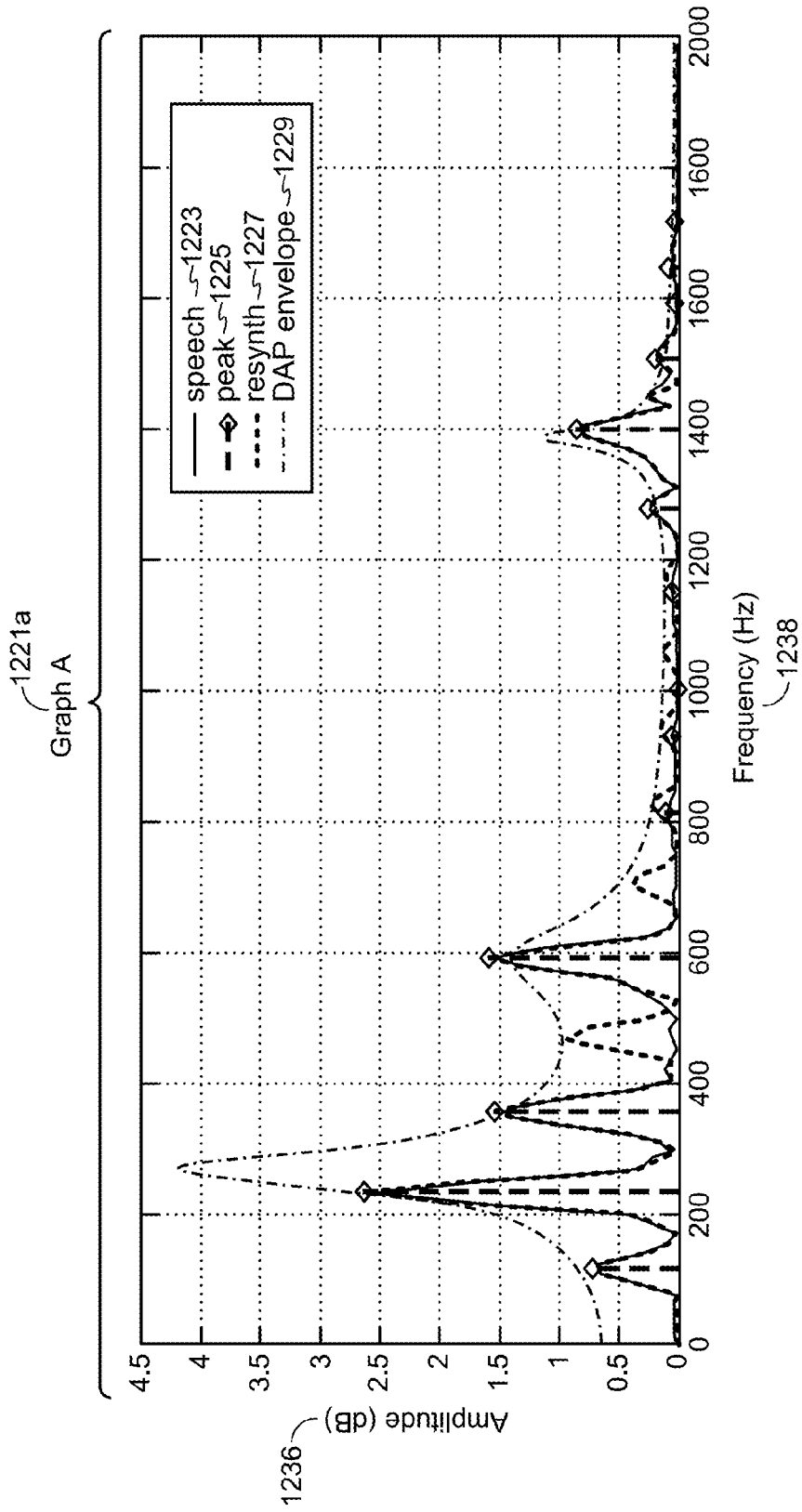
FIG. 12A includes graph A, which illustrates an example of first subband restoration.

FIG. 12A includes graph A 1221a, which illustrates an example of first subband restoration. The graph is illustrated in amplitude (decibels (dB)) 1236 over frequency (Hz) 1238. Specifically, graph A 1221a illustrates a cleaned noise-suppressed speech signal 1223 in the frequency domain (e.g., an FFT of the cleaned noise-suppressed speech signal), a cleaned speech peak set 1225, a DAP envelope 1229 and a restored first subband (e.g., resynthesized signal 1227). As illustrated in graph A 1221a, some peaks from an original speech signal (e.g., one at approximately 460 Hz, and several between 600 Hz and 1200 Hz) may have been lost or destroyed as a result of noise masking and/or noise suppression. As described in connection with FIG. 11, an electronic device 302 may generate a DAP envelope 1229 based on the cleaned speech peak set 1225. The DAP envelope may be used to restore (e.g., resynthesize) the missing peaks (e.g., missing harmonic partials). The restored first subband signal (e.g., resynthesized signal 1227) may be utilized to restore one or more additional subbands.

Figure 12B:
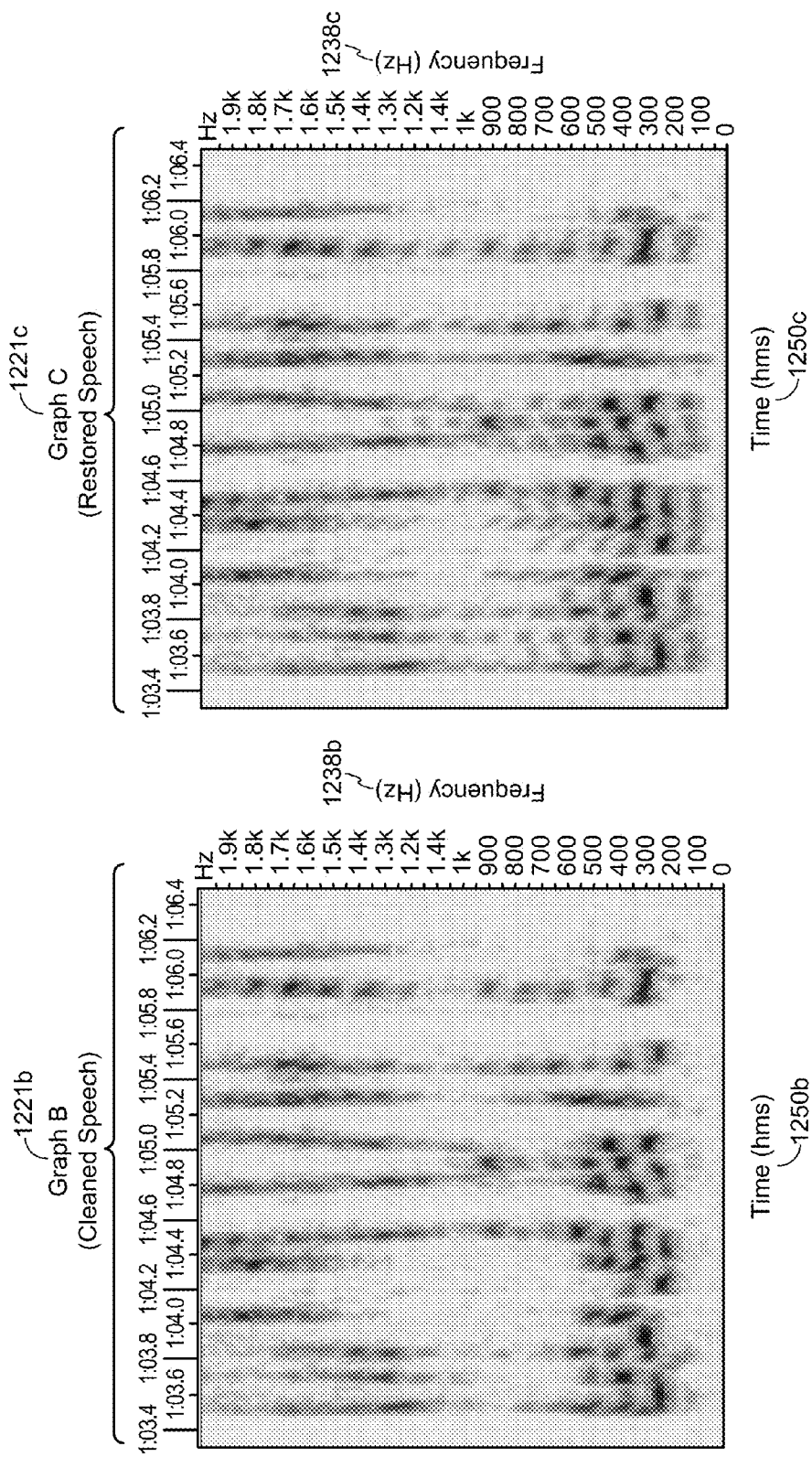
FIG. 12B illustrates examples of spectrograms of cleaned speech and restored speech for a first subband.

FIG. 12B illustrates examples of spectrograms of cleaned speech and restored speech for a first subband. In particular, FIG. 12B includes graph B 1221b and graph C 1221c. Graph B 1221b illustrates an example of cleaned (first subband) speech in frequency (Hz) 1238b over time (hms) 1250b. For instance, the clean speech illustrated in graph B 1221b may be an example of a speech signal after first subband residual noise cleanup as described in connection with one or more of FIGS. 3 and 10. While much of the noise has been removed at this point, it can be observed that some harmonic partials have been lost or destroyed. Graph C 1221c illustrates an example of restored (first subband) speech in frequency (Hz) 1238c over time (hms) 1250c. For instance, the restored speech illustrated in graph C 1221c may be an example of a speech signal after first subband restoration as described in connection with one or more of FIGS. 3 and 11. As illustrated in graph C 1221c, many of the missing harmonic partials or peaks have been restored.

Figure 13:
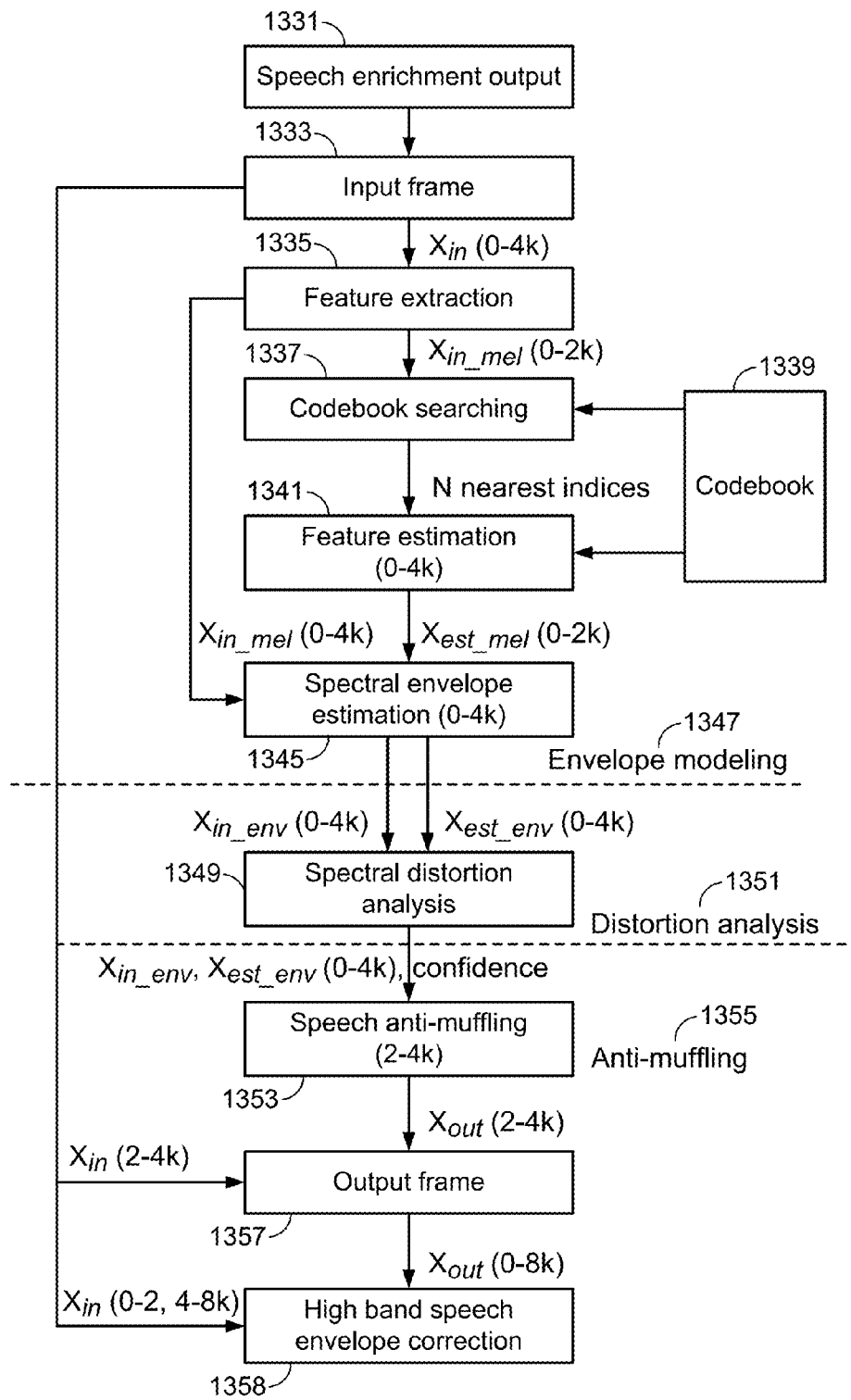
FIG. 13 is a block diagram illustrating a more specific example of an approach for second subband restoration.

FIG. 13 is a block diagram illustrating a more specific example of an approach for second subband restoration. For example, one or more of the modules described in connection with FIG. 13 may be implemented in the second subband restoration module 330 described in connection with FIG. 3. In some configurations, second subband restoration may be low-band (e.g., 2-4 kHz) speech anti-muffling and/or may be considered a part of second phase speech envelope restoration processing.

The electronic device 302 may perform speech envelope modeling 1347 (e.g., for a second subband such as 0-4 kHz). The restored first subband (e.g., speech enrichment output 1331) may be provided to an input frame module 1333. The input frame module may combine the restored first subband with one or more subbands (e.g., second subband and/or third subband) to produce an input (e.g., "input" into the second subband restoration module 330) signal (e.g., $X_{in}$). For example, the restored first subband (e.g., 0-2 kHz) may be combined with the second subband (e.g., 2-4 kHz) to produce the combined subband signal (e.g., $X_{in\_first\_second}$), which spans both the first subband and second subband. For instance, an input frame (that is input into the second subband restoration module 330) may be an input signal whose first subband (e.g., 0-2 kHz) is noise suppressed and restored and whose second subband (e.g., 2-4 kHz) is noise suppressed but not restored. In some configurations, combining the restored first subband and second subband may include concatenating the restored first subband with the second subband.

The restored first subband and the second subband (e.g., $X_{in\_first\_second}$) may be provided to the feature extraction module 1335. The feature extraction module 1335 may estimate a Mel spectrum (e.g., $X_{in\_mel\_first}$) for the restored first subband (e.g., 0-2 kHz, 14 Mel bands) and for the combined signal (e.g., $X_{in\_mel\_first\_second}$, 0-4 kHz, 20 Mel bands). For example, $X_{in\_mel\_first\_second}$ may be based on a restored first subband concatenated with a second subband.

In some configurations, the electronic device 302 may perform codebook 1339 training. For example, the electronic device 302 may jointly train a first subband (e.g., 0-2 kHz) codebook and a combination subband (e.g., 0-4 kHz) codebook using Mel spectrum. In some configurations, the first subband codebook may be a subset of the combination subband codebook 1339. For example, entries of the combination subband codebook 1339 may span a bandwidth (e.g., a frequency range) of the first subband and the second subband. Codebook training may utilize a database (e.g., 3 male and 3 female native speakers for five languages). Additionally or alternatively, codebook training may be performed offline by vector quantization (e.g., Linde-Buzo-Gray (LBG) algorithm)).

The first subband Mel spectrum (e.g., $X_{in\_mel\_first}$) may be provided to a codebook searching module 1337. The codebook searching module 1337 may search the combined subband codebook 1339. For example, the codebook searching module 1337 may search the combined subband codebook 1339 based only on the restored first subband. In other words, the codebook 1339 may be searched by attempting to find one or more (e.g., N) nearest codebook entries (with their corresponding indices) that are the closest to the restored first subband. For instance, the codebook searching module 1337 may find the top N nearest codebook candidate indices.

Searching the combined subband codebook 1339 may be based on a distance measure using a log spectral deviation based on Euclidean distance in some configurations. For example, the first subband distance measure (e.g., $d_{first}$, a distance and/or distortion measure with respect to the first subband range in the codebook 1339 (e.g., $d_{0-2k}$ for a first subband of 0-2 kHz)) may be determined using root-mean-square (RMS) log spectral deviation based on the Euclidean distance. This may be accomplished in accordance with the following equation:

$$d_{first} = \sqrt{\frac{1}{\#first\_subband\_mel\_bands} \sum_{first\_subband\_mel\_bands} \left| 20 \log_{10} \frac{X_{in\_mel\_first}}{X_{codebook}} \right|^2 }.$$

It should be noted that #first_subband_mel_bands is a number of Mel bands corresponding to the first subband, first_subband_mel_bands are the Mel bands corresponding to the first subband, $X_{in\_mel\_first}$ is an observed Mel spectrum of $X_{in}$ (over the restored first subband (e.g., 0-2 kHz) and $X_{codebook}$ is a codebook 1339 entry. The resulting N nearest indices may be provided to a feature estimation module 1341.

The feature estimation module 1341 may perform spectral feature estimation. For example, the feature estimation module 1341 may estimate a combination subband (e.g., 0-4 kHz) Mel spectrum by calculating a weighted sum of nearest N codebook entries. The weighting may be proportional to the inverse distance of the input features to the first subband (e.g., 0-2 kHz) codebook entries. In some configurations, the feature estimation module 1341 may find N corresponding combination subband (e.g., 0-4 kHz) codebook 1339 indices according to candidates from the first subband (e.g., 0-2 kHz) codebook (e.g., $X_{in\_mel}$). This may be one approach for predicting the second subband based on the first restored subband.

The estimated Mel bands (e.g., predicted Mel spectrum, $X_{est\_mel\_first\_second}$) from the combined subband (e.g., 0-4 kHz) codebook 1339 may be provided to a spectral envelope estimation module 1345. The spectral envelope estimation module 1345 may estimate or predict a combined subband (e.g., 0-4 kHz) spectral envelope (e.g., $X_{est\_env}$) by interpolating the estimated Mel spectrum vector. An observed speech envelope (e.g., $X_{in\_env}$ over a combined subband (e.g., 0-4 kHz)) and the estimated or predicted speech envelope (e.g., $X_{est\_env}$) may be provided to a spectral distortion analysis module 1349. It should be noted that the observed speech envelope (e.g., $X_{in\_env}$) may be based on the input frame 1333 (e.g., $X_{in}$), which may include a restored first subband concatenated with a second subband.

The electronic device 302 may perform distortion analysis 1351. For example, the spectral distortion analysis module 1349 may determine a spectral distortion and/or a modeling confidence measure. The spectral envelope distortion for the first subband and/or the second subband (e.g., 0-4 kHz) may be as follows. A first subband (e.g., 0-2 kHz) spectral distortion (e.g., $d_{first}$) measures the modeling error. A second subband (e.g., 2-4 kHz) spectral distortion (e.g., $d_{second}$) measures the muffled-ness of the current frame. For example, the spectral distortion measure for the second subband (e.g., $d_{2-4k}$ for a second subband of 2-4 kHz) implies how distorted and/or muffled the current frame is. In some configurations, the second subband spectral distortion may be determined in accordance with the following equation.

$$d_{second} = \frac{1}{\#\text{second\_subband\_FFT\_bins}} \sum_{\text{second\_subband\_FFT\_bins}} 20 \log_{10} \frac{X_{est\_env}}{X_{in\_env}}.$$

It should be noted that #second_subband_FFT bins is a number of FFT bins corresponding to the second subband and second_subband_FFT bins are the FFT bins corresponding to the second subband.

In some configurations, the spectral distortion analysis module 1349 may determine (e.g., calculate) a modeling confidence. For example, the modeling confidence may be expressed as conf=$y(d_{first}, d_{second}$ (e.g., conf=$y(d_{0-2k}, d_{2-4k})$ for a first subband from 0-2 kHz and a second subband from 2-4 kHz). The modeling confidence may assist in decision making in the anti-muffling stage. The modeling confidence may imply how accurately the modeling is matched to the clean speech model. In some configurations, the modeling confidence may be determined in accordance with the following equation. conf=(threshold$_{dist}$−$d_{second}$)/threshold$_{dist}$, where threshold$_{dist}$ is a threshold (e.g., tuning parameter) that is a positive value that converts a distortion measure to a confidence measure.

The electronic device 302 may perform anti-muffling 1355. For example, $X_{in\_env}$, $X_{est\_env}$ and the modeling confidence may be provided to a speech anti-muffling module 1353. The speech anti-muffling module 1353 may perform anti-muffling for the second subband (e.g., 2-4 kHz). For example, the speech anti-muffling module 1353 may calculate an envelope gain for the second subband (e.g., 2-4 kHz). In some configurations, the second subband envelope gain may be calculated in accordance with the following equation.

$$\text{gain}_{second}(k) = 20 \log_{10} \frac{X_{est\_env}(k)}{X_{in\_env}(k)},$$

where k is a bin index.

If the modeling confidence is greater than a threshold (e.g., conf>threshold), then the speech anti-muffling module 1353 may apply the envelope gain to the muffled magnitude spectrum. For example, the second subband (e.g., 2-4 kHz) of a second subband restoration output frame (e.g., $X_{out\_second}$) may be calculated in accordance with the following equation.

$$|X_{out\_second}| = |X_{in\_second}| \cdot * 10^{\frac{\text{gain}_{second}}{20}},$$

where ·* is an element-wise multiplication. For instance, the envelope gain may be applied to the second subband of the input frame 1333 in accordance with the following equation.

$$X_{out\_second} = \begin{cases} X_{in\_second} & \text{conf} < \text{threshold} \\ X_{in\_second} \cdot * 10^{\frac{\text{gain}_{second}}{20}} & \text{conf} > \text{threshold} \end{cases}.$$

The speech anti-muffling module may provide the restored second subband (e.g., $X_{out\_second}$) to the output frame module 1357.

The output frame module 1357 may generate an output frame over a bandwidth. For example, the output frame module 1357 may combine a restored first subband (e.g., 0-2 kHz), a restored second subband (e.g., 2-4 kHz) and a third subband (e.g., 4-8 kHz) to produce the output frame (e.g., $X_{out}$) over the bandwidth (e.g., 0-8 kHz). The output (e.g., "output" from the second subband restoration module 330) frame may be provided to a high-band speech envelope adjustment module 1358 (e.g., third subband restoration module 332).

Figure 14:
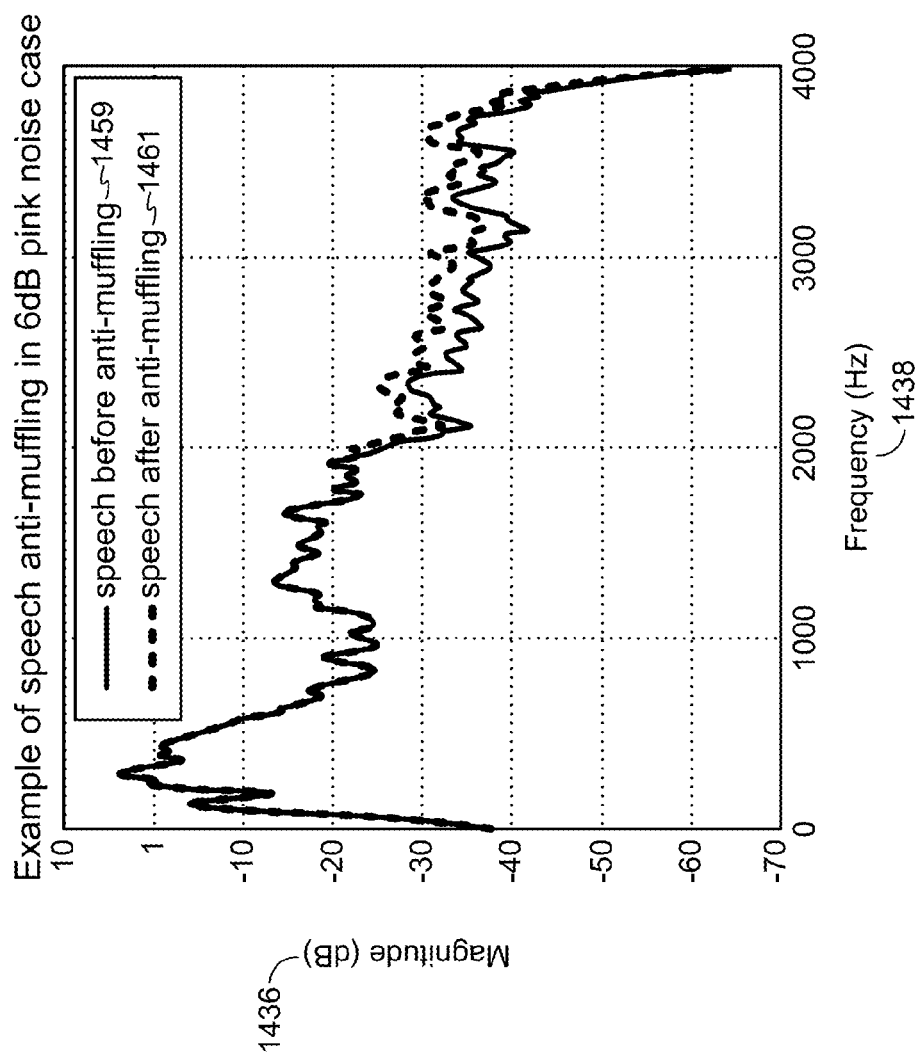
FIG. 14 is a graph illustrating one example of speech before and after speech anti-muffling in accordance with the systems and methods disclosed herein.

FIG. 14 is a graph illustrating one example of speech before and after speech anti-muffling in accordance with the systems and methods disclosed herein. The graph is illustrated in signal magnitude 1436 (in decibels (dB)) over frequency 1438 (in Hertz (Hz)). In particular, the graph illustrates a plot of speech before anti-muffling 1459 and a plot of speech after anti-muffling 1461 in a 6 dB pink noise case. As illustrated in FIG. 14, speech anti-muffling may improve speech signal structure.

Figure 15:
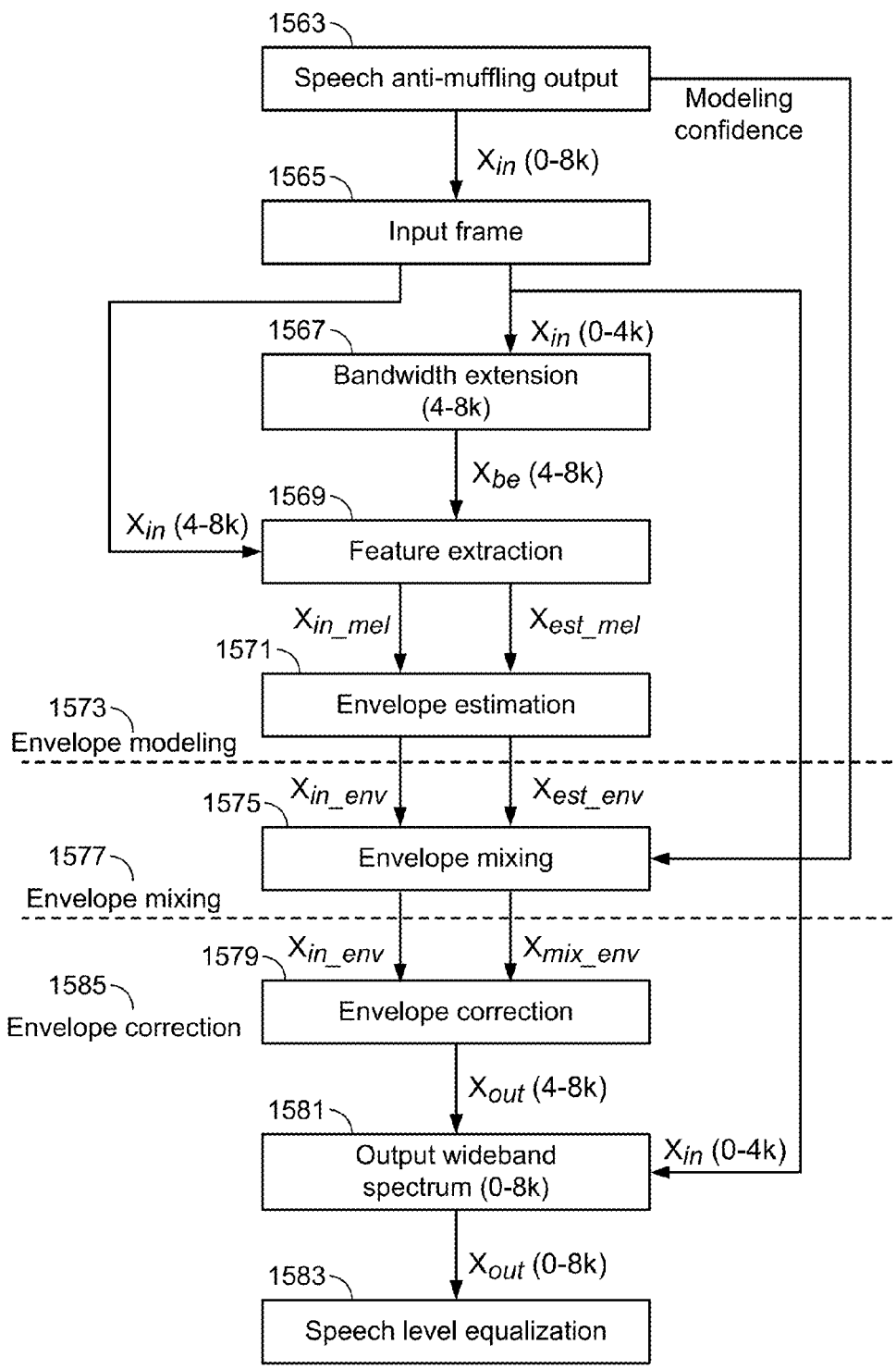
FIG. 15 is a block diagram illustrating a more specific example of an approach for third subband restoration.

FIG. 15 is a block diagram illustrating a more specific example of an approach for third subband restoration. For example, one or more of the modules described in connection with FIG. 15 may be implemented in the third subband restoration module 332 described in connection with FIG. 3. In some configurations, third subband restoration may be high-band (e.g., 2-4 kHz) speech envelope adjustment (e.g., correction) and/or may be considered a part of second phase speech envelope restoration processing.

The electronic device 302 may perform speech envelope modeling 1573 for a third subband (e.g., 4-8 kHz). The second subband restoration output (e.g., speech anti-muffling output 1563) may be provided to an input (e.g., "input" to the third subband restoration module 332) frame module 1565. It should also be noted that a modeling confidence (e.g., a modeling confidence as described in connection with FIG. 13) from second subband restoration processing may be provided to an envelope mixing module 1575. The input frame module 1565 may provide portions of the input frame (e.g., $X_{in\_first\_second\_third}$) to one or more modules. For example, the input frame module 1565 may provided the first subband and second subband (e.g., $X_{in\_first\_second}$) to a bandwidth extension module 1567 and to an output wideband spectrum module 1581. The input frame module 1565 may also provide the third subband (e.g., $X_{in\_third}$) to a feature extraction module 1569.

The bandwidth extension module 1567 may perform bandwidth extension on the first subband and second subband. For example, the bandwidth extension module 1567 may apply the input low band spectrum (e.g., $X_{in\_first\_second}$, 0-4 kHz) to predict high band spectrum (e.g., $X_{in\_third}$, 4-8 kHz). In some configurations, the bandwidth extension module 1567 may perform bandwidth extension as described in connection with FIG. 46. The bandwidth extension module 1567 may produce an extension signal (e.g., $X_{be}$, 4-8 kHz) corresponding to the third subband. The extension signal may be provided to the feature extraction module 1569.

The feature extraction module 1569 may perform feature extraction based on the third subband (e.g., $X_{in\_third}$) and the extension signal (e.g., $X_{be}$). For example, the feature extraction module 1569 may estimate a third subband (e.g., high-band) Mel spectrum for input third subband and the extension signal (e.g., bandwidth extended signal). The feature extraction module 1569 may produce a third subband Mel spectrum (e.g., $X_{in\_mel}$) and an estimated or predicted third subband Mel spectrum (e.g., $X_{est\_mel}$). The third subband Mel spectrum (e.g., $X_{in\_mel}$) and the estimated or predicted third subband Mel spectrum (e.g., $X_{est\_mel}$) may be provided to an envelope estimation module 1571.

The envelope estimation module 1571 may estimate spectral envelopes corresponding to the third subband input (e.g., $X_{in\_env\_third}$) and/or the extension signal (e.g., $X_{be\_env}$) by interpolating Mel spectrum vectors. The spectral envelopes may be provided to the envelope mixing module 1575.

The electronic device 302 may perform speech envelope mixing 1577. For example, the envelope mixing module 1575 may mix the spectral envelopes corresponding to the third subband input (e.g., $X_{in\_env\_third}$) and/or the extension signal (e.g., $X_{be\_env}$, estimated high-band speech envelope). The mixing may be performed according to the modeling confidence from a previous stage (e.g., the second subband restoration module 330). For example, the electronic device 302 may determine a scaling factor based on the modeling confidence. In some configurations, the scaling factor may be determined in accordance with the following equation. scaling=$\alpha$*conf, where 0<$\alpha$<1. $\alpha$ may be a tuning parameter. In some configurations, the mixing may be performed in accordance with the following equation. $X_{mix\_env}$=scaling*$X_{be\_env}$+(1−scaling)*$X_{in\_env\_third}$, where $X_{mix\_env}$ is the mixed envelope and scaling is a scaling factor that is proportional to the modeling confidence. A mixed envelope (e.g., $X_{mix\_env}$) and the third subband input envelope (e.g., $X_{in\_env\_third}$) may be provided to an envelope adjustment module 1579.

The electronic device 302 may perform speech envelope correction 1585 for the third subband (e.g., 4-8 kHz). For example, the envelope adjustment module 1579 may adjust (e.g., correct) the third subband based on a third subband envelope gain. In some configurations, the third subband envelope gain may be calculated in accordance with the following equation.

$$\text{gain}_{third}(k) = 20 \log_{10} \frac{X_{mix\_env}(k)}{X_{in\_env\_third}(k)},$$

where k is a bin index. The envelope adjustment module 1579 may apply the gain to the third subband of the input spectrum. For example, the envelope adjustment module 1579 may apply the gain in accordance with the following equation.

$$|X_{out\_third}| = |X_{in\_third}| \cdot *10^{\frac{gain_{third}}{20}}.$$

The envelope adjustment module 1579 may provide a restored third subband (e.g., $X_{out\_third}$, adjusted third subband signal) to the output wideband spectrum module 1581.

The output wideband spectrum module 1581 may combine the restored first subband, the second subband and the restored third subband to produce an output (e.g., "output" from the third subband restoration module 332) signal (e.g., $X_{out}$). The output signal may be provided to a speech-level equalization module 1583 (e.g., equalization module 334).

It should be noted that in some configurations, the bandwidth extension module 1567 may generate and/or utilize an excitation signal. For example, for the restoration of the third subband (e.g., 4-8 kHz), the bandwidth extension approach described in connection with FIG. 46 may perform an excitation signal extension process to resynthesize upper-band (e.g., 4-8 kHz) speech. As illustrated in FIG. 15, however, spectral features are extracted and the spectral envelope is estimated from the resynthesized upper-band (e.g., 4-8 kHz) speech signal. Then, the original damaged (e.g., noise-suppressed) signal is restored in the envelope domain. The information that any artificial excitation signal(s) contribute may get discarded during this procedure. Therefore, the excitation signal itself is not applied in the final speech envelope restoration (e.g., envelope adjustment, envelope correction, etc.) of the third subband. For example, the excitation signal or the resynthesized signal that is based on the excitation signal is not the restored third subband. Rather, the restored third subband may be an adjusted (e.g., scaled, corrected, gain-applied, etc.) version of the original damaged speech signal (e.g., the noise-suppressed signal in the third subband). It should also be noted that while bandwidth extension approaches may be utilized in some configurations of the systems and methods disclosed herein, the estimated artificial excitation signal(s) may be unnecessary to the final third subband speech envelope restoration (e.g., envelope correction 1585).

Figure 16:
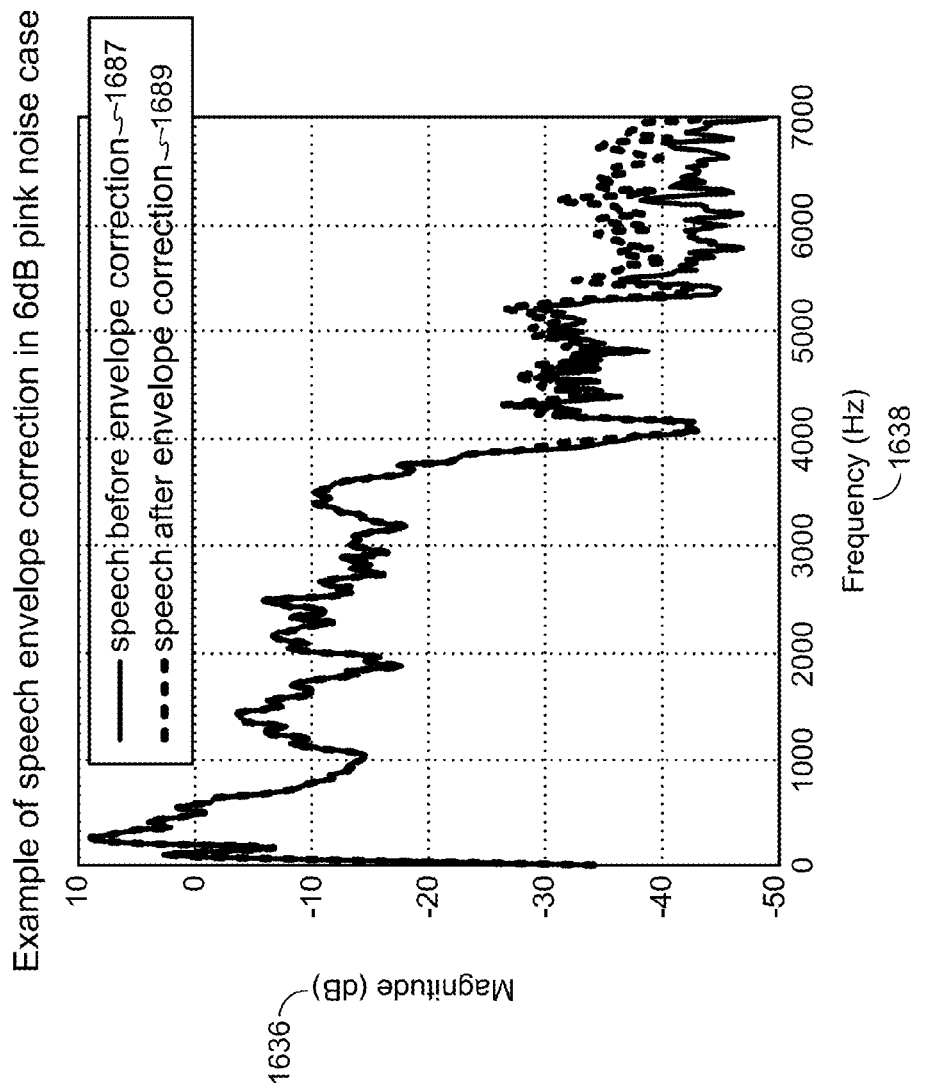
FIG. 16 is a graph illustrating one example of speech before and after speech envelope adjustment in accordance with the systems and methods disclosed herein.

FIG. 16 is a graph illustrating one example of speech before and after speech envelope adjustment in accordance with the systems and methods disclosed herein. The graph is illustrated in signal magnitude 1636 (in decibels (dB)) over frequency 1638 (in Hertz (Hz)). In particular, the graph illustrates a plot of speech before envelope adjustment 1687 and a plot of speech after envelope correction 1689 in a 6 dB pink noise case. As illustrated in FIG. 16, speech envelope adjustment may improve speech signal structure.

Figure 17:
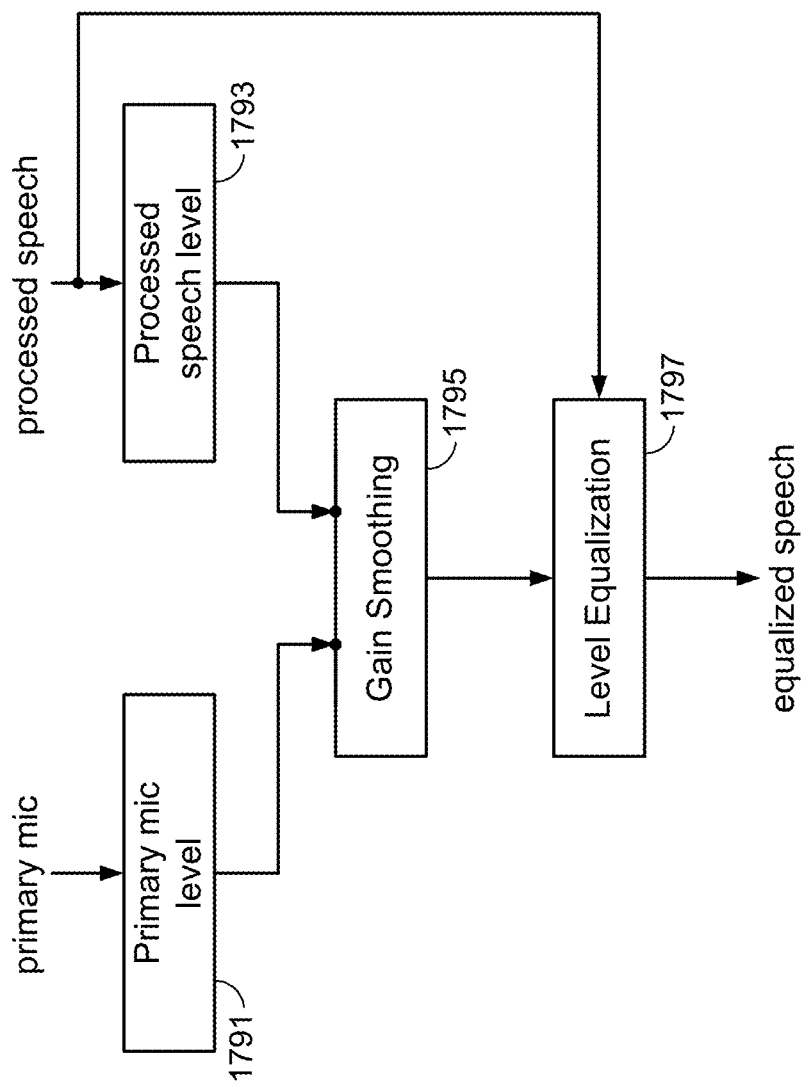
FIG. 17 is a block diagram illustrating a more specific example of an approach for speech level equalization.

FIG. 17 is a block diagram illustrating a more specific example of an approach for speech level equalization. For example, one or more of the modules described in connection with FIG. 17 may be implemented in the equalization module 334 described in connection with FIG. 3. In some configurations, speech level equalization may be performed over the bandwidth (e.g., 0-8 kHz) and/or may be considered a part of second phase speech envelope restoration processing.

A primary microphone level module 1791 may detect primary microphone level for voiced frames. For example, the level of a single input microphone may be detected. A processed speech level module 1793 may detect a processed speech level for the voiced frames. The processed speech level may be the signal (e.g., 0-8 kHz) output from the third subband restoration module 332. The primary microphone level and the processed speech level may be provided to a gain smoothing module 1795.

The gain smoothing module 1795 may perform gain smoothing over frames with gain limiting. For example, the gain smoothing module 1795 may apply gain to the processed speech spectrum.

The smoothed speech spectrum may be provided to a level equalization module 1797. The level equalization module 1797 may equalize the smoothed speech spectrum to produce equalized speech.

Figure 18:
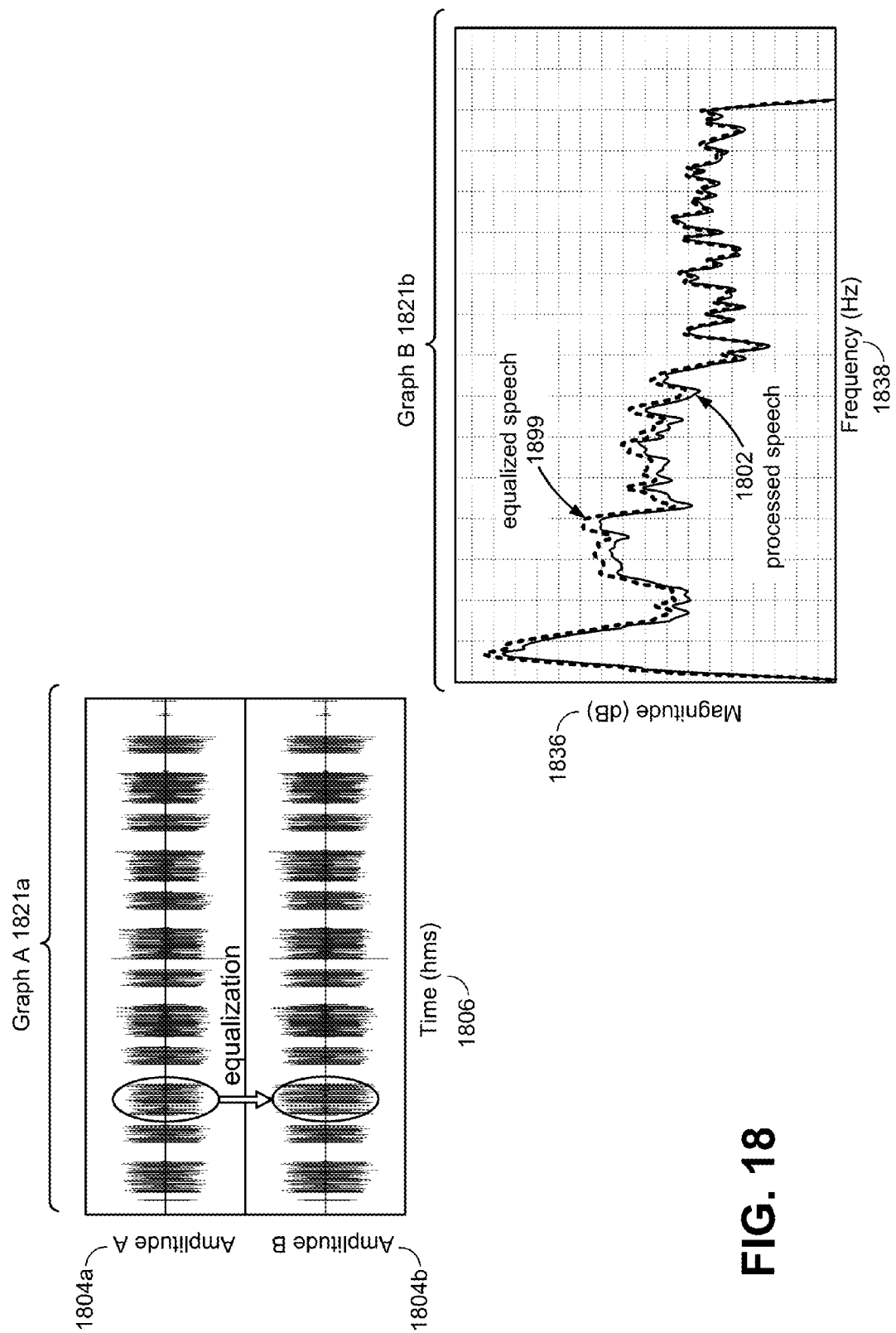
FIG. 18 includes graphs illustrating examples of speech before and after speech equalization in accordance with the systems and methods disclosed herein.

FIG. 18 includes graphs 1821*a-b* illustrating examples of speech before and after speech equalization in accordance with the systems and methods disclosed herein. Graph B 1821*b* is illustrated in signal magnitude 1836 (in decibels (dB)) over frequency 1838 (in Hertz (Hz)). In particular, graph B 1821 illustrates a plot of processed speech before equalization 1802 and a plot of speech after equalization 1899. Graph A 1821*a* is illustrated in amplitudes 1804*a-b* over time (hms) 1806. The upper plot in graph A 1821*a* is an example of a speech waveform before speech equalization. The lower plot in graph A 1821*a* is an example of a speech waveform after speech equalization. It should be noted that the units for amplitude A 1804*a* and amplitude B 1804*b* are a normalized linear value (e.g., maximum=1, minimum=−1). As illustrated in FIG. 18, speech equalization may improve speech signal structure.

Figure 19:
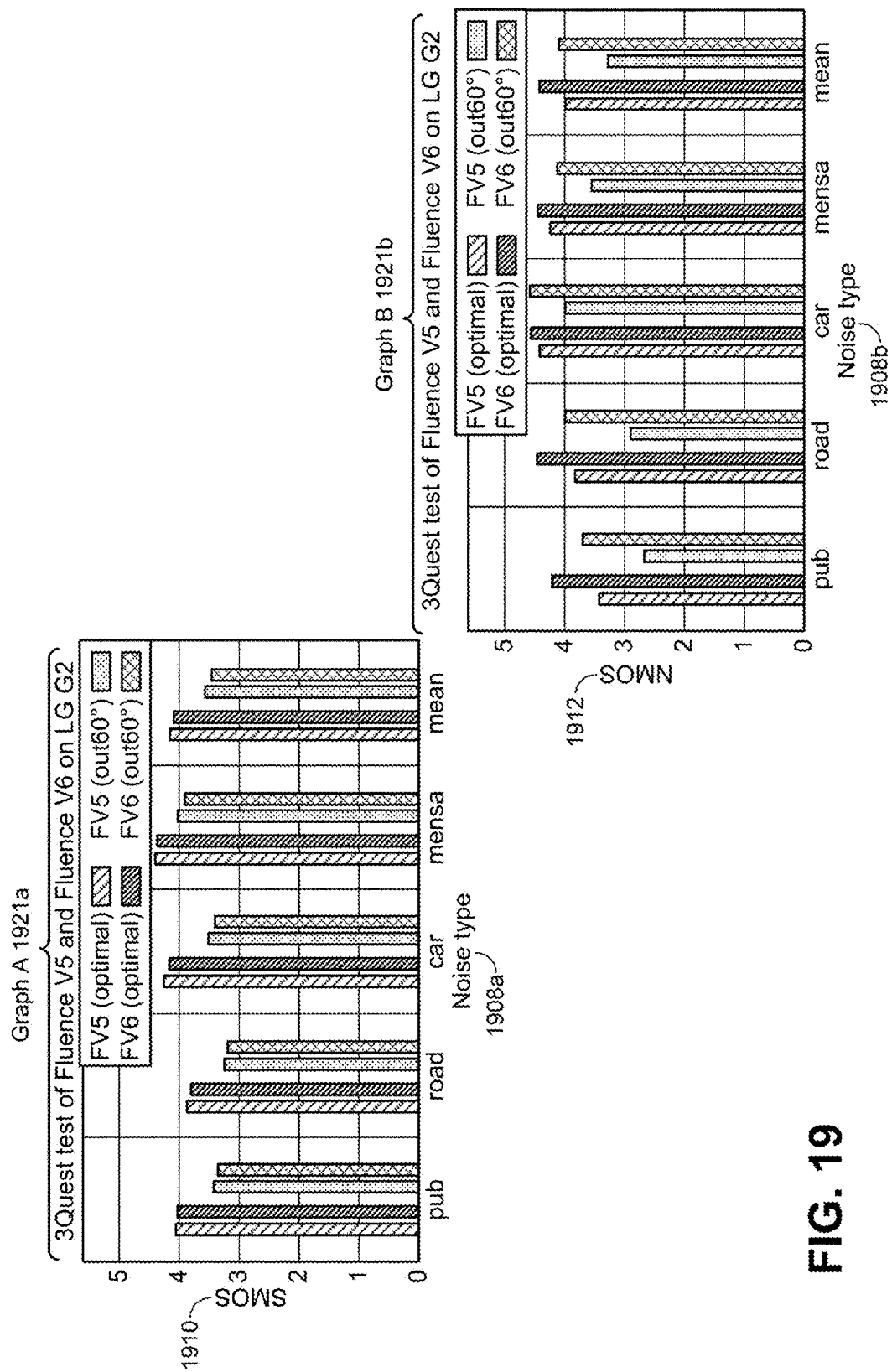
FIG. 19 includes graphs illustrating examples of performance of the systems and methods disclosed herein.

FIG. 19 includes graphs 1921*a-b* illustrating examples of performance of the systems and methods disclosed herein. Graph A 1921*a* is illustrated in S-Mean Opinion Score (SMOS) 1910 for various noise types 1908*a*. SMOS is one example of an objective evaluation of 3QUEST (3-fold Quality Evaluation of Speech in Telecommunications). Specifically, graph A 1921*a* illustrates SMOS for optimal noise suppression, noise suppression at an outward 60 degree (e.g., "out60°") holding position, optimal restoration in accordance with the systems and methods disclosed herein and restoration in accordance with the systems and methods disclosed herein at an outward 60 degree (e.g., "out60°") holding position. As illustrated in graph A 1921*a*, SMOS 1910 is nearly the same with restoration.

Graph B 1921*b* is illustrated in N-Mean Opinion Score (NMOS) 1912 for various noise types 1908*b*. NMOS is another example of an objective evaluation of 3QUEST.

Specifically, graph B 1921*b* illustrates NMOS 1912 for optimal noise suppression, sub-optimal noise suppression, optimal restoration in accordance with the systems and methods disclosed herein and sub-optimal restoration in accordance with the systems and methods disclosed herein. As illustrated in graph B 1921*b*, NMOS 1912 shows substantial improvement with restoration.

Further evaluation of the speech envelope restoration described herein is given as follows. Tables (1)-(4) illustrates the gains of the speech envelope restoration described herein over noise suppression alone. Table (1) illustrates a first test case where a smartphone is positioned in front of a speaker.

TABLE (1)

| | Wideband Voiced Speech | | | | | |
|---|---|---|---|---|---|---|
| | Pub | Pink | Music | Pub | Pink | Music |
| | | | Envelope Average Gain (dB) | | | |
| | 6 dB | 6 dB | 6 dB | 12 dB | 12 dB | 12 dB |
| Enrichment (0-2 kHz) | 2.45 | 2.14 | 1.88 | 2.07 | 2.17 | 1.67 |
| Anti-muffling (2-4 kHz) | 1.03 | 3.23 | 1.38 | 1.72 | 2.35 | 1.05 |
| High band correction (4-8 kHz) | 3.24 | 4.76 | −3.90 | 4.04 | 5.55 | −2.47 |
| Speech Level EQ (0-8 kHz) | 2.27 | 2.58 | 2.09 | 2.37 | 2.37 | 1.66 |
| Overall gain of restoration over noise suppression | 4.76 | 6.40 | 0.95 | 5.34 | 6.28 | 1.10 |

Table (2) illustrates a first test case where a smartphone is positioned on a flat surface (e.g., on a desk).

TABLE (2)

| | Wideband Voiced Speech | | | | | |
|---|---|---|---|---|---|---|
| | Pub | Pink | Music | Pub | Pink | Music |
| | | | Envelope Average Gain (dB) | | | |
| | 6 dB | 6 dB | 6 dB | 12 dB | 12 dB | 12 dB |
| Enrichment (0-2 kHz) | 0.87 | 1.33 | 0.32 | 0.86 | 1.04 | 0.49 |
| Anti-muffling (2-4 kHz) | 1.69 | 3.39 | 2.34 | 1.71 | 2.89 | 1.59 |
| High band correction (4-8 kHz) | 1.53 | 3.47 | −3.68 | 2.40 | 3.01 | −2.86 |
| Speech Level EQ (0-8 kHz) | 1.82 | 2.44 | 2.00 | 1.49 | 2.02 | 1.01 |
| Overall gain of restoration over noise suppression | 3.23 | 5.36 | 0.82 | 3.33 | 4.51 | 0.10 |

Table (3) illustrates a second test case where a smartphone is positioned in front of a speaker.

TABLE (3)

| | Wideband Voiced Speech | | | | | |
|---|---|---|---|---|---|---|
| | Pub | Pink | Music | Pub | Pink | Music |
| | | | Envelope Average Gain (dB) | | | |
| | 6 dB | 6 dB | 6 dB | 12 dB | 12 dB | 12 dB |
| Enrichment (0-2 kHz) | 4.84 | 4.36 | 2.61 | 4.39 | 5.93 | 2.33 |
| Anti-muffling (2-4 kHz) | 1.97 | 3.77 | 1.80 | 1.13 | 3.05 | 0.90 |

TABLE (3)-continued

| | Wideband Voiced Speech | | | | | |
| | Pub | Pink | Music | Pub | Pink | Music |
| | Envelope Average Gain (dB) | | | | | |
| | 6 dB | 6 dB | 6 dB | 12 dB | 12 dB | 12 dB |
|---|---|---|---|---|---|---|
| High band correction (4-8 kHz) | 1.60 | 5.10 | −4.54 | 0.10 | 4.66 | −3.38 |
| Speech Level EQ (0-8 kHz) | 2.12 | 2.56 | 2.17 | 1.85 | 2.34 | 1.58 |
| Overall gain of restoration over noise suppression | 4.62 | 7.14 | 1.00 | 3.32 | 6.92 | 0.70 |

Table (4) illustrates a second test case where a smartphone is positioned on a flat surface (e.g., on a desk).

TABLE (4)

| | Wideband Voiced Speech | | | | | |
| | Pub | Pink | Music | Pub | Pink | Music |
| | Envelope Average Gain (dB) | | | | | |
| | 6 dB | 6 dB | 6 dB | 12 dB | 12 dB | 12 dB |
|---|---|---|---|---|---|---|
| Enrichment (0-2 kHz) | 1.87 | 2.46 | 1.29 | 2.02 | 1.94 | 1.29 |
| Anti-muffling (2-4 kHz) | 2.29 | 3.65 | 2.48 | 1.27 | 3.35 | 1.66 |
| High band correction (4-8 kHz) | −0.91 | 4.26 | −3.44 | 1.47 | 6.21 | −2.83 |
| Speech Level EQ (0-8 kHz) | 2.09 | 2.58 | 2.23 | 1.25 | 2.18 | 1.79 |
| Overall gain of restoration over noise suppression | 2.68 | 6.24 | 1.45 | 2.81 | 6.61 | 1.11 |

As illustrated in Tables (1)-(4), restoration, as described herein, provides significant gains over noise suppression alone.

Figure 20:
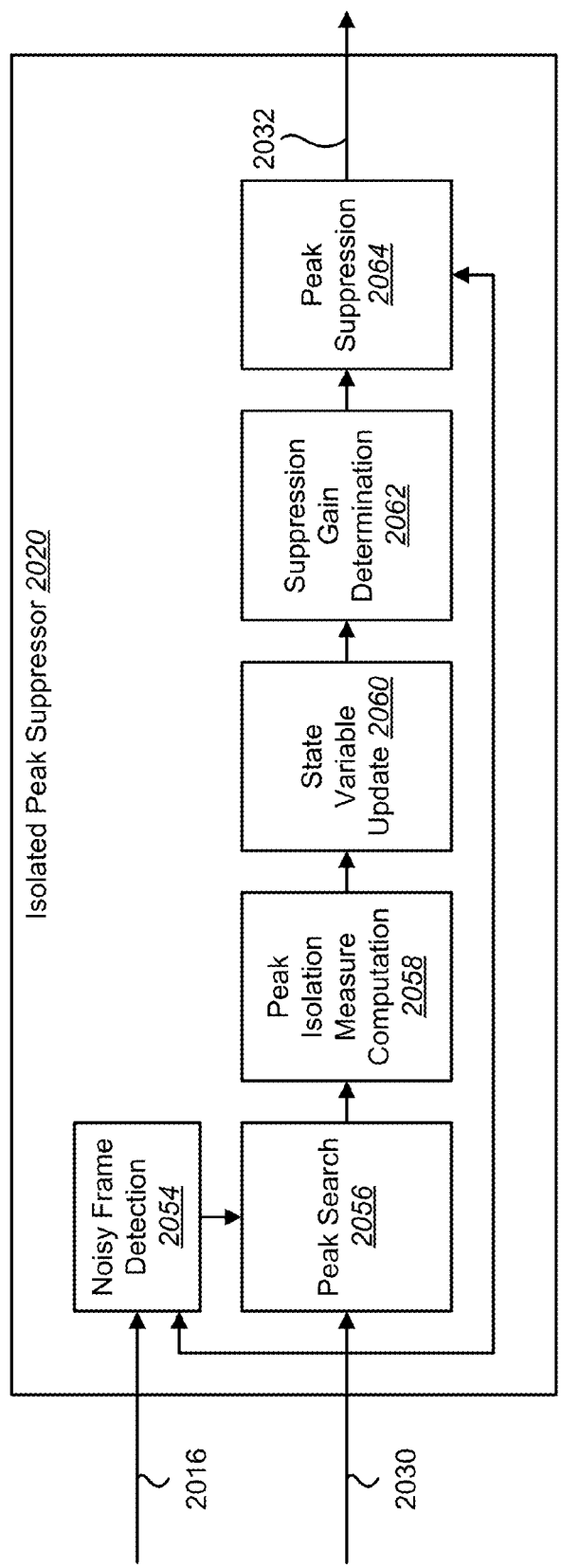
FIG. 20 is a block diagram illustrating one example of an isolated peak suppressor.

FIG. 20 is a block diagram illustrating one example of an isolated peak suppressor 2020. In some configurations, the isolated peak suppressor 2020 may be implemented in one or more of the electronic devices 102, 302 described herein. In particular, FIG. 20 provides observations and solutions for suppressing isolated peaks.

The isolated peak suppressor 2020 may perform isolated peak suppression. For example, filtering-based noise suppression systems often create isolated tonal peaks. These isolated tonal peaks may sound unnatural and annoying. The isolated tonal peaks may be caused by noise under-estimation for non-stationary noises, microphone gain mismatch, acoustic room conditions and so on. The isolated peak suppressor 2020 may include a noisy frame detection module 2054, a peak search module 2056, a peak isolation measure computation module 2058, a state variable update module 2060, a suppression gain determination module 2062 and/or a peak suppression module 2064.

The noisy frame detection module 2054 may detect noisy frames based on the audio signal 2016 (e.g., noise suppression input) and the noise-suppressed audio signal 2030 (e.g., noise suppression output). In particular, it may be observed that isolated tonal peaks are usually generated in frames where noise is dominant. Thus, the ratio between the noise-suppressed audio signal 2030 (e.g., the noise suppression output) energy and the audio signal 2016 (e.g., input) energy may be utilized to differentiate frames containing isolated peaks from speech frames. For example, the noisy frame detection module 2054 may compute the energy ratio between the noise-suppressed audio signal 2030 and the audio signal 2016. The energy ratio may be compared to a threshold. Frames with an energy ratio below the threshold value may be designated as noisy frames in some configurations.

The peak search module 2056 may search for peaks (optionally in frames that are detected as noisy). For example, the peak search module 2056 may search for local maxima in the spectrum of the noise-suppressed audio signal 2030.

The peak isolation measure computation module 2058 may determine one or more peak isolation measures based on any peak(s) detected by the peak search module 2056. Neighboring bins of isolated peaks usually have very low energy. Accordingly, comparing peak energy and neighboring bin energy may be used to detect the isolated peaks. For example, the peak isolation measure computation module 2058 may compute one or more metrics that measure peak isolation. In some configurations, the peak isolation measure computation module 2058 may compute a first peak isolation measure (e.g., peak_$Q_1$) and a second peak isolation measure (e.g., peak_$Q_2$).

For instance, two peak isolation measures may be defined for isolated peak suppression. A first peak isolation measure may be defined as $$\text{peak\_}Q_1 = \frac{\text{peak\_energy}(t, f)}{\max(\text{neighboring\_bin\_energy}(t, f))}.$$

In some configurations, peak_energy (for a frame t and a frequency bin f, for example) may be determined based on a sum of squares of samples over a peak range (e.g., a range of samples over which the peak is defined). This peak_energy may be divided by a maximum of neighboring_bin_energy of the frame (e.g., the current frame, frame t). The first peak isolation measure peak_$Q_1$ may be computed within a frame. Conceptually, this may be considered similar to a "Q factor" in filter design. While natural speech signals maintain a low value when the range of neighboring bins is wide enough, isolated peaks may have a high value. In some configurations, suppression gain may be determined as inversely proportional to peak_$Q_1$.

A second peak isolation measure may be defined as $$\text{peak\_}Q_2 = \frac{\text{peak\_energy}(t, f)}{\max(\text{peak\_energy}(t-1, f))}.$$

The second peak isolation measure peak_$Q_2$ may be computed between the previous frame (t−1) and the current frame (t). This may be used to detect the onset of isolated peaks.

In some cases, the isolated peaks are sustained for one or more frames after they are created (or "born"). The peaks may be tracked via state update. The state variable update module 2060 may update an isolated peak state based on the peak isolation measures. For example, the state variable update module 2060 may determine a state based on the peak isolation measure(s). In some configurations, the state variable update module 2060 may determine whether an isolated peak state is idle, onset or sustained. The onset state may indicate that the beginning of an isolated peak has been detected. The sustained state may indicate that an isolated peak is continuing. The idle state may indicate that no isolated peak is detected.

The suppression gain determination module 2062 may determine a suppression gain for suppressing isolated peaks. For example, the suppression gain may be a degree of suppression utilized to suppress an isolated peak. In some configurations, the suppression gain determination module 2062 may determine the suppression gain as inversely proportional to a peak isolation measure (e.g., to the first peak isolation measure or peak_$Q_1$). The suppression gain determination module 2062 may operate when the state variable update module 2060 indicates onset or sustained, for example.

The peak suppression module 2064 may suppress (e.g., attenuate, reduce, subtract, remove, etc.) isolated peaks in the noise-suppressed audio signal 2030 (e.g., noise suppression output). For example, the peak suppression module 2064 may apply the suppression gain determined by the suppression gain determination module 2062. The output of the isolated peak suppressor 2020 may be an isolated peak-suppressed audio signal (e.g., an audio signal with one or more suppressed isolated peaks). Additional detail is provided as follows.

Figure 21:
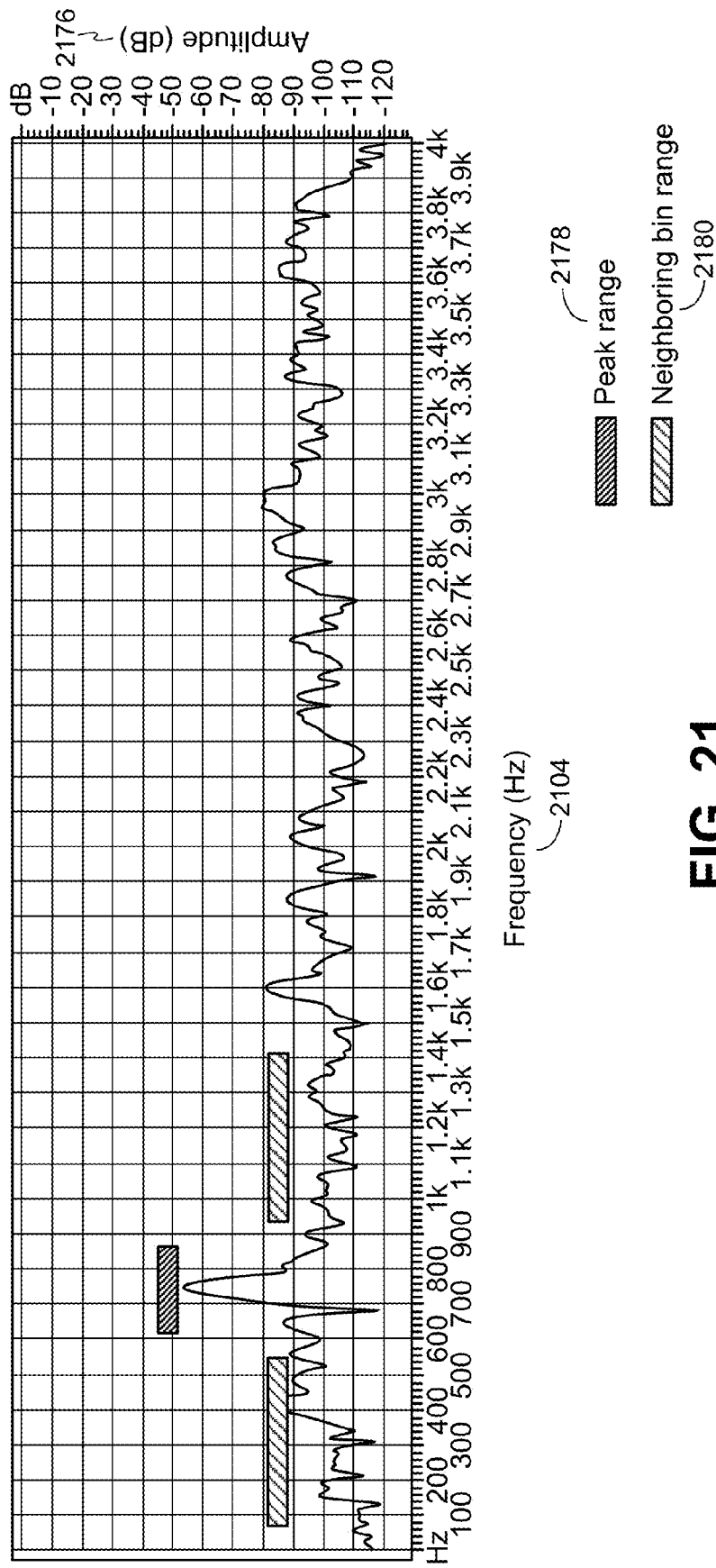
FIG. 21 is a graph illustrating one example of an isolated peak.

FIG. 21 is a graph illustrating one example of an isolated peak. In particular, FIG. 21 includes a graph of a signal spectrum, where the horizontal axis is illustrated in frequency (Hz) 2104 and the vertical axis is illustrated in amplitude in decibels (dB) 2176. Specifically, FIG. 21 illustrates an isolated peak range 2178 and a neighboring bin range 2180, which may be utilized to determine (e.g., compute) one or more of the isolation peak measures described in connection with FIG. 20. For example, the peak measure isolation measure computation module 2058 may determine the peak isolation measure(s) based on the peak range 2178 and the neighboring bin range 2180.

Figure 22:
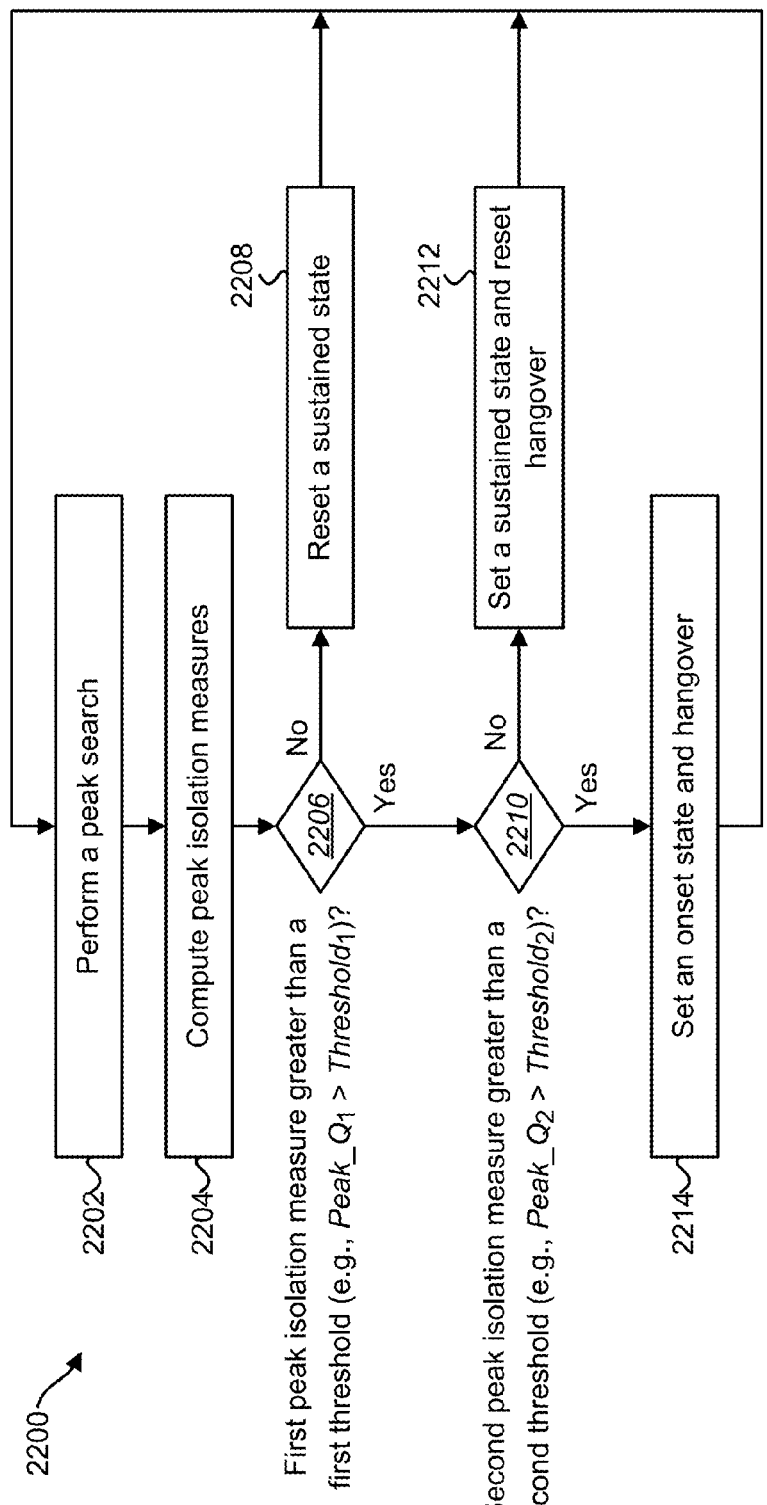
FIG. 22 is a flow diagram illustrating one configuration of a method for isolated peak detection.

FIG. 22 is a flow diagram illustrating one configuration of a method 2200 for isolated peak detection. The method 2200 may be performed by the isolated peak suppressor 2020 described in connection with FIG. 20. Isolated peak detection may be based on isolated peak state updates, which may be utilized for isolated peak suppression. In the configuration illustrated in FIG. 22, each frequency bin has a corresponding state variable with three states: "idle," "onset" and "sustained." The states are updated based on a first peak isolation measure (e.g., peak_$Q_1$) and a second peak isolation measure (e.g., peak_$Q_2$).

The isolated peak suppressor 2020 may perform 2202 a peak search. This may be accomplished as described above in connection with FIG. 20. For example, the isolated peak suppressor 2020 may search for local maxima in the spectrum of a noise-suppressed audio signal 2030. In some configurations, the peak search may be performed for noisy frames.

The isolated peak suppressor 2020 may compute 2204 peak isolation measures. This may be accomplished as described above in connection with FIG. 20. For example, the isolated peak suppressor 2020 may compute a first peak isolation measure (e.g., peak_$Q_1$) and a second peak isolation measure (e.g., peak_$Q_2$).

The peak isolation measures may be compared to corresponding thresholds (e.g., $threshold_1$ and $threshold_2$) in order to update the state. In some configurations, variables (e.g., $Q_1$, $Q_2$ and hangover) may be utilized to determine the state. For example, $Q_1$=1 if peak_$Q_1$>$threshold_1$. Otherwise, $Q_1$=0. Additionally, $Q_2$=1 if peak_$Q_2$>$threshold_2$. Otherwise, $Q_2$=0. It should be noted that suppression gain may be "1" if the state is idle in some configurations. Furthermore, suppression gain may be less than "1" if the state is onset or sustained. As described above, the suppression gain may be determined to be inversely proportional to peak_$Q_1$.

The isolated peak suppressor 2020 may determine 2206 whether the first peak isolation measure is greater than a first threshold (e.g., peak_$Q_1$>$threshold_1$). For example, the isolated peak suppressor 2020 may determine $Q_1$. If the first peak isolation measure is not greater than the first threshold (e.g., peak_$Q_1$≤$threshold_1$ and therefore $Q_1$=0), then the isolated peak suppressor 2020 may reset 2208 the sustained state. If the first peak isolation measure is greater than the first threshold (e.g., peak_$Q_1$>$threshold_1$ and therefore $Q_1$=1), then the isolated peak suppressor 2020 may determine 2210 whether the second peak isolation measure (e.g., peak_$Q_2$) is greater than the second threshold (e.g., peak_$Q_2$>$threshold_2$). For example, the isolated peak suppressor 2020 may determine $Q_2$.

If the second peak isolation measure is not greater than the second threshold (e.g., peak_$Q_2$≤$threshold_2$ and therefore $Q_2$=0), then the isolated peak suppressor 2020 may set 2212 the sustained state and reset hangover (e.g., a hangover variable may be set to 0). For example, the isolated peak suppressor 2020 may track the detected peak for a certain period of time. If the second peak isolation measure is greater than the second threshold (e.g., peak_$Q_2$>$threshold_2$ and therefore $Q_2$=1), then the isolated peak suppressor 2020 may set 2214 the onset state and hangover (e.g., the hangover variable may be set to 1). For example, the isolated peak suppressor 2020 may detect the "birth" of a new isolated peak.

Figure 23:
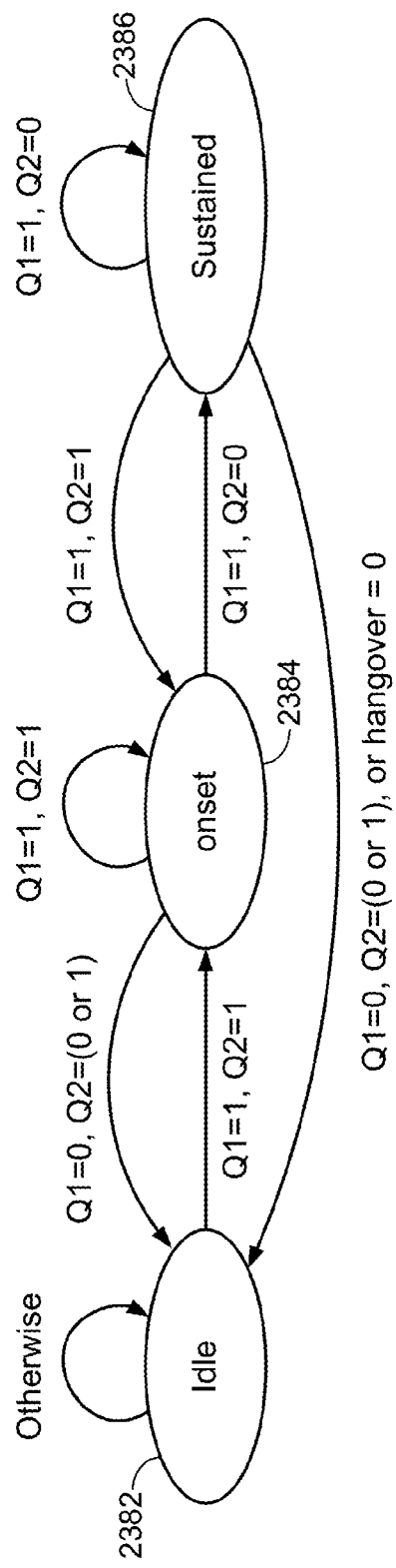
FIG. 23 includes a state diagram (e.g., state-machine view) of one configuration of isolated peak detection.

FIG. 23 includes a state diagram (e.g., state-machine view) of one configuration of isolated peak detection. For example, the isolated peak suppressor 2020 (e.g., the state variable update module 2060) described in connection with FIG. 20 may operate in accordance with the method 2200 described in connection with FIG. 22 and/or in accordance with the states described in connection with FIG. 23. As illustrated in FIG. 23, peak detection and/or tracking may operate in accordance with an idle state 2382, an onset state 2384 and a sustained state 2386. In this configuration, transitions between states may occur based on variables $Q_1$ and $Q_2$ as described above in connection with FIG. 22. As described above, $Q_1$=1 if peak_$Q_1$>$threshold_1$ (with $Q_1$=0 otherwise) and $Q_2$=1 if peak_$Q_2$>$threshold_2$ (with $Q_2$=0 otherwise). Although described in terms of $Q_1$ and $Q_2$ for convenience, it should be noted that the transitions described in FIG. 23 can be equivalently described in terms of whether the first peak isolation measure is greater than a first threshold and whether the second peak isolation measure is greater than a second threshold.

The idle state 2382 may transition to the onset state 2384 if $Q_1$=1 and $Q_2$=1 (e.g., if peak_$Q_1$>$threshold_1$ and peak_$Q_2$>$threshold_2$). Otherwise, isolated peak detection stays in the idle state 2382.

The onset state 2384 may transition to the idle state 2382 if $Q_1$=0 (whether $Q_2$ is 0 or 1, for example). Isolated peak detection may stay in the onset state 2384 if $Q_1$=1 and $Q_2$=1. The onset state 2384 may transition to the sustained state 2386 if $Q_1$=1 and $Q_2$=0. Isolated peak detection may stay in the sustained state 2386 if $Q_1$=1 and $Q_2$=0. The sustained state 2386 may transition to the onset state 2384 if $Q_1$=1 and $Q_2$=1. The sustained state 2386 may transition to the idle state 2382 if $Q_1$=0 (whether $Q_2$ is 0 or 1, for example) or if hangover=0.

Figure 24:
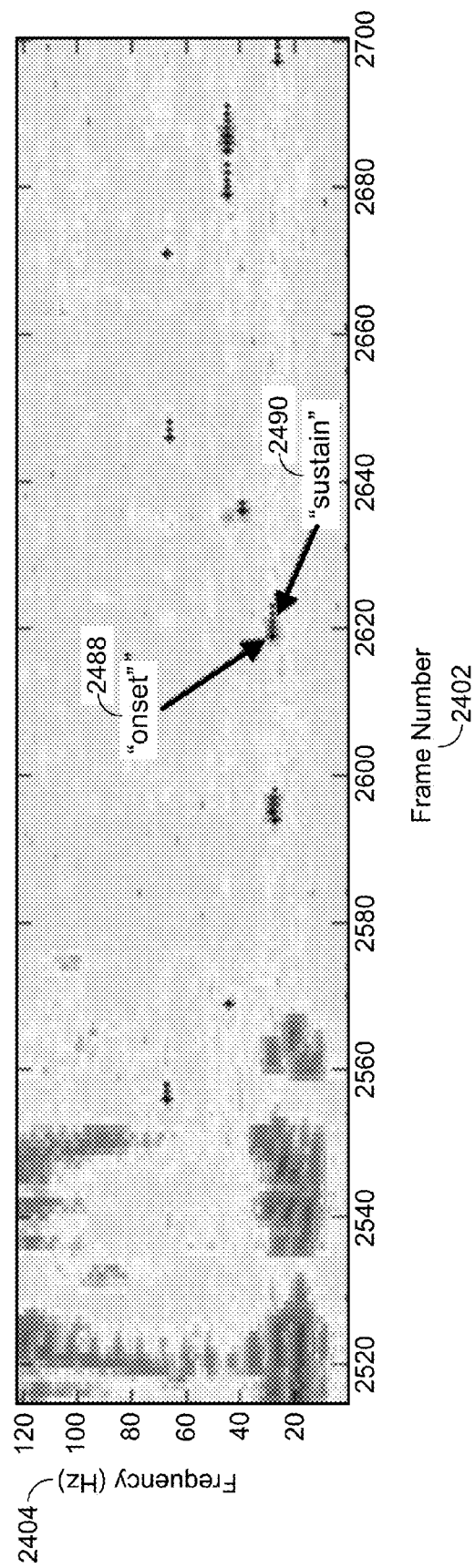
FIG. 24 includes a graph that illustrates examples of peak detection.

FIG. 24 includes a graph that illustrates examples of peak detection. In particular, FIG. 24 includes a graph of a speech spectrum over frame number 2402, where the horizontal axis is illustrated in frame number 2402 and the vertical axis is illustrated in frequency (Hz) 2404. In particular, the dots on the graph illustrate detected peaks, where a first dot denotes onset 2488 (e.g., the onset state as described in connection with FIGS. 22 and/or 23) of an isolated peak and subsequent dots denote isolated peak sustain 2490 (e.g., the sustained state as described in connection with FIGS. 22 and/or 23).

Figure 25:
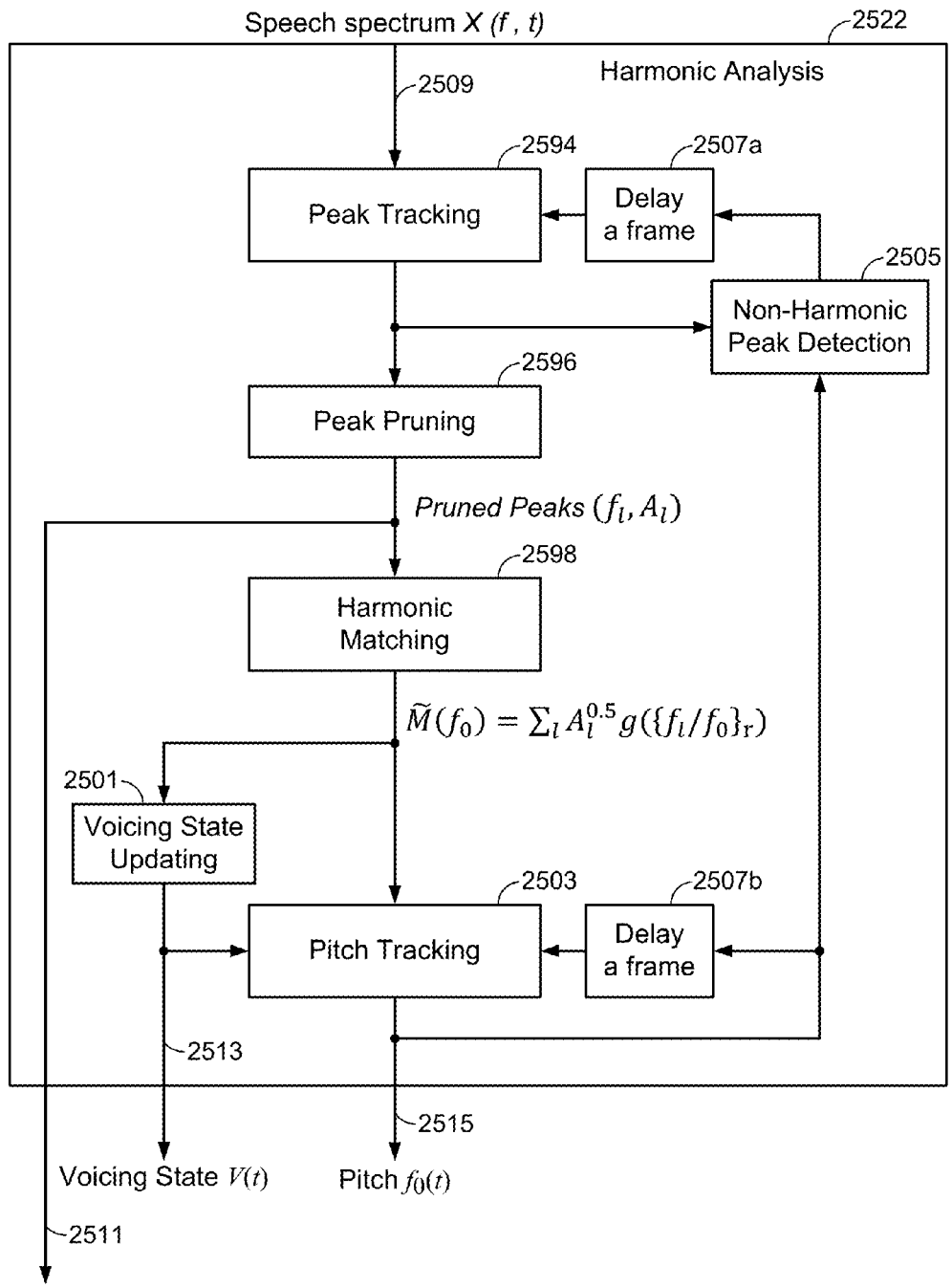
FIG. 25 is a block diagram illustrating one configuration of a harmonic analysis module.

FIG. 25 is a block diagram illustrating one configuration of a harmonic analysis module 2522. The harmonic analysis module 2522 may perform harmonic analysis of noisy and incomplete spectrum using peaks. In some configurations, the harmonic analysis module 2522 may perform the harmonic analysis 1084 described in connection with FIG. 10. The harmonic analysis module 2522 may utilize a speech spectrum signal 2509 for pitch detection and tracking. Examples of the speech spectrum signal 2509 include an audio signal, a noise-suppressed audio signal and an isolated-peak suppressed audio signal as described above.

The harmonic analysis module 2522 may include a peak tracking module 2594, a peak pruning module 2596, a harmonic matching module 2598, a voicing state updating module 2501, a pitch tracking module 2503, a non-harmonic peak detection module 2505 and/or frame delay modules 2507*a-b*. The harmonic analysis module 2522 may perform peak tracking and pruning to obtain reliable information (e.g., refined peaks, reliable peaks, etc.). For example, the harmonic analysis module 2522 may exclude certain peaks. In some configurations, the peak tracking module 2594 may determine the location (e.g., frequency) of one or more peaks in the speech spectrum signal 2509.

The peak tracking module 2594 may determine and/or track one or more peaks in the speech spectrum signal 2509. For example, the peak tracking module 2594 may determine local maximums in the speech spectrum signal 2509 as peaks. In some configurations, the peak tracking module 2594 may smooth the speech spectrum signal 2509. For example, the speech spectrum signal 2509 may be filtered (e.g., low-pass filtered) to obtain a smoothed spectrum.

The peak tracking module 2594 may obtain non-harmonic peaks (e.g., locations) from a previous frame from frame delay module A 2507*a*. The peak tracking module 2594 may compare any detected peaks in the current frame to the non-harmonic peaks (e.g., locations) from the previous frame. The peak tracking module 2594 may designate any peaks in the current frame that correspond to the non-harmonic peaks from the previous frame as continuous non-harmonic peaks.

The peak tracking module 2594 may provide the peak locations, may provide the smoothed spectrum and/or may indicate the continuous non-harmonic peaks to the peak pruning module 2596. The peak tracking module 2594 may also provide the peak locations to the non-harmonic peak detection module 2505.

The non-harmonic peak detection module 2505 may detect one or more of the peaks (at the peak locations) that are non-harmonic peaks. For example, the non-harmonic peak detection module 2505 may utilize a fundamental frequency 2515 (e.g., pitch $f_0(t)$) to determine which of the peaks are not harmonics of the fundamental frequency. For instance, the non-harmonic peak detection module 2505 may determine one or more peak locations that are not at approximate integer multiples (e.g., within a range of integer multiples) of the fundamental frequency 2515 as non-harmonic peaks. The non-harmonic peak detection module 2505 may provide the non-harmonic peaks (e.g., locations) to frame delay module A 2507*a*. Frame delay module A 2507*a* may provide the non-harmonic peaks (e.g., locations) to the peak tracking module 2594. In other words, the non-harmonic peaks (e.g., locations) provided to the peak tracking module 2594 may correspond to a previous frame.

The peak pruning module 2596 may remove one or more peaks (from the speech spectrum signal 2509, for example) that meet one or more criteria. For example, the peak pruning module 2596 may exclude peaks that are too small relative to a strongest peak and the smoothed spectrum, may exclude peaks with too low tonality (based on a difference from a standard peak template), may exclude peaks that are too close to stronger peaks (e.g., less than a lower limit of $f_0$) and/or may exclude peaks that are continuous from non-harmonic peaks of the previous frame.

In some configurations, the peak pruning module 2596 may remove any peaks with amplitudes that are less than a particular percentage of the amplitude of the strongest peak (e.g., the peak with the highest amplitude for the frame of the speech spectrum signal 2509) and/or that are within a particular amplitude range of the smoothed spectrum. Additionally or alternatively, the peak pruning module 2596 may remove any peaks with tonality below a tonality threshold. For example, peaks that differ beyond an amount from a peak template may be removed. Additionally or alternatively, the peak pruning module 2596 may remove any peaks that are within a particular frequency range from a stronger peak (e.g., a neighboring peak with a high amplitude). Additionally or alternatively, the peak pruning module 2596 may remove any peaks that are continuous from non-harmonic peaks of the previous frame. For example, peaks indicated by the peak tracking module 2594 as being continuous from non-harmonic peaks of the previous frame may be removed.

The peaks remaining after peak pruning may be referred to as refined peaks 2511 (e.g., "pruned peaks" or "reliable peaks"). The refined peaks 2511 may be provided to the harmonic matching module 2598. In some configurations, the refined peaks 2511 may include refined peak locations (e.g., $f_i$), refined peak amplitudes (e.g., $A_i$) and/or refined peak phases (e.g., $\phi_i$).

The harmonic matching module 2598 may perform harmonic matching for finding the fundamental frequency (e.g., $f_0$). For example, the harmonic matching module 2598 may find the fundamental frequency with only a few refined peaks 2511 (e.g., $f_i$), where the fundamental frequency (e.g., $f_0$) is the generalized greatest common divisor for the refined peaks 2511 (e.g., the fractional part of $f_i/f_0$ denoted $\{f_i/f_0\}_r$, as small as possible for each $f_i$). For example, $$f_0 = \arg\max_{f_0} \tilde{M}(f_0).$$

This may be utilized to find $f_0$ that best matches the observed peak frequencies $\{f_i\}$ in the sense that $f_0$ makes each $\{f_i/f_0\}$, as small as possible over a given range for $f_0$. $\tilde{M}(f_0)$ denotes the harmonic matching spectrum (e.g., a weighted harmonic matching score), where $\tilde{M}(f_0)=\Sigma_i w(A_i) g(\{f_i/f_0\}_r)$. This is a sum of harmonic matching scores for peaks $f_i$ weighted by their amplitudes $A_1$. In some configurations, the weighting function is $w(A_i)=A_i^{0.5}$, which provides a weight for ampli tude. $g(\{f_i/f_0\}_r)$ denotes a harmonic matching measure, which may be $$g(\{f_i/f_0\}_r) = \frac{1}{\left(1 + e^{30(\{f_i/f_0\}_r - 0.2)}\right)},$$

for example. This provides a score between 0 and 1, which reflects the extent to which $f_i/f_0$ is close to some integer. The harmonic matching module 2598 may provide the harmonic matching spectrum (e.g., $\tilde{M}(f_0)$) to the pitch tracking module 2503. The harmonic matching module 2598 may provide the harmonic matching measure (e.g., $g(\{f_i/f_0\}_r)$).

The voicing state updating module 2501 may perform voicing state classification as follows. In some configurations, there may be three voicing states: non-voice (e.g., V(t)=0), voiced-sustained (e.g., V(t)=1) and voiced-onset (e.g., V(t)=0.5). This may allow different strategies for non-voice, voiced-sustained and voiced-onset (and/or silent) portions of speech and dynamic pitch variance control.

State tracking from frame to frame may be performed as follows in some configurations. Low band harmonic energy may be based on the detected fundamental frequency (e.g., $f_0$) below a cutoff frequency (e.g., $f_{cutoff}$). For example, $\overline{M}(f_0) = \Sigma_{f_i < f_{cutoff}} A_i g(\{f_i/f_0\}_r)$. In some configurations, $f_{cutoff}=1$ kilohertz (kHz).) The voicing state updating module 2501 may initialize a tracking count (at 0, for example). The tracking count may be increased (by 1, for example) if $\overline{M}(f_0)$ is greater than a predetermined threshold. The tracking count may be limited to 3. For example, if increasing the tracking count would make the tracking count greater than 3, then the tracking count may not be increased, but may be limited to 3. The tracking count may be decreased (by 1, for example) if $\overline{M}(f_0)$ is less than or equal to a predetermined threshold (e.g., the same as or different from the predetermined threshold used for increasing the tracking count). The tracking count may be limited to 0. For example, if decreasing the tracking count would make the tracking count less than 0, then the tracking count may not be decreased, but may be limited to 0.

The tracking count may be mapped to voicing states as follows. If the tracking count=0, then the voicing state may be non-voice (e.g., V(t)=0), indicating a non-voiced frame. If the tracking count=1 in the current frame and the tracking count=0 in the previous frame, then the voicing state may be voiced-onset (e.g., V(t)=0.5), indicating a voice onset in a frame. In other cases, the voicing state may be voiced-sustained (e.g., V(t)=1), indicating sustained voice in a frame. In some configurations, the tracking count may be limited to [0, 1, 2, 3]: 0 for non-voiced, 3 for voiced-sustained and 1 and 2 for voiced-onset. The voicing state updating module 2501 may provide the voicing state (indicating non-voice, voiced-onset or voiced-sustained, for example) to the pitch tracking module 2503.

The pitch tracking module 2503 may perform pitch tracking for a continuous contour. This may be referred to as "dynamic pitch variance control." The pitch tracking module 2503 may compute and/or utilize a pitch difference measure. The pitch difference measure may be a measure of pitch changing rate from frame to frame. In some configurations, the pitch difference measure may be in the logarithmic domain. For example, the pitch difference measure may be denoted $d_{f_0}(t) = |\log_2 (f_0(t)/f_0(t-1))|$. An adaptive pitch search range may be monotonically decreasing as the number of consecutive voiced frames (e.g., V(t)>0) increases up to the current frame increases. For example, the adaptive pitch search range may gradually shrink while going deeper into voiced segments (from 1.5 to 0.4 in 5 frames, for instance). Pitch candidates may be a number of the largest peaks of the harmonic matching spectrum. For example, the pitch candidates may be the three largest peaks of $\tilde{M}(f_0)$, covering halving and doubling. The pitch tracking module 2503 may utilize forward path tracking to maximize sustained harmonic energy. For example, the pitch tracking module 2503 may determine the fundamental frequency 2515 (e.g., pitch) as $$f_0(t) = \arg\max_{f_0(t)} \{\tilde{M}_t^3(f_0(t)) - 0.25 d_{f_0}(t) \tilde{M}_{t-1}^3(f_0(t-1))\}.$$

As illustrated in FIG. 25, the fundamental frequency 2515 (e.g., pitch) may be provided to the non-harmonic peak detection module 2505 and to frame delay module B 2507b. The non-harmonic peak detection module 2505 may utilize the fundamental frequency 2515 to detect one or more non-harmonic peaks as described above. Frame delay module B 2507b may delay the fundamental frequency 2515 by a frame. In other words, frame delay module B 2507b may provide the fundamental frequency from a previous frame (e.g., $f_0(t-1)$) to the pitch tracking module 2503. The pitch tracking module 2503 may utilize the fundamental frequency from the previous frame to compute a pitch difference measure as described above.

Figure 26:
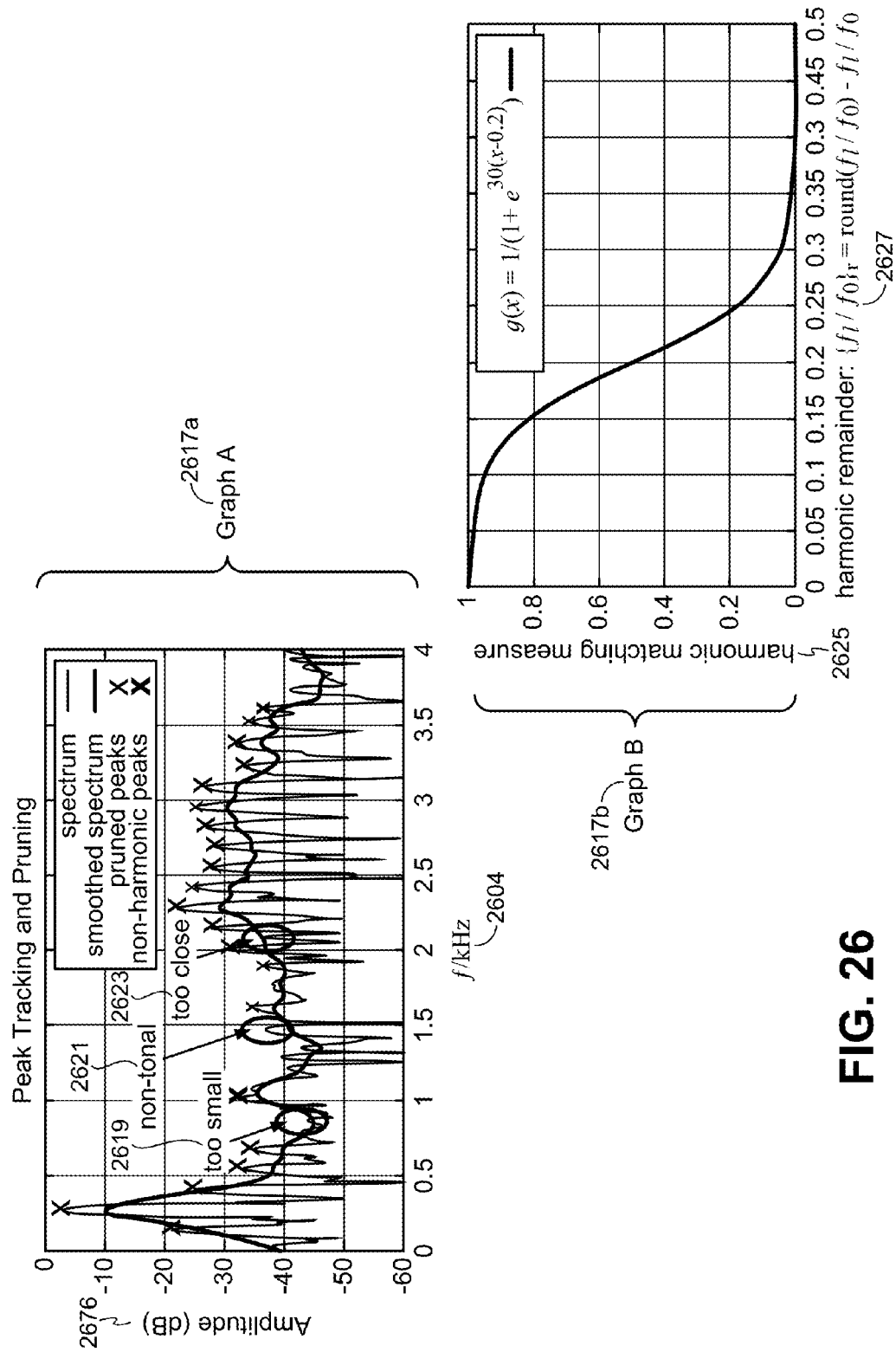
FIG. 26 includes graphs that illustrate an example of harmonic analysis in accordance with the systems and methods disclosed herein.

FIG. 26 includes graphs 2617a-b that illustrate an example of harmonic analysis in accordance with the systems and methods disclosed herein. Graph A 2617a illustrates examples of peaks that are pruned based on the criteria described in connection with FIG. 25. In particular, graph A 2617a illustrates examples of peaks that are removed because they are too small 2619, non-tonal 2621 or too close 2623 to another peak. Graph B 2617b illustrates an example of a harmonic matching measure 2625 over a harmonic remainder 2627.

Figure 27:
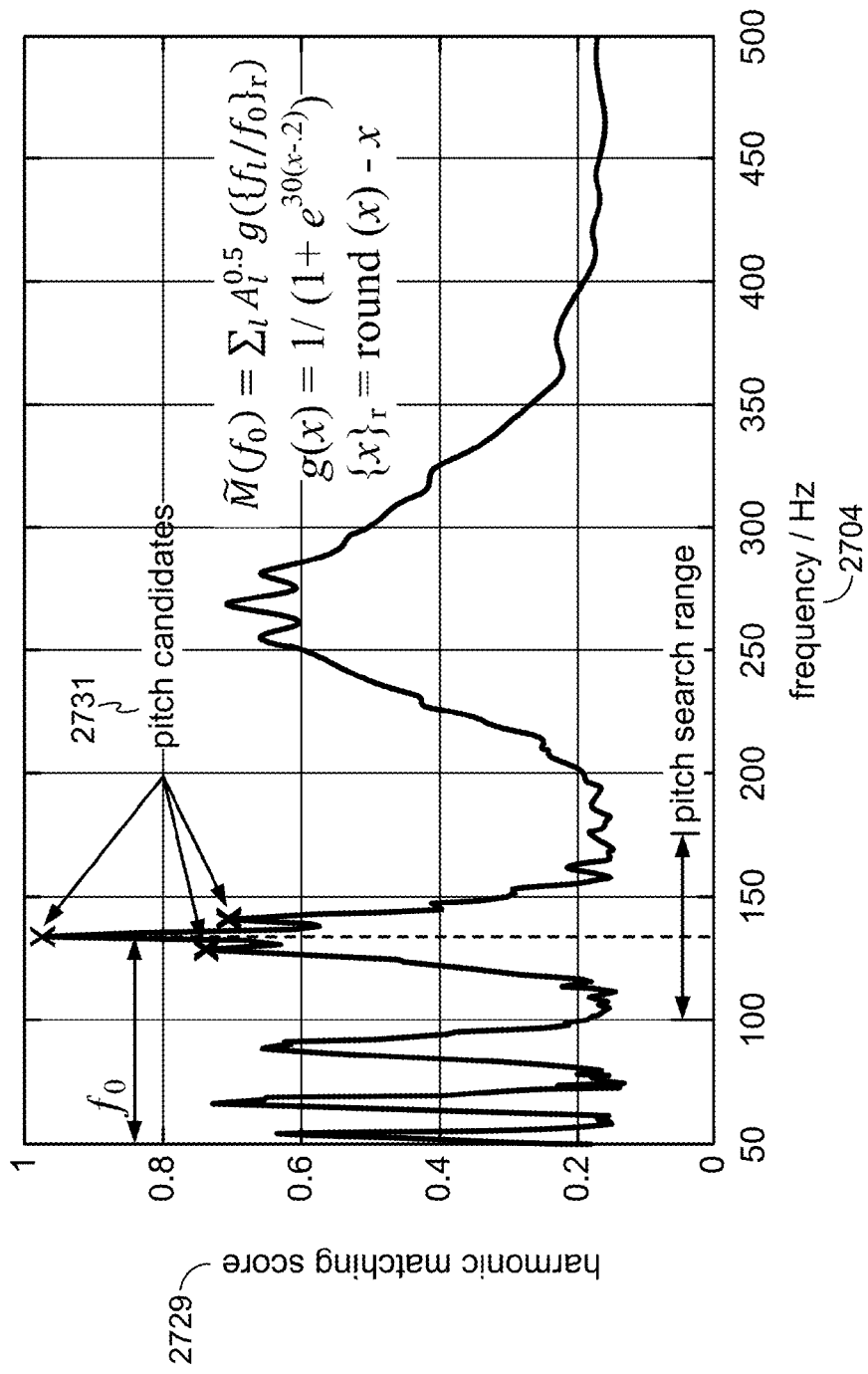
FIG. 27 includes a graph that illustrates an example of pitch candidates.

FIG. 27 includes a graph that illustrates an example of pitch candidates 2731. In particular, the graph illustrates an example of a harmonic matching score 2729 over frequency (Hz) 2704. The pitch candidates 2731 may be obtained as described in connection with FIG. 25. In particular, FIG. 27 illustrates pitch candidates 2731 in a pitch search range.

Figure 28:
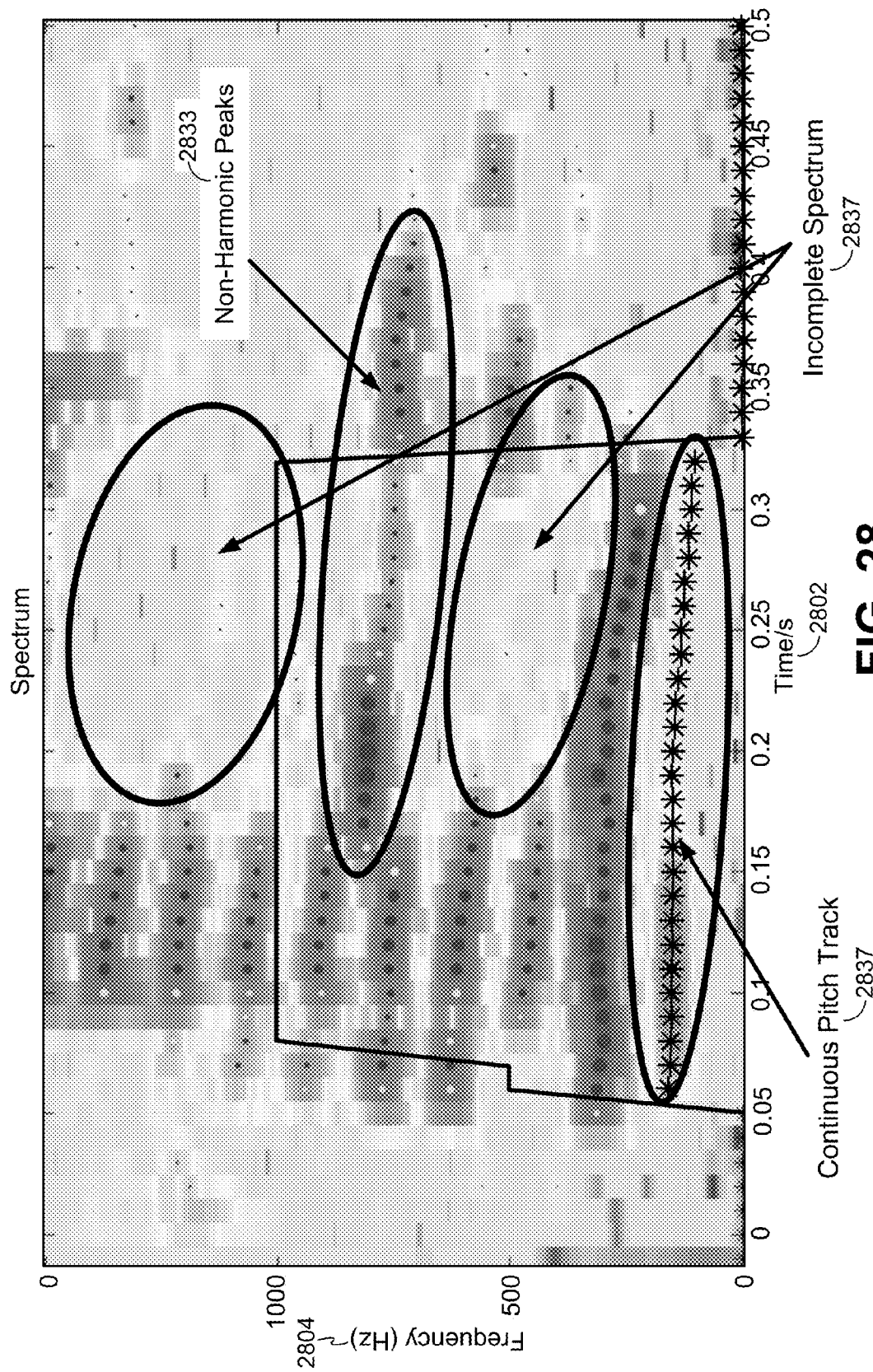
FIG. 28 includes a graph that illustrates an example of harmonic analysis in accordance with the systems and methods disclosed herein.

FIG. 28 includes a graph that illustrates an example of harmonic analysis in accordance with the systems and methods disclosed herein. In particular, FIG. 28 includes examples of a continuous pitch track 2835 and non-harmonic peaks 2833 that may be determined as described in connection with FIG. 25. For example, the graph illustrates that non-harmonic peaks 2833 may occur in between harmonic partials (for musical noise, for example). FIG. 28 also illustrates incomplete spectrum 2837 (e.g., missing partials).

Figure 29:
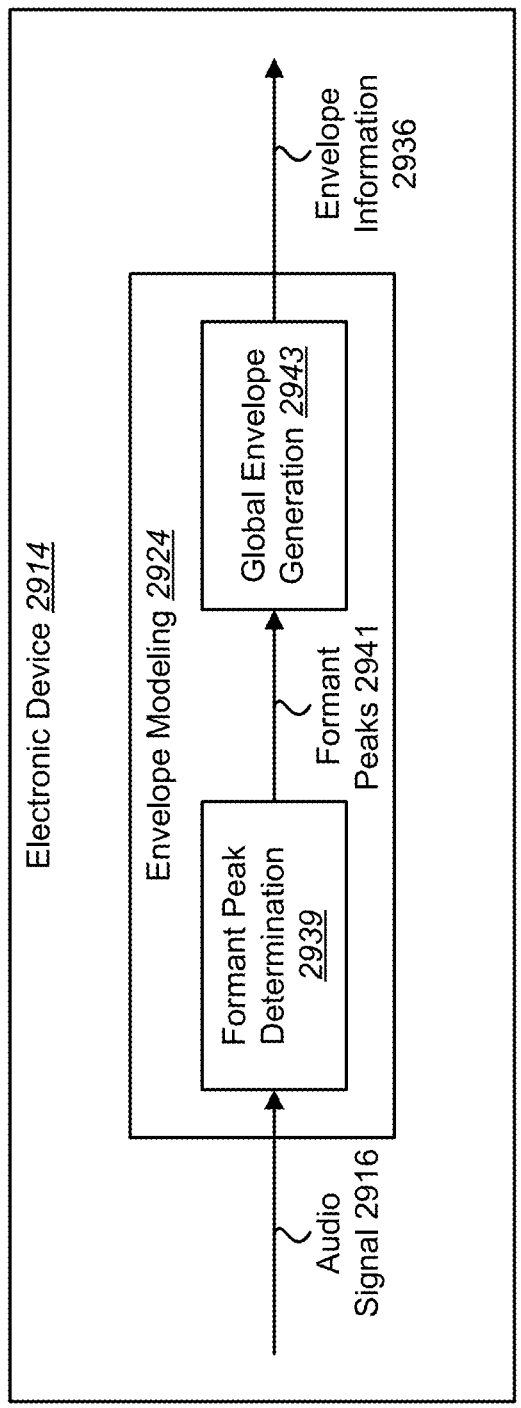
FIG. 29 is a block diagram illustrating another configuration of an electronic device in which systems and methods for enhancing an audio signal may be implemented.

FIG. 29 is a block diagram illustrating another configuration of an electronic device 2914 in which systems and methods for enhancing an audio signal 2916 may be implemented. Examples of the electronic device 2914 include cellular phones, smartphones, tablet devices, voice recorders, laptop computers, desktop computers, landline phones, camcorders, still cameras, in-dash electronics, game systems, televisions, appliances, etc. One or more of the components of the electronic device 2914 may be implemented in hardware (e.g., circuitry) or a combination of hardware and software.

The electronic device 2914 may include an envelope modeling module 2924. The envelope modeling module 2924 described in connection with FIG. 29 may perform one or more of the functions and/or procedures described in connection with envelope modeling. It should be noted that the envelope modeling module 2924 may only operate on voiced frames in some configurations. For example, the envelope modeling module 2924 may receive a voicing state (e.g., V(t). If the voicing state indicates a voiced frame (e.g., voiced-sustained frame or voiced-onset frame), the envelope modeling module 2924 may generate a global envelope. However, if the voicing state indicates a non-voiced frame, the envelope modeling module 2924 may not operate on (e.g., may bypass) the non-voiced frame. In some configurations, the voicing state may be provided by a known voice activity detector (e.g., VAD). In other configurations, the envelope modeling module 2924 may receive the voicing state from a harmonic analysis module as described above.

The envelope modeling module 2924 may include a formant peak determination module 2939 and/or a global envelope generation module 2943. The formant peak determination module 2939 may determine formant peaks 2941 based on the audio signal 2916. In some configurations, the formant peak determination module 2939 may obtain spectral information (e.g., peak locations, peak amplitudes and/or a fundamental frequency) based on the audio signal 2916. In other configurations, the formant peak determination module 2939 may receive spectral information based on the audio signal 2916. For example, the formant peak determination module 2939 may receive refined peak locations (e.g., $f_l$), refined peak amplitudes (e.g., $A_l$) and/or a fundamental frequency (e.g., $f_0(t)$) from a harmonic analysis module.

In some configurations, the formant peak determination module 2939 may determine the formant peaks 2941 as a number (e.g., 3-4) of the largest peaks (e.g., local maxima) of the refined peaks. However, it should be noted that the formant peak determination module 2939 may determine the formant peaks 2941 directly from the audio signal 2916, the noise-suppressed audio signal or the isolated peak-suppressed audio signal in other configurations. The formant peaks 2941 may be provided to the global envelope generation module 2943.

The global envelope generation module 2943 may generate formant peak models. Each of the formant peak models may be formant peak envelopes (over a spectrum, for example) that model a formant peak. Generating the formant peak models may include individually modeling each formant peak. For example, the global envelope generation module 2943 may utilize one or more model types to individually model each formant peak. Some examples of model types that may be utilized to generate the formant peak models include filters, all-pole models (where all-poles models resonate at the formant peak), all-zero models, autoregressive-moving-average (ARMA) models, etc. It should be noted that different order models may be utilized. For example, all-pole models may be second-order all-pole models, third-order all-pole models, etc.

In some configurations, individually modeling each formant peak may include determining whether each formant peak is supported. A formant peak may be supported if there are neighboring peaks (at neighboring harmonics, for example). A formant peak may be unsupported if one or more neighboring peaks (at neighboring harmonics, for example) are missing.

Individually modeling each formant peak may also include selecting a modeling type for each formant peak based on whether each respective formant peak is supported. For example, the global envelope generation module 2943 may model one or more supported formant peaks with a first modeling (e.g., local-matching two-pole modeling) and/or may model one or more unsupported formant peaks with a second modeling (e.g., fixed-p two-pole modeling).

In some configurations, the global envelope generation module 2943 may perform dominant local all-pole modeling of an envelope from incomplete spectrum. For example, the global envelope generation module 2943 may use formant peaks (e.g., only formant peaks) for local all-pole modeling.

The global envelope generation module 2943 may generate a global envelope (e.g., H(f)) based on the formant peak models. For example, the global envelope generation module 2943 may determine formant peak models (e.g., envelopes) and merge the formant peak models to produce the global envelope of the frame (e.g., voiced frame). This may produce an envelope from highly incomplete spectral information. In some configurations, the global envelope generation module 2943 may concatenate the formant peak models to produce the global envelope. Additionally or alternatively, the global envelope generation module 2943 may perform a maximum (e.g., "max") operation on the formant peak models. For example, the global envelope generation module 2943 may merge separate envelopes from the local all-pole modeling based on the max operation. For instance, the maximum amplitude of all the formant peak models (e.g., envelopes) over the spectrum may yield a max envelope. This may maintain local consistency at formant peaks and nearby. In some configurations, discrete-all-pole (DAP) modeling may be performed on the max envelope to yield the global envelope. In other configurations, the max envelope may be smoothed with a smoothing filter or a smoothing algorithm to yield the global envelope. In yet other configurations, the max envelope itself may be utilized as the global envelope.

In some configurations, the global envelope generation module 2943 may perform missing partial prediction. For example, the global envelope generation module 2943 may determine missing partials at harmonic frequencies of the fundamental frequency (e.g., at $f_k=kf_0$, where k is a set of integers). The global envelope generation module 2943 may determine the missing partial amplitudes as the magnitudes (e.g., absolute values) of the global envelope at each of the harmonic frequencies (e.g., $A_k=|H(f_k)|$). The global envelope generation module 2943 may also determine the missing partial minimum phases (e.g., $\phi_k^m=\arg H(f_k)$).

The global envelope generation module 2943 may provide envelope information 2936. In some configurations, the envelope information 2936 may include the global envelope (e.g., H(f)). Additionally or alternatively, the envelope information 2936 may include extended peak information (e.g., harmonic frequencies $f_k$, missing partial amplitudes $A_k$ and/or missing partial minimum phases $\phi_k^m$). For instance, the envelope information 2936 may include H(f), $f_k$, $A_k$ and/or $\phi_k^m$.

In some configurations, the electronic device 2914 may generate a time-domain speech signal based on the envelope information 2936 (e.g., the global envelope). Additionally or alternatively, the electronic device 2914 may transmit one or more of the formant peak models (e.g., one or more parameters representing the formant peak model(s)). In some configurations, the formant peak model(s) (and/or parameters based on the formant peak model(s)) may be quantized. For example, vector quantization and/or one or more codebooks may be utilized to perform the quantization.

Figure 30:
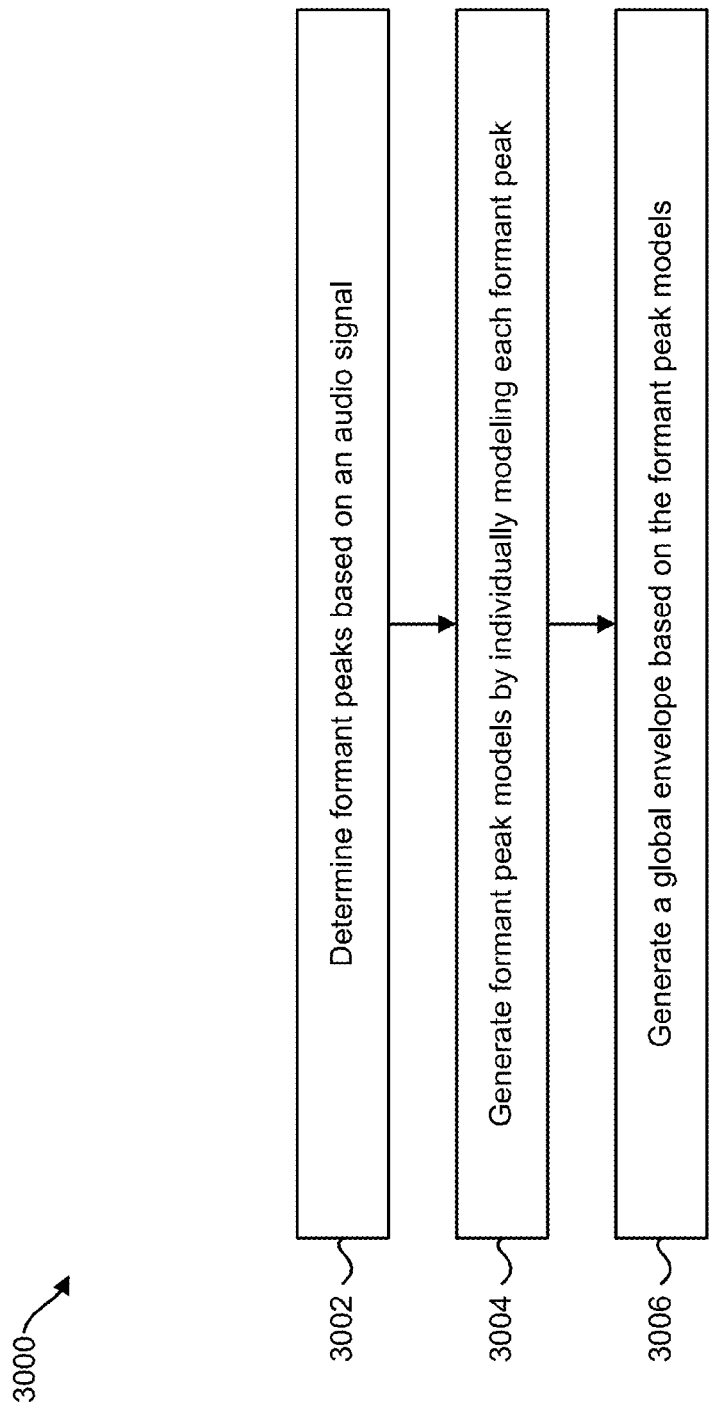
FIG. 30 is a flow diagram illustrating one example of a method for enhancing an audio signal.

FIG. 30 is a flow diagram illustrating one example of a method 3000 for enhancing an audio signal 2916. An electronic device 2914 may determine 3002 formant peaks 2941 based on an audio signal 2916. This may be accomplished as described above in connection with FIG. 29. For example, the electronic device 2914 may select a number of the largest peaks (e.g., peaks with the highest amplitudes) from a set of peaks (e.g., refined peaks).

The electronic device 2914 may generate 3004 formant peak models by individually modeling each formant peak. This may be accomplished as described above in connection with FIG. 29. For example, the electronic device 2914 may determine whether each formant peak is supported and may select a modeling type based on whether each respective formant peak is supported.

The electronic device 2914 may generate 3006 a global envelope based on the formant peak models. This may be accomplished as described above in connection with FIG. 29. For example, the electronic device 2914 may merge (e.g., concatenate, perform a max operation on, etc.) the formant peak models. In some configurations, the electronic device 2914 may perform one or more additional operations (e.g., DAP modeling, filtering, smoothing, etc.) on the merged envelope. In some configurations, the electronic device 2914 may not merge formant peak models (e.g., envelopes) in the case where only one formant peak is detected.

As described above, the electronic device 2914 may generate a time-domain speech signal based on the envelope information 2936 (e.g., the global envelope) in some configurations. Additionally or alternatively, the electronic device 2914 may transmit one or more of the formant peak models (e.g., one or more parameters representing the formant peak model(s)).

Figure 31:
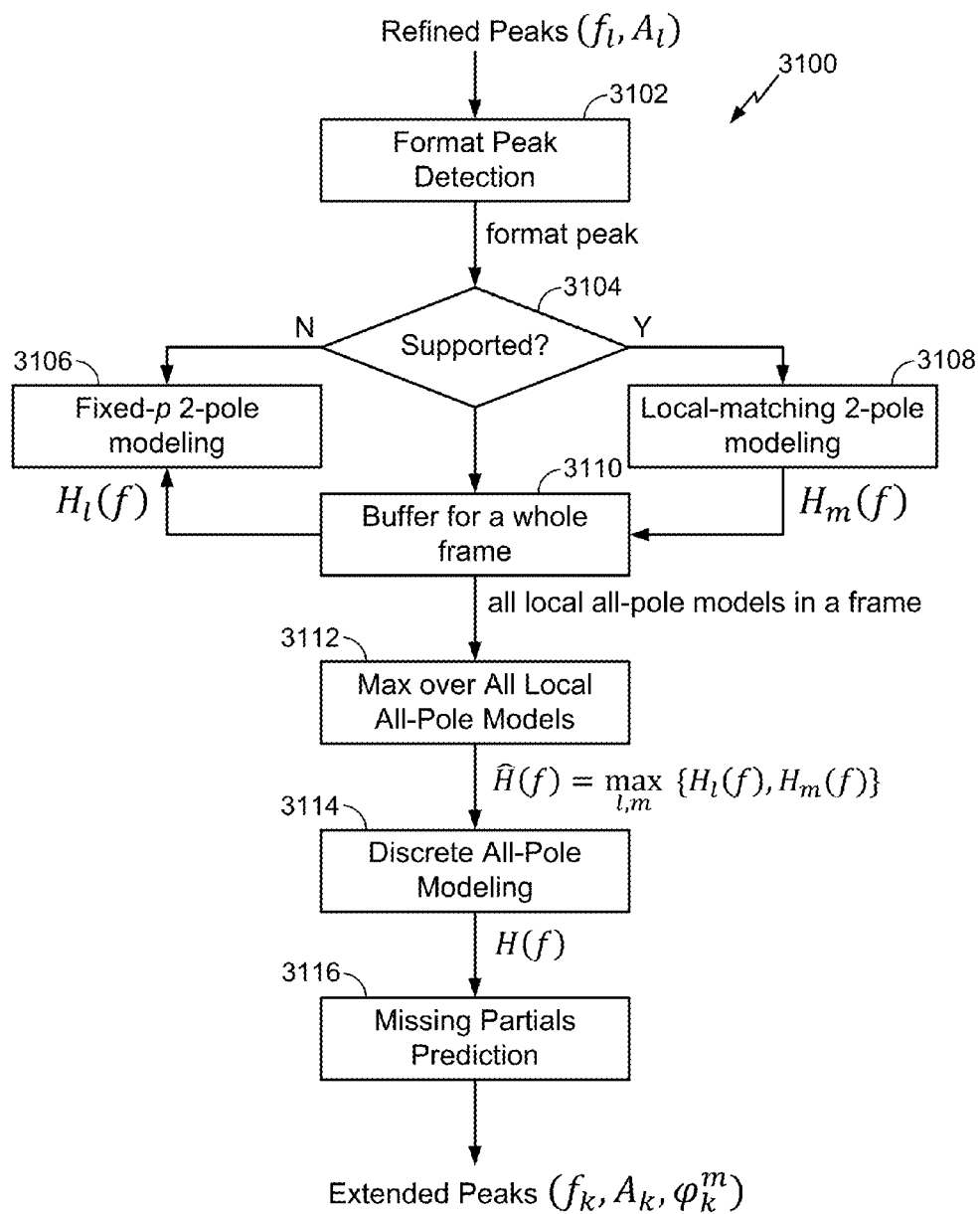
FIG. 31 is a flow diagram illustrating a more specific configuration of a method for enhancing an audio signal.

FIG. 31 is a flow diagram illustrating a more specific configuration of a method 3100 for enhancing an audio signal. For example, FIG. 31 illustrates an example of an approach for dominant local all-pole modeling of an envelope from incomplete spectrum. For example, FIG. 31 illustrates an example of local all-pole modeling or envelope modeling by dominant peaks.

The electronic device 2914 may perform 3102 formant peak detection. This may be accomplished as described in connection with one or more of FIGS. 29-30. For example, formant peaks may be the largest three to four local maxima of refined peaks (e.g., $\{f_l\}$). These may be significant and stable voiced features.

The electronic device 2914 may determine 3104 whether each formant peak is isolated (e.g., unsupported) or supported. Isolated formant peaks (e.g., $(f_l, A_l)$) may have at least one missing peak at neighboring harmonic positions (of $f_l$, for example). In this case, the electronic device 2914 may apply 3106 a fixed-p 2-pole modeling with a preset pole strength (e.g., 20 dB/200 Hz, p=0.9843). For example, fixed-p 2-pole modeling may provide $$H_l(f) = \frac{A_l(1-p)|1 - pe^{-j2f_l}|}{(1 - pe^{-j(f-f_l)})(1 - pe^{-j(f+f_l)})}.$$

Additionally or alternatively, the electronic device 2914 may utilize a local 1-pole filter with preset pole strength (20 dB/200 Hz, p=0.9843). For example, $$H_l(f) = \frac{A_l(1-p_l)}{(1 - p_l e^{-j(f-f_l)})}$$

for isolated formant peaks $(A_l, f_l)$.

Supported formant peaks (e.g., $(f_{l\pm1,0}, A_{l\pm1,0})$) may include both peaks at neighboring harmonic positions of a present $f_l$. In this case, the electronic device 2914 may apply 3108 local matching 2-pole modeling to match three consecutive peaks by solving $(F_m, p_m, \alpha_m)$ as provided by $$H_m(f) = \frac{\alpha_m(1-p_m)|1 - p_m e^{-j2F_m}|}{(1 - p_m e^{-j(f-F_m)})(1 - p_m e^{-j(f+F_m)})}.$$

Additionally or alternatively, the electronic device 2914 may utilize a 1-pole filter to match three consecutive peaks (solved by a closed form approximation formula, for example).

The electronic device 2914 may buffer 3110 each formant peak model for all formant peaks in a frame, whether supported or isolated (e.g., unsupported). For the set of formant peak models, the electronic device 2914 may determine 3112 a max envelope based on the corresponding all-pole models. For example, at each frequency, the strongest local all-pole model is used in accordance with a max operation or a $L^p$-norm operation. This may maintain consistency in the formant regions. For instance, the max envelope may be provided in accordance with $\hat{H}(f) = \max_{l,m} \{H_l(f), H_m(f)\}$.

The electronic device 2914 may perform 3114 global all-pole modeling based on the max envelope. For example, the electronic device 2914 may perform 3114 discrete all-pole (DAP) modeling. For instance, the electronic device 2914 may determine an all-pole filter H(f) that minimizes the Itakura-Saito distance $(D_{I-S}(x, y))$ with the max envelope $\hat{H}(f)$ across all harmonic frequencies $f_k$ (e.g., between the spectral response and the merged envelope). This may be provided by $$H(f) = \arg\min_{H(f)} \sum_k D_{I-S}(H(f_k), \hat{H}(f_k)).$$

The electronic device 2914 may perform 3116 missing partials prediction. For example, the electronic device 2914 may determine a missing partial at $f_k = kf_0$ with amplitude $A_k = |H(f_k)|$ and minimum phase $\phi_k^m = \arg H(f_k)$. In other words, the electronic device 2914 may determine extended peaks (e.g., harmonic frequencies $f_k$, missing partial amplitudes $A_k$ and/or missing partial minimum phases $\phi_k^m$). In some configurations, the electronic device 2914 may utilize linear predictive coding (LPC) coefficients $(\alpha_m)$ for a smooth spectral envelope and minimal phase $(\phi^m)$.

Figure 32:
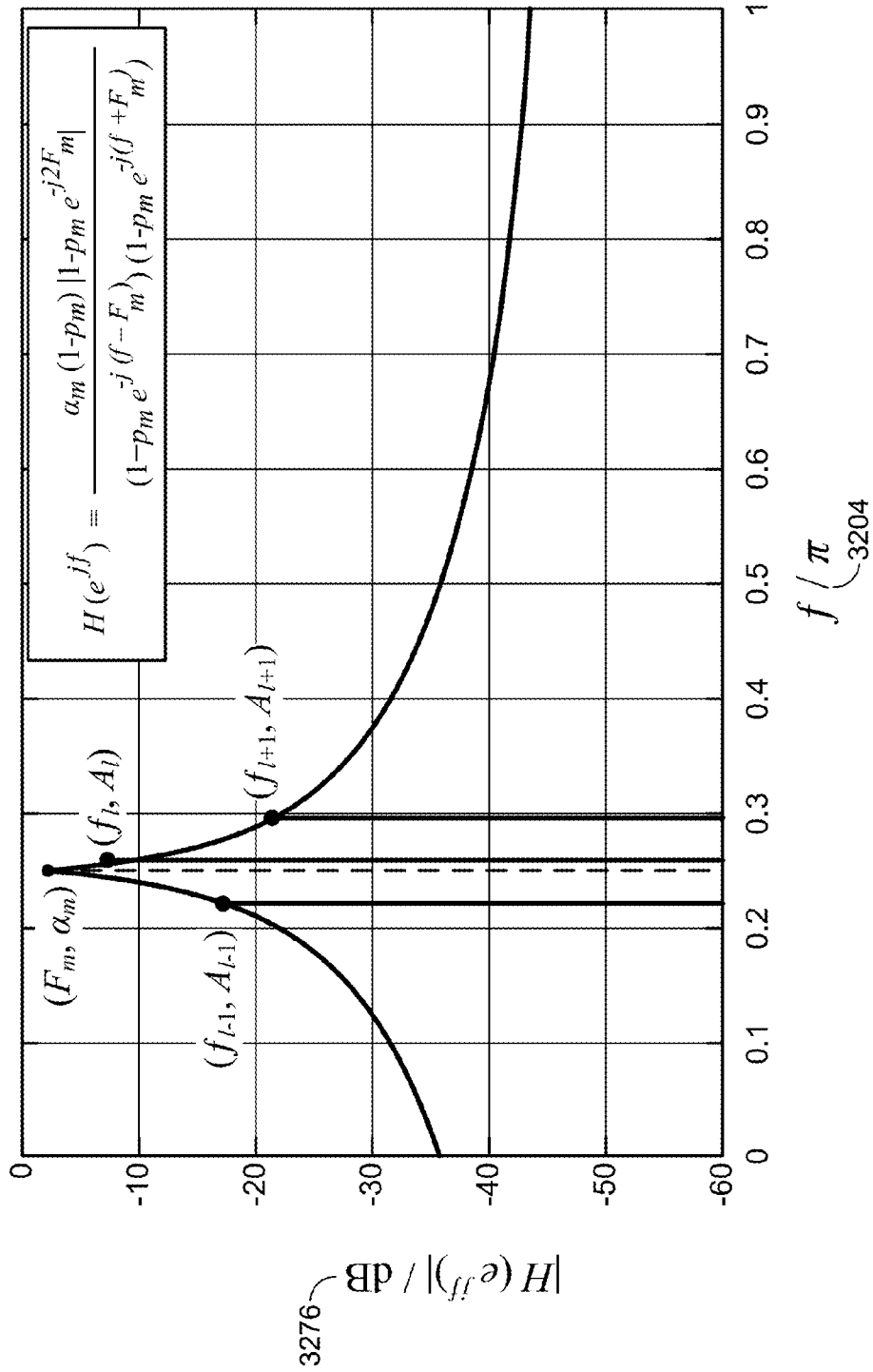
FIG. 32 includes a graph that illustrates one example of all-pole modeling in accordance with the systems and methods disclosed herein.

FIG. 32 includes a graph that illustrates one example of all-pole modeling in accordance with the systems and methods disclosed herein. The graph is illustrated in amplitude (dB) 3276 over frequency (radians) 3204. For instance, FIG. 32 illustrates one example of 2-pole modeling for a supported formant peak as described in connection with FIG. 31.

Figure 33:
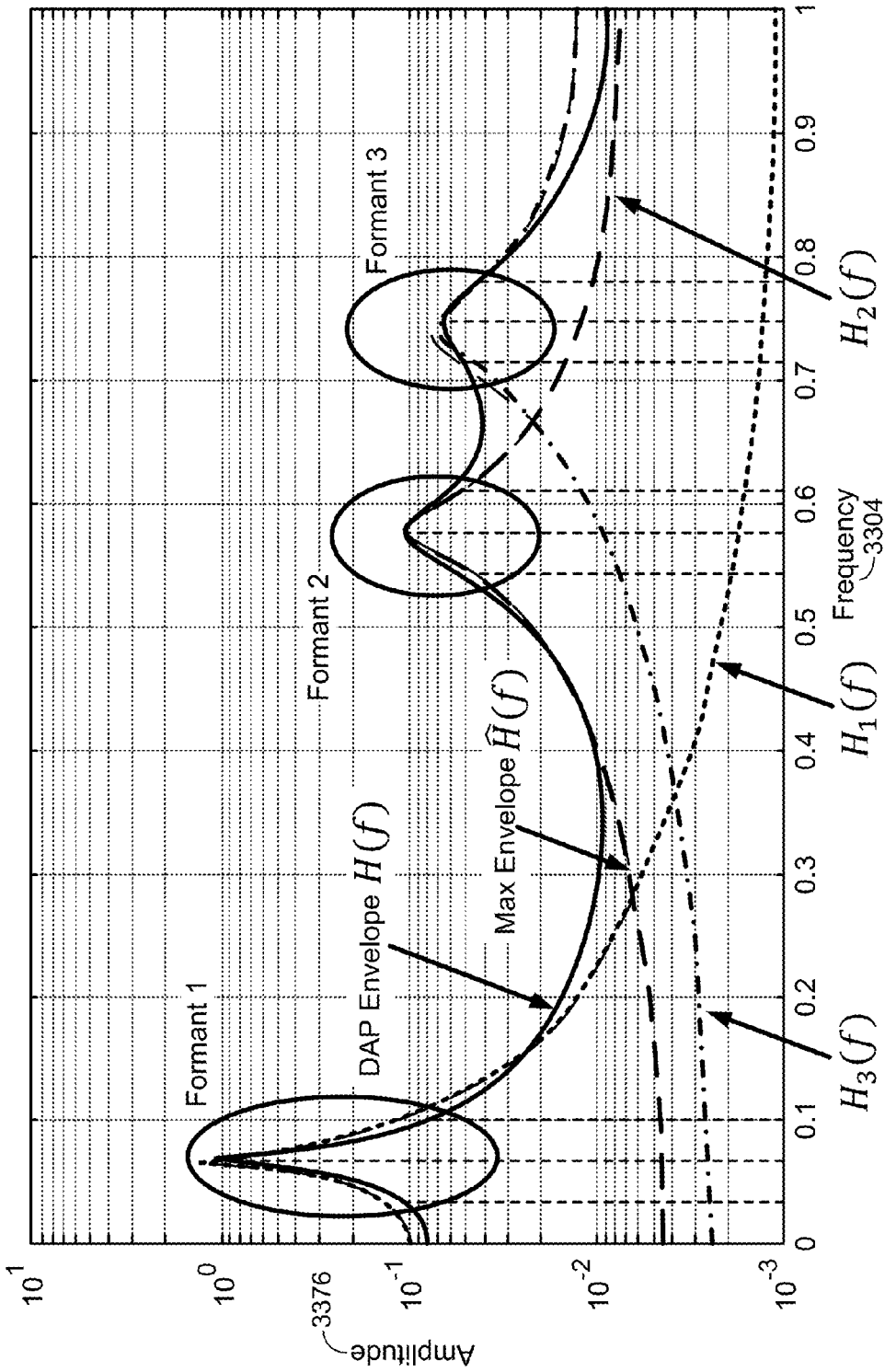
FIG. 33 includes a graph that illustrates one example of all-pole modeling with a max envelope in accordance with the systems and methods disclosed herein.

FIG. 33 includes a graph that illustrates one example of all-pole modeling with a max envelope in accordance with the systems and methods disclosed herein. The graph is illustrated in amplitude 3376 over frequency 3304. For instance, FIG. 33 illustrates one example a max envelope for three formants as described in connection with FIG. 31. For example, $H_3(f)$ may be one example of a local model for formant 3, $H_1(f)$ may be one example of a local model for formant 1 and $H_2(f)$ may be one example of a local model for formant 2.

Figure 34:
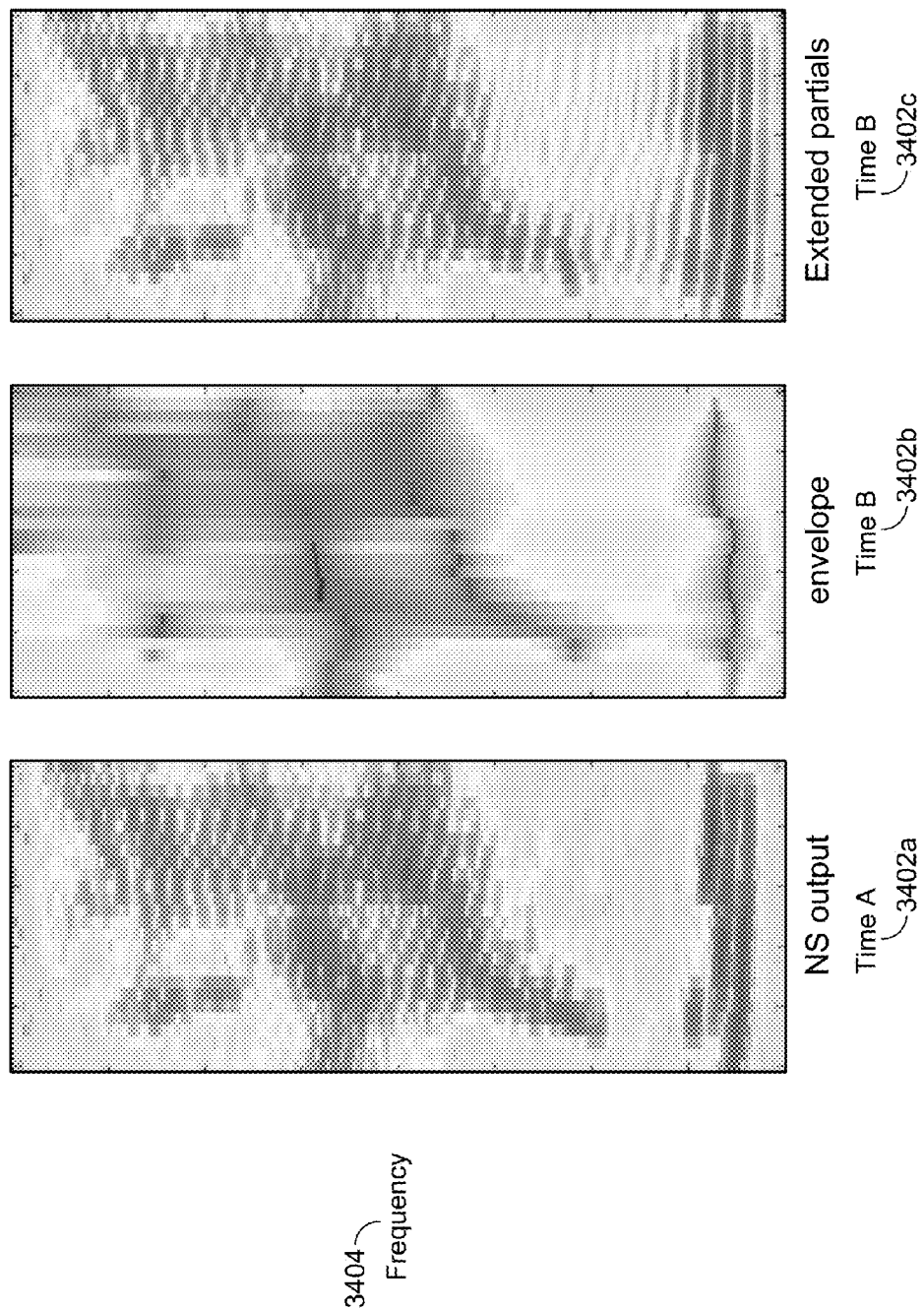
FIG. 34 includes graphs that illustrate one example of extended partials in accordance with the systems and methods disclosed herein.

FIG. 34 includes graphs that illustrate one example of extended partials in accordance with the systems and methods disclosed herein. The graphs are illustrated in frequency 3404 over time A 3402a, time B 3402b and time C 3402c. For instance, FIG. 34 illustrates one example of a noise suppression output, its corresponding envelope and resulting extended partials as described in connection with FIG. 31.

FIGS. 35-44 provide additional detail regarding envelope modeling (e.g., examples of processing flow of envelope modeling). For instance, one or more of the procedures described in FIGS. 35-44 may be performed by one or more of the envelope modeling modules described above and/or may be examples of, may be performed in conjunction with and/or may be performed instead of the envelope modeling functions described above. In some configurations, one or more of the procedures described in connection with FIGS. 35-44 may be combined with one or more of the other functions described above (e.g., noise suppression, isolated peak suppression, harmonic analysis and/or phase synthesis). Alternatively, one or more of the procedures described in connection with FIGS. 35-44 may be performed independently from the other functions, procedures and/or modules described above.

Figure 35:
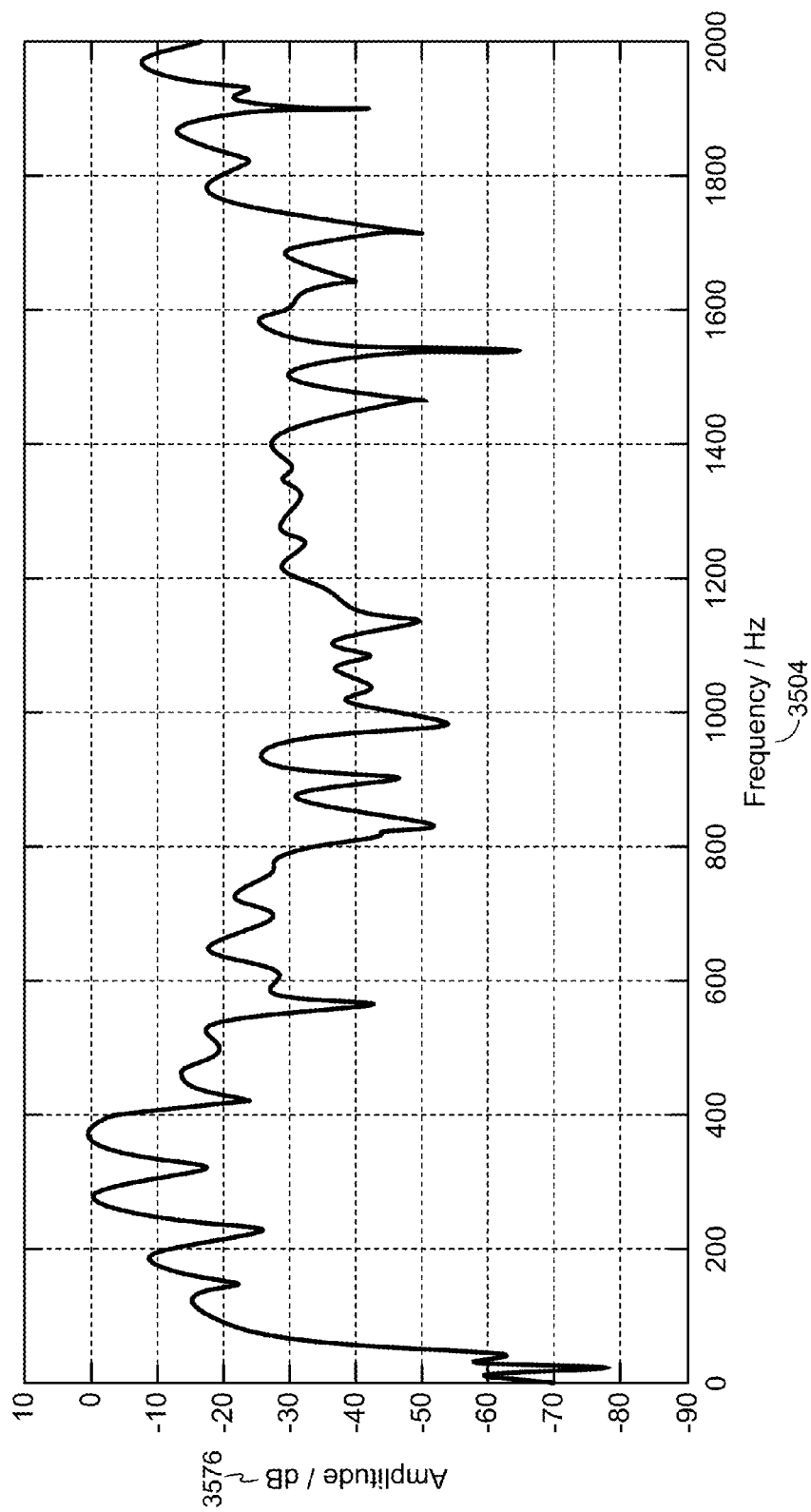
FIG. 35 is a graph illustrating one example of a spectrum of a speech signal (e.g., recorded speech signal) corrupted by noise.

FIG. 35 is a graph illustrating one example of a spectrum of a speech signal (e.g., recorded speech signal) corrupted by noise. The graph in FIG. 35 is illustrated in amplitude (dB) 3576 over a frequency spectrum (Hz) 3504.

Figure 36:
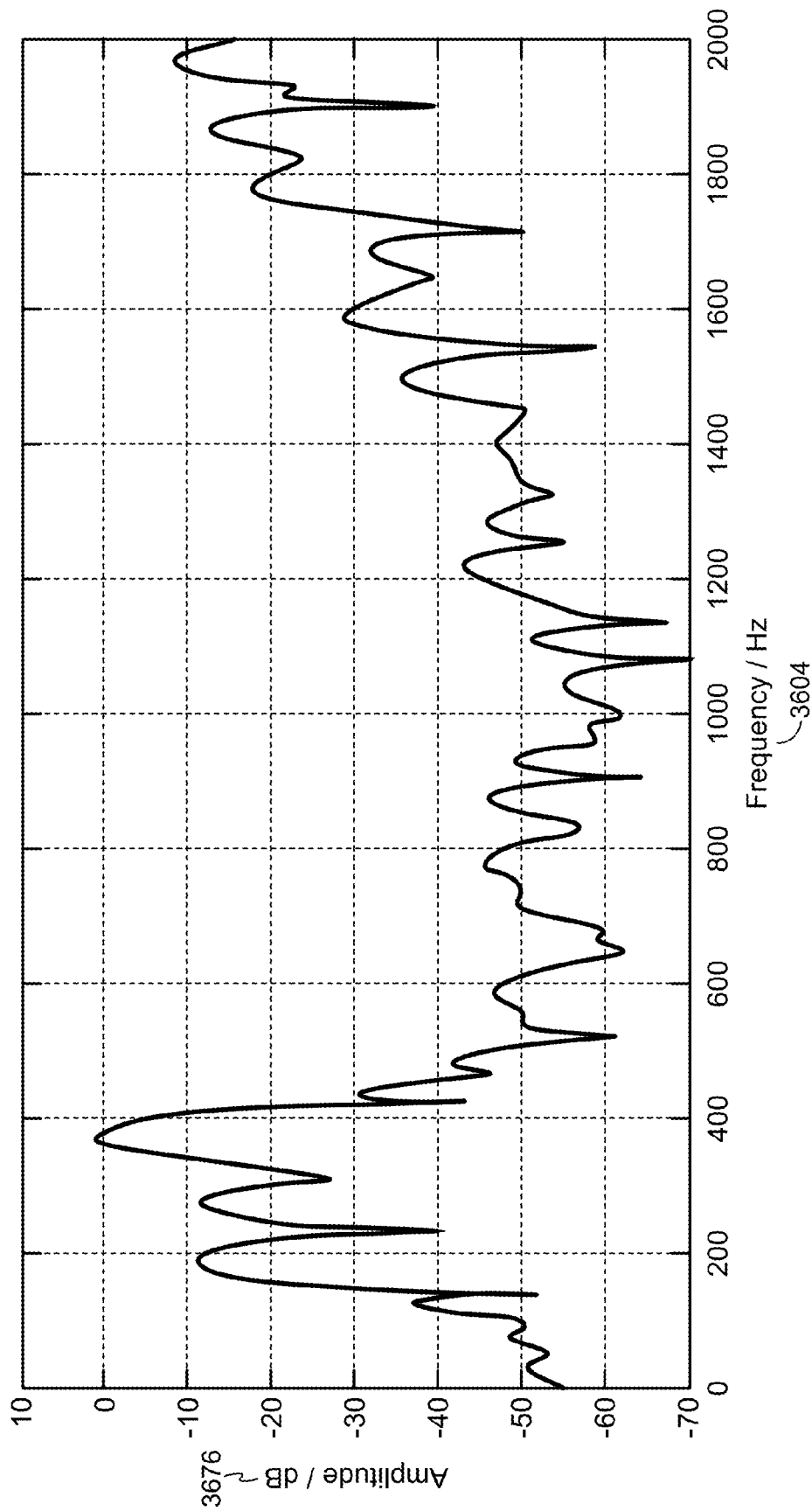
FIG. 36 is a graph illustrating one example of a spectrum of a speech signal (e.g., recorded speech signal) corrupted by noise after noise suppression.

FIG. 36 is a graph illustrating one example of a spectrum of a speech signal (e.g., recorded speech signal) corrupted by noise after noise suppression. The graph in FIG. 36 is illustrated in amplitude (dB) 3676 over a frequency spectrum (Hz) 3604. As illustrated in FIG. 36, when a speech signal (e.g., a recorded speech signal) is too noisy after noise suppression, a weak part of a spectrum may be completely or almost completely gone. For instance, the band from 400 Hz to 1400 Hz is significantly attenuated. Restoring the missing spectral components in this band may improve speech quality and intelligibility.

Figure 37:
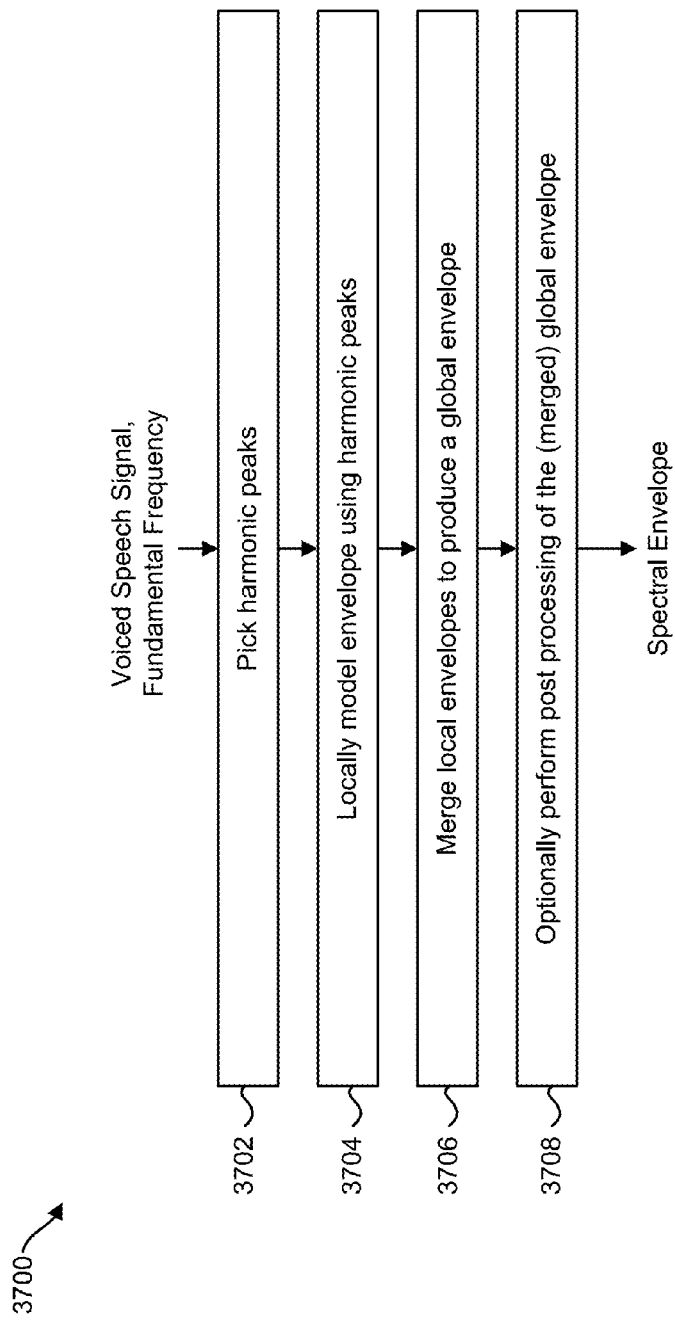
FIG. 37 is a flow diagram illustrating an example of a method for envelope modeling.

FIG. 37 is a flow diagram illustrating an example of a method 3700 for envelope modeling. For example, the method 3700 may be an approach for modeling an envelope as described above. The method 3700 may take an input of a voiced speech signal (e.g., audio signal 2916) and the corresponding fundamental frequencies. In some configurations, the voiced speech signal does not include significant noisy and inharmonic peaks in the frequency domain. For example, the voiced speech signal may be a noisy speech recording after noise suppression, isolated peak suppression, non-harmonic peak suppression/removing and/or other cleanup preprocessing. But such a voiced speech signal may lack substantial spectral components in some bands compared to clean speech. An example of such a voiced speech signal is given in FIG. 36.

An electronic device 2914 may pick 3702 harmonic peaks. For example, a clean voiced speech signal has spectral peaks evenly spaced by the fundamental frequency. Frequencies of the spectral peaks may be referred to as harmonic frequencies and the corresponding spectral peaks may be referred to as harmonic peaks.

The electronic device 2914 may locally model 3704 envelope(s) (e.g., individually model formant peaks) using harmonic peaks. The electronic device 2914 may merge 3706 local envelopes to produce a global envelope. The electronic device 2914 may optionally perform 3708 post processing of the (merged) global envelope. This may produce a spectral envelope. One or more of these procedures may be accomplished as described above in connection with one or more of FIGS. 29-31.

Figure 38:
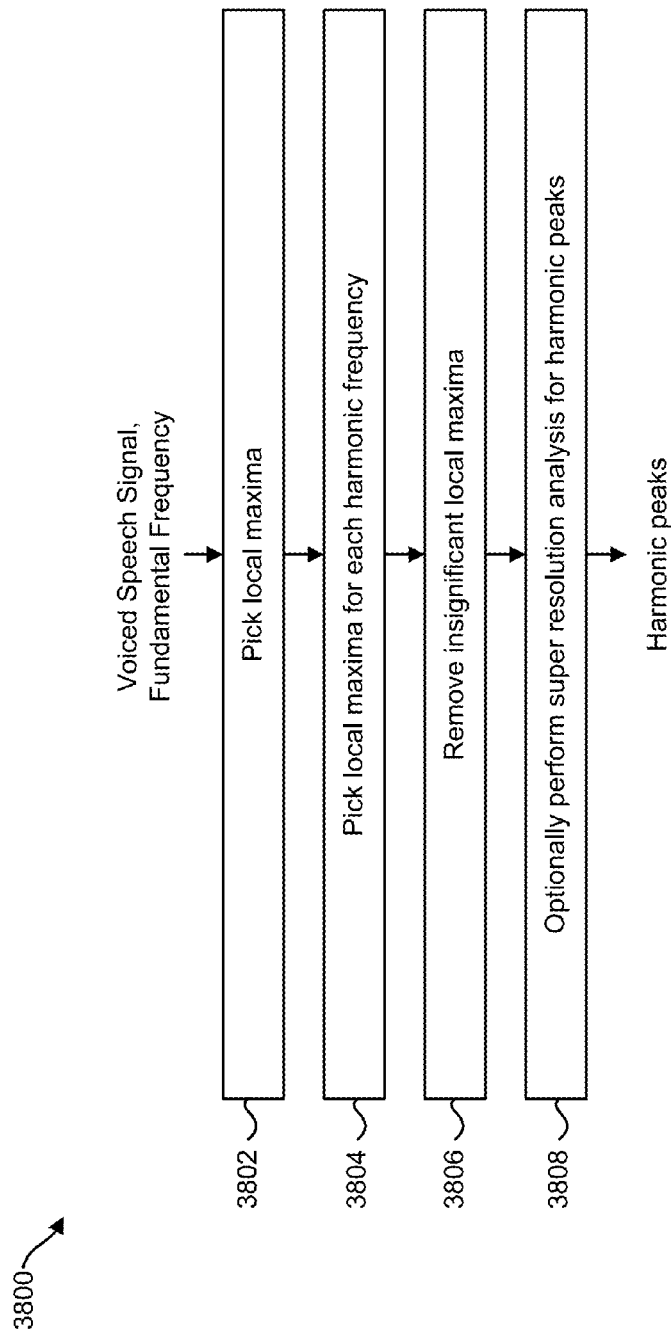
FIG. 38 is a flow diagram illustrating one configuration of a method for picking harmonic peaks.
Figure 39:
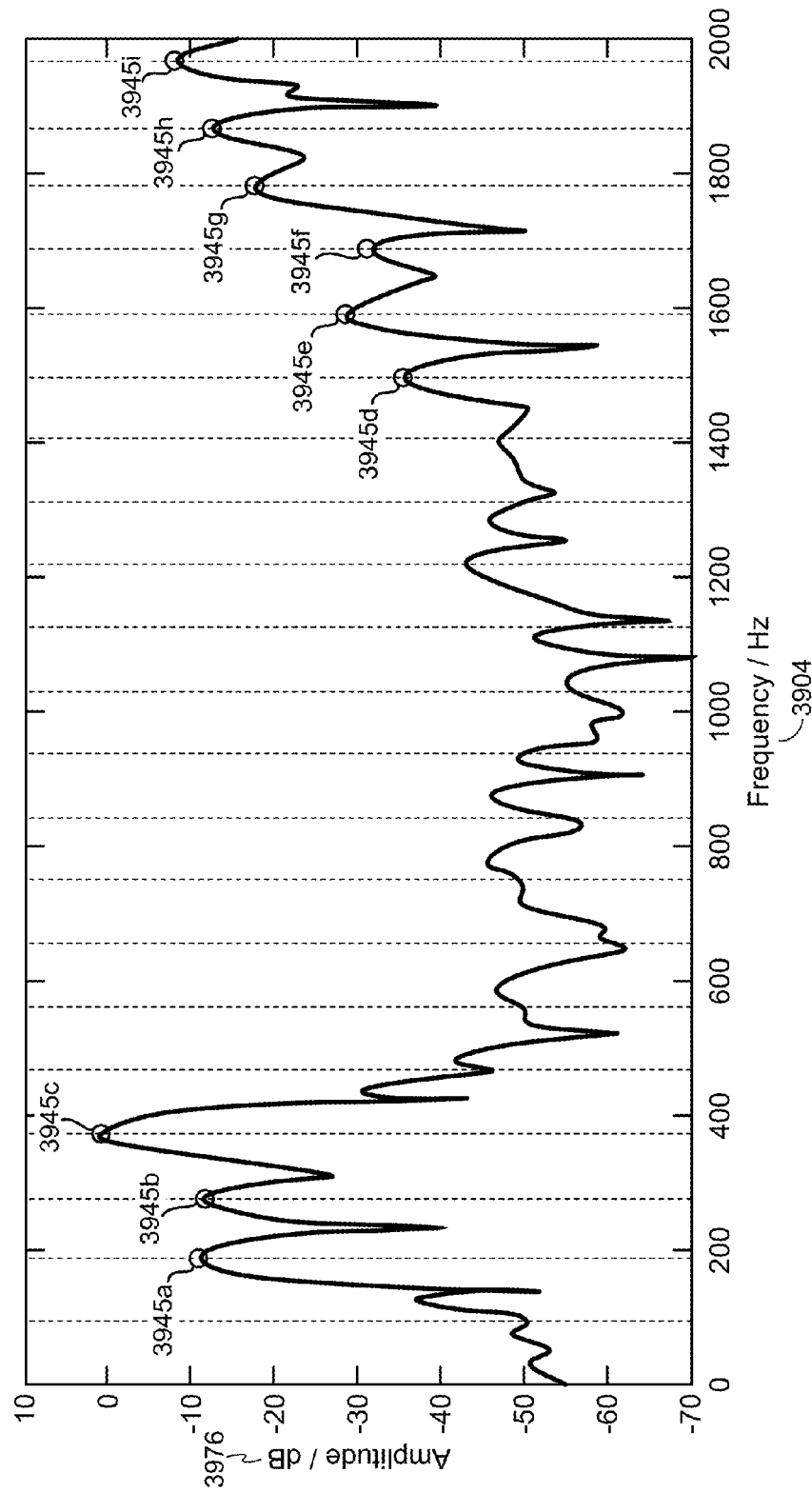
FIG. 39 illustrates an example of picked harmonic peaks over harmonic frequencies.

FIG. 38 is a flow diagram illustrating one configuration of a method 3800 for picking harmonic peaks. In particular, FIG. 38 illustrates one approach for picking harmonic peaks as described in connection with FIG. 37. To pick harmonic peaks, for example, the electronic device 2914 may first pick 3802 local maxima (e.g., frequency bins larger than their immediate neighboring left and right bins). Then for each harmonic frequency, the electronic device 2914 may pick 3804 the local maxima closest or strongest to this harmonic frequency within a search range of consecutive frequency bins including the harmonic frequency. For some harmonic frequencies, there may be no harmonic peaks due to no local maxima within the search range. Also, even a harmonic peak exists, if it is too low (e.g., lower than human's hearing threshold), it may be removed 3806 from the harmonic peak sets. This is shown in FIG. 39. Out of 21 harmonic frequencies from 0 Hz to 2000 Hz, only 9 harmonic peaks are picked. In particular, FIG. 39 illustrates an example of picked harmonic peaks 3945a-i over harmonic frequencies (indicated by dashed vertical lines).

The electronic device 2914 may optionally perform 3808 super resolution analysis for harmonic peaks. For example, it is also possible to improve frequency precision of the harmonic peaks beyond frequency bin resolution (super resolution) by doing interpolation around the harmonic peaks (e.g., using quadratic interpolation). The method 3800 described in connection with FIG. 38 may provide harmonic peaks (e.g., picked or selected harmonic peaks).

FIG. 39 is a graph illustrating one example of a spectrum of a speech signal with picked harmonic peaks 3945a-i. The graph in FIG. 39 is illustrated in amplitude (dB) 3976 over a frequency spectrum (Hz) 3904. Harmonic peaks may be picked or selected as described in connection with FIG. 38. In this example, only 9 harmonic peaks are picked out of 21 harmonic frequencies from 0 Hz to 2000 Hz. In particular, FIG. 39 illustrates an example of picked harmonic peaks 3945a-i over harmonic frequencies (indicated by dashed vertical lines).

Figure 40:
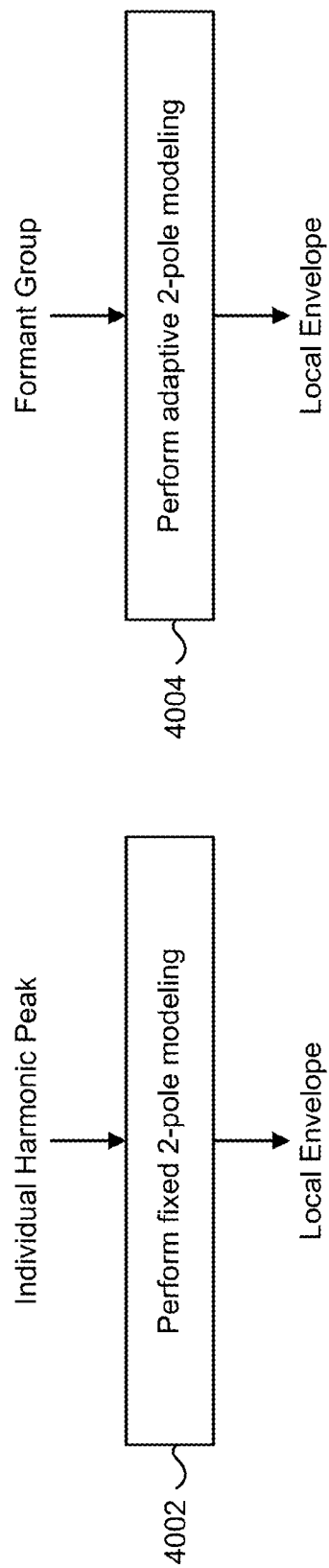
FIG. 40 illustrates examples of peak modeling.

FIG. 40 illustrates examples of peak modeling. In particular, FIG. 40 illustrates locally modeling envelope(s) using harmonic peaks as described in connection with FIG. 37. In particular, FIG. 40 depicts performing 4002 fixed 2-pole modeling based on an individual (e.g., unsupported) harmonic peak to produce a local envelope. FIG. 40 also depicts performing 4004 adaptive 2-pole modeling based on a formant group to produce a local envelope. For example, the electronic device 2914 may perform 4002 fixed 2-pole modeling and/or may perform 4004 adaptive 2-pole modeling.

The harmonic peaks of a clean voiced speech signal usually have different magnitudes, mainly due to vocal tract resonance. The resonance frequencies of the vocal tract are called formant frequencies and spectral contents near the formant frequencies are called formants and may be approximated by an all-pole filter's frequency response.

In order to obtain a global envelope that approximately matches all the harmonic peaks, the electronic device 2914 may begin by performing local matching (e.g., matching individual harmonic peaks or groups of consecutive harmonic peaks, called formant groups hereafter). The locally matched envelopes are called local envelopes (e.g., formant peak models) hereafter. If a harmonic peak is not supported (e.g., if there is no immediate left and/or right neighboring harmonic peaks), this harmonic peak is called an unsupported formant peak. If a harmonic peak is supported (e.g., there are immediate left and right neighboring harmonic peaks), this harmonic peak is called a supported harmonic peak. Within a formant group, the largest supported harmonic peak is called a supported formant peak. It should be noted that, even if harmonic peaks are supported, they may still be viewed as individual harmonic peaks. For example, the electronic device 2914 may model local envelopes for each of the individual harmonic peaks in some configurations, generally, for the benefit of lower system complexity at the cost of higher envelope modeling error.

Figure 41:
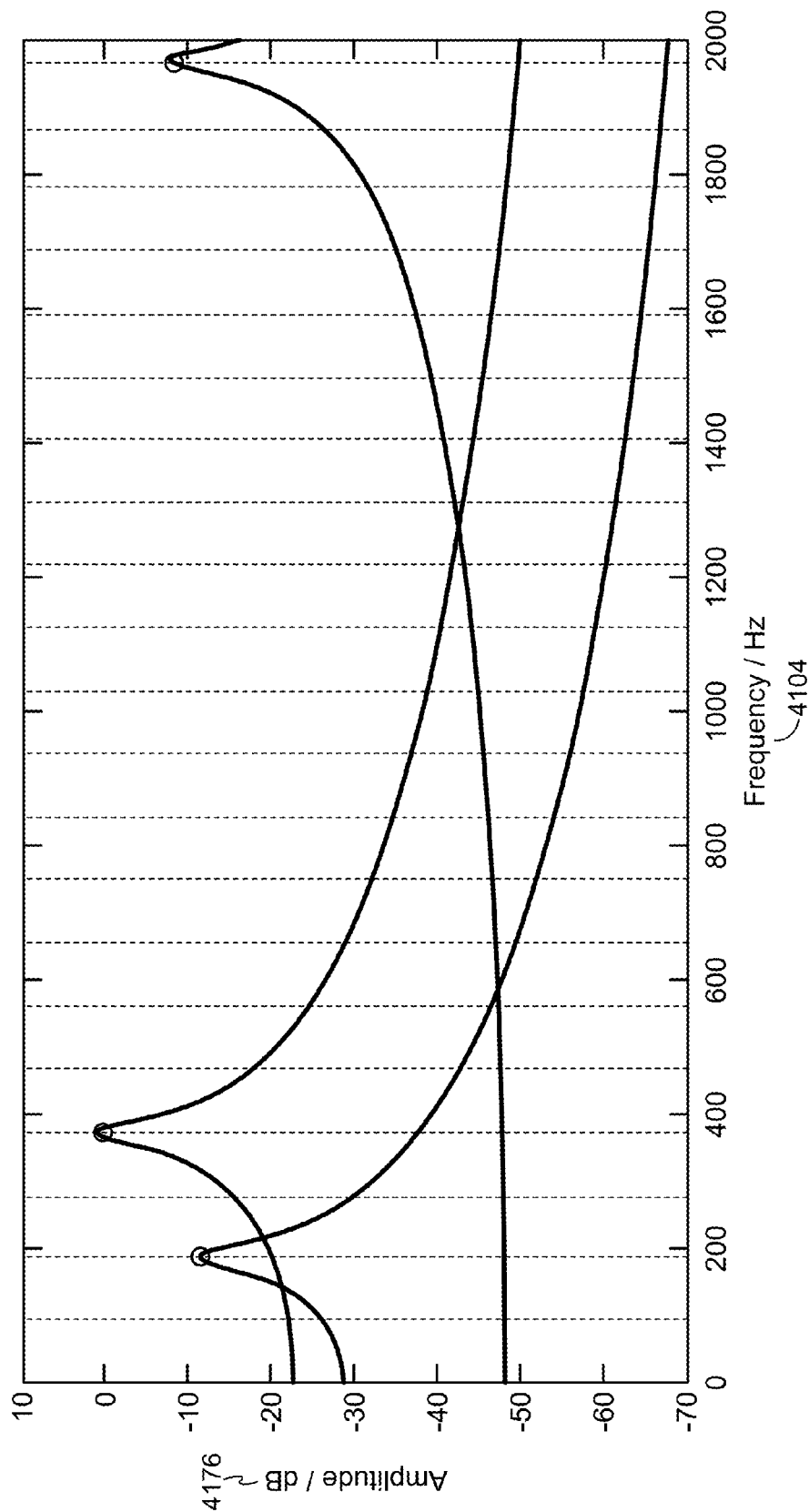
FIG. 41 is a graph illustrating an example of assignment of local envelopes for individual harmonic peaks.

In the case of individual harmonic peaks, one approach to assign a local envelope is to use an all-pole filter frequency response. In some configurations, this all-pole filter can have only 2 poles, which, as complex numbers, conjugate to each other. For the pole with a positive imaginary part, its angle may be set equal to the angular frequency of the interested harmonic peak by the electronic device 2914. Pole strength (e.g., a pole's absolute value) may be set (by the electronic device 2914) to some predetermined number (e.g., 0.98) corresponding to a reasonable formant shape observed in clean speech signals. This 2-pole filter's gain may be set (by the electronic device 2914) to the harmonic peak's amplitude. FIG. 41 provides an illustration of local envelopes modeled by filters, where a filter gain may be set to the harmonic peak amplitude. It should be noted that there are other ways to assign an envelope, as long as they resemble speech formant shapes. Additionally, not all harmonic peaks may be assigned a local envelope (e.g., very low harmonic peaks).

FIG. 41 is a graph illustrating an example of assignment of local envelopes for individual harmonic peaks. The graph in FIG. 41 is illustrated in amplitude (dB) 4176 over a frequency spectrum (Hz) 4104. The local envelopes (e.g., formant peak models) illustrated in FIG. 41 correspond to the peaks described in connection with FIG. 39. For example, the second, fourth and twenty-first harmonic peaks illustrated in FIG. 39 and the corresponding assigned local envelopes are shown in FIG. 41.

In the case of formant groups (e.g., supported peaks), the electronic device 2914 may also assign a single local envelope to a formant group. For example, the electronic device 2914 may assign a single local envelope to the group of consecutive harmonic peaks formed by the sixteenth, seventeenth and eighteenth peaks from FIG. 39 as described in connection with FIG. 42. A single local envelope can be assigned to match all the three harmonic peaks, instead of assigning three local envelopes matching the harmonic peaks individually. To assign the single local envelope, for example, the electronic device 2914 may also use an all-pole filter's frequency response. Specifically, this all-pole filter may still have 2 poles, conjugate to each other. In this case, however, the pole's angle and strength, as well as the filter's gain may be set (by the electronic device 2914) in such a way that this filter's frequency response matches all the three harmonic peaks. For example, the electronic device 2914 may solve a set of equations governing the frequency response at the three harmonic frequencies. This can also be achieved by a technique called discrete all-pole modeling.

Figure 42:
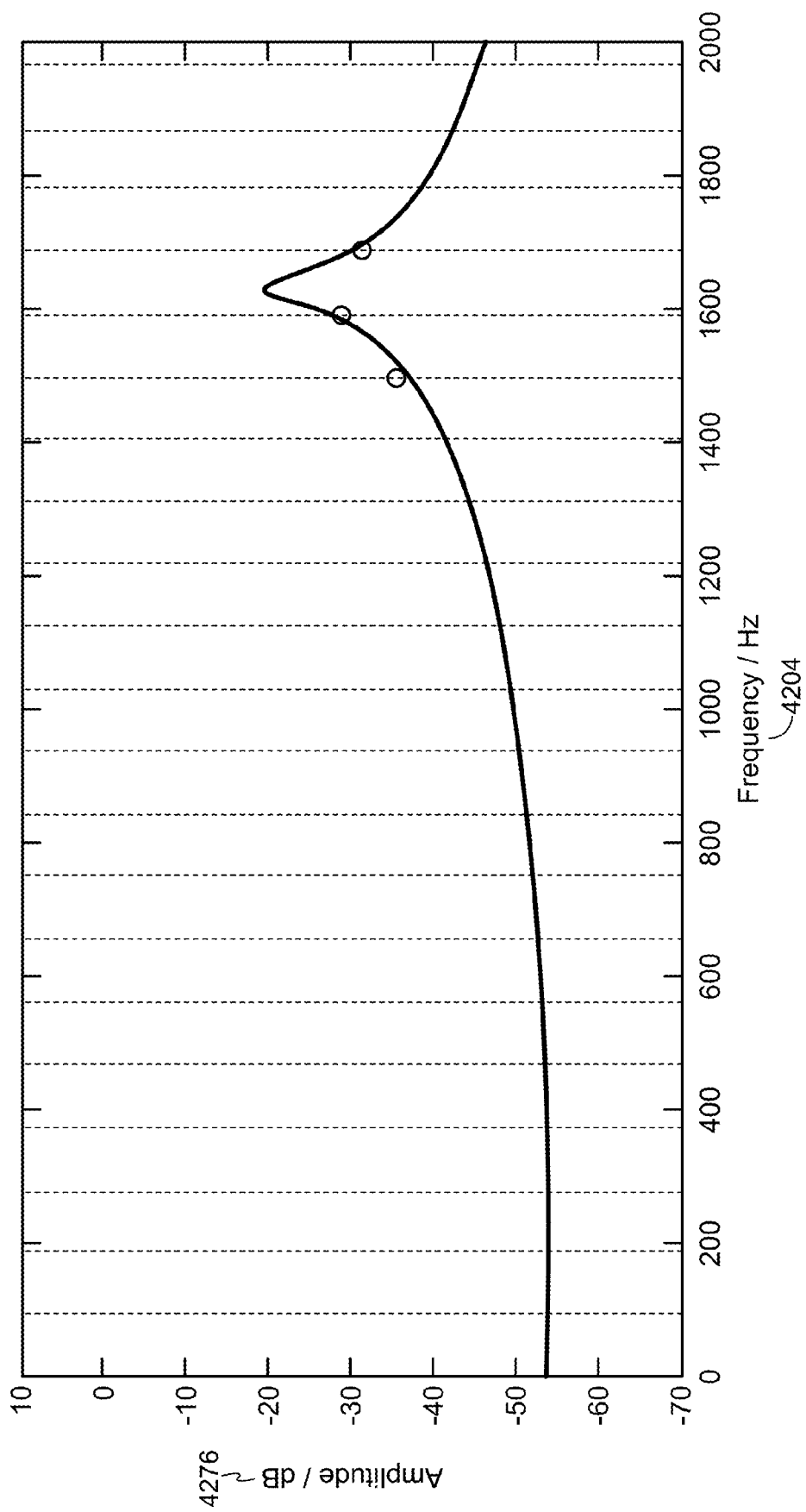
FIG. 42 is a graph illustrating an example of assignment of a single local envelope for a group of harmonic peaks or a formant group.

FIG. 42 is a graph illustrating an example of assignment of a single local envelope for a group of harmonic peaks or a formant group. The graph in FIG. 42 is illustrated in amplitude (dB) 4276 over a frequency spectrum (Hz) 4204. In this example, the formant group composed of the sixteenth, seventeenth and eighteenth peaks from FIG. 39 is assigned a single 2-pole filter's response as the local envelope.

Figure 43:
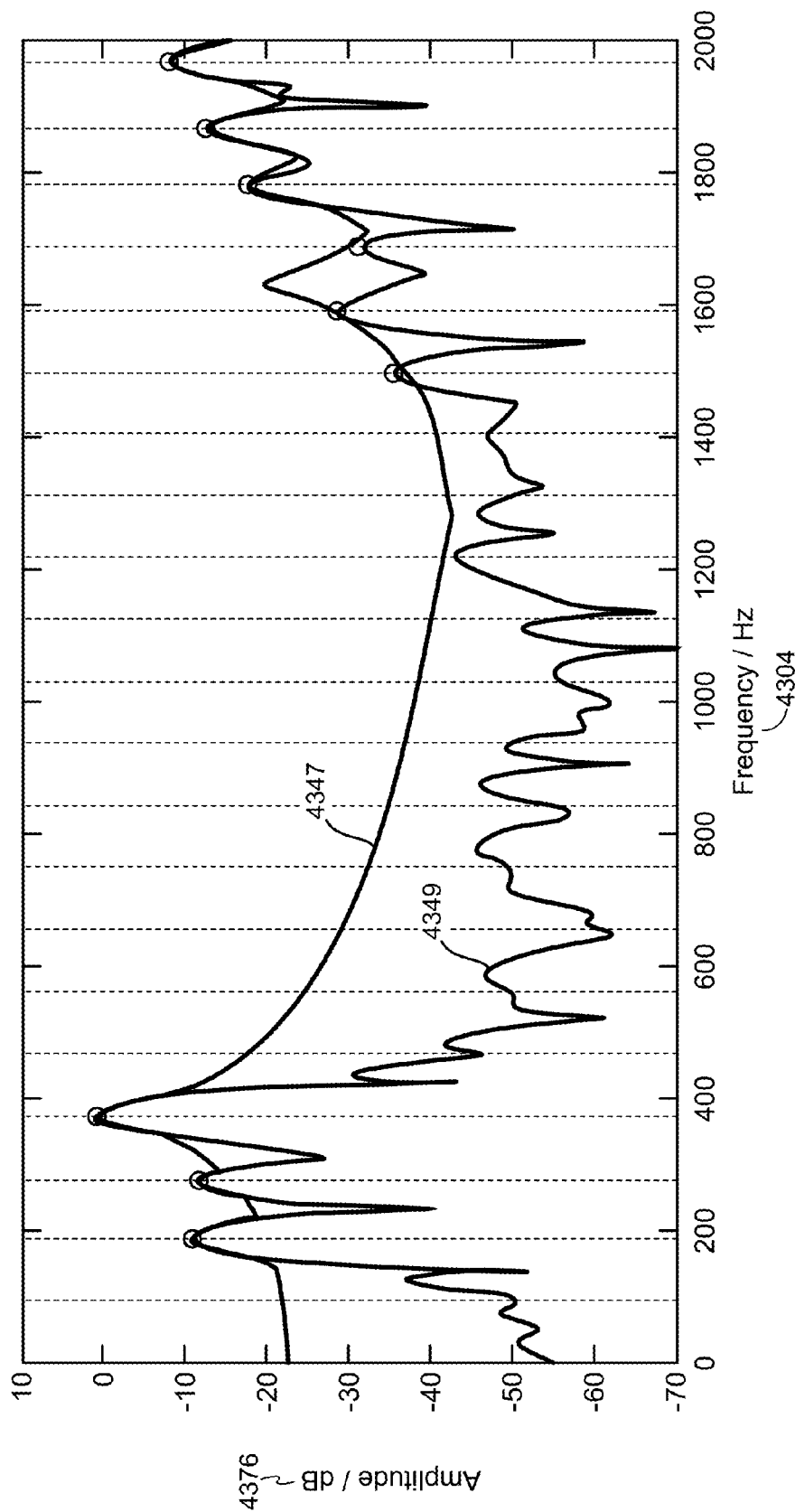
FIG. 43 is a graph illustrating an example of a global envelope.

The electronic device 2914 may merge local envelopes to produce a global envelope. Local envelopes may be based on individual harmonic peaks, based on formant groups or based on a combination of the two cases. In some configurations, the electronic device 2914 may form a global envelope without disrupting local matching (e.g., the local envelope modeling described above). For example, the electronic device 2914 may use the max operation (e.g., at each frequency bin, the global envelope is the max value of all the local envelopes at the same frequency bin). FIG. 43 provides one example of the max value of all the local envelopes (including those depicted in FIGS. 41-42, for example). It should be noted that the electronic device 2914 may utilize other approaches to merge the local envelopes. For example, the electronic device 2914 may obtain a Euclidean norm of the local envelopes at each frequency bin (e.g., a max operation corresponding to the infinite norm).

FIG. 43 is a graph illustrating an example of a global envelope. The graph in FIG. 43 is illustrated in amplitude (dB) 4376 over a frequency spectrum (Hz) 4304. In particular, FIG. 43 illustrates the global envelope 4347 over the speech spectrum 4349. From 400 Hz to 1400 Hz, the global envelope is significantly higher than the speech spectrum (up to approximately 30 dB, for example).

Figure 44:
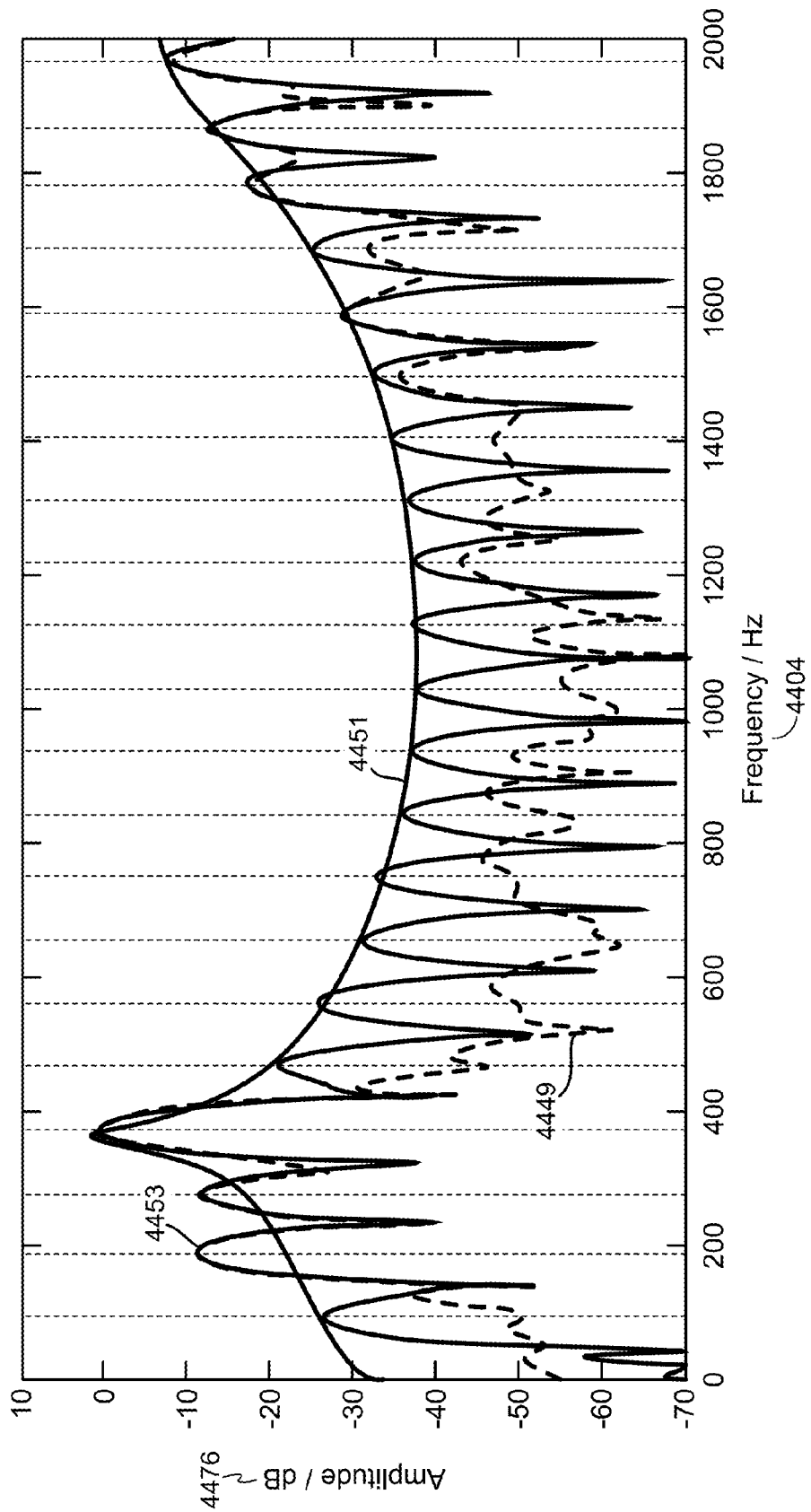
FIG. 44 is a graph illustrating an example of missing partial restoration.

The electronic device 2914 may optionally perform post-processing of the merged global envelope. The merged envelope may be continuous but not necessarily smooth, as illustrated in FIG. 43. In some configurations, the electronic device 2914 may apply some post-processing (e.g., a moving average of the merged global envelope, as shown in FIG. 44) for a smoother envelope. In some configurations (for a minimum phase corresponding to the speech envelope, for example), the electronic device 2914 may apply discrete all-pole modeling to derive an all-pole filter from the merged global envelope. In these configurations, the minimum phase may be the all-pole filter frequency response's angle.

FIG. 44 is a graph illustrating an example of missing partial restoration. The graph in FIG. 44 is illustrated in amplitude (dB) 4476 over a frequency spectrum (Hz) 4404. In particular, FIG. 44 illustrates a speech spectrum 4449, a smoothed global envelope 4451 and restored speech spectrum 4453. The dashed vertical lines denote harmonic frequencies.

One application of the global envelope is to restore a missing component of the speech spectrum. Given fundamental frequencies and the global envelope, the electronic device 2914 may restore the spectrum by placing harmonic peaks with amplitudes determined by the global envelope when they are missing. For example, the fifth to fifteenth harmonic peaks (from approximately 400 Hz to 1400 Hz) may be restored as illustrated in FIG. 44. If a harmonic peak exists but is lower than the global envelope, the electronic device 2914 may increase the harmonic peak's amplitude to the envelope (as illustrated by the sixteenth and eighteenth harmonic peaks in FIG. 44, for example). If a harmonic peak exists but is higher than the global envelope, the electronic device 2914 may maintain its amplitude (as illustrated by the second and third harmonic peaks in FIG. 44, for example).

In some configurations of the systems and methods disclosed herein, an electronic device 2914 may generate a first model for a first local peak. The first local peak may have at least one missing neighboring peak located at neighboring harmonic positions of the first local peak. For example, the first local peak may be an unsupported local peak and the electronic device 2914 may generate the first model based on fixed 2-pole modeling. The electronic device 2914 may generate a second model for a second local peak based on neighboring peaks located at neighboring harmonic positions of the second local peak. For example, the second local peak may be a supported local peak and the electronic device 2914 may generate the second model based on adaptive 2-pole modeling. The electronic device 2914 may generate a merged envelope based on a combination of the first model and the second model. For example, the electronic device 2914 may perform a maximum operation with the models. For instance, the maximum operation may take the maximum (e.g., highest amplitude) value between the models for each frequency bin to produce a maximum envelope.

Figure 45:
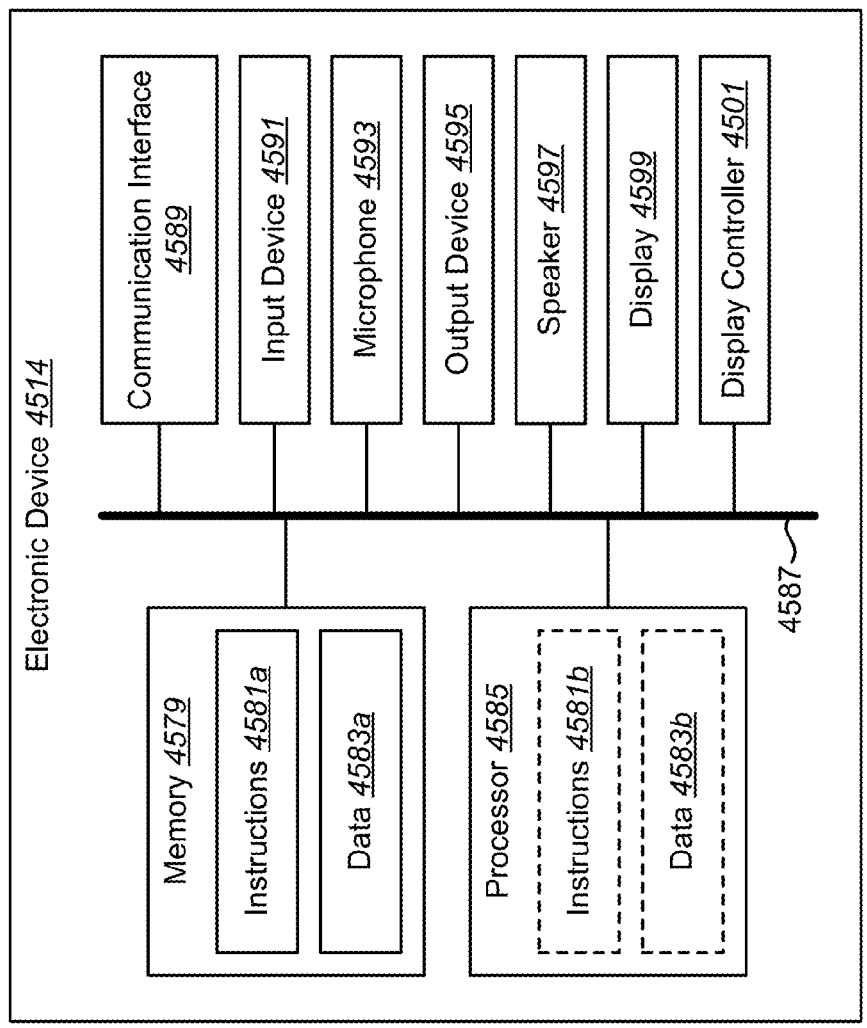
FIG. 45 illustrates various components that may be utilized in an electronic device.

FIG. 45 illustrates various components that may be utilized in an electronic device 4514. The illustrated components may be located within the same physical structure or in separate housings or structures. The electronic device 4514 described in connection with FIG. 45 may be implemented in accordance with one or more of the electronic devices 102, 302, 2914 described herein. The electronic device 4514 includes a processor 4585. The processor 4585 may be a general purpose single- or multi-chip microprocessor (e.g., an ARM), a special purpose microprocessor (e.g., a digital signal processor (DSP)), a microcontroller, a programmable gate array, etc. The processor 4585 may be referred to as a central processing unit (CPU). Although just a single processor 4585 is shown in the electronic device 4514 of FIG. 45, in an alternative configuration, a combination of processors (e.g., an ARM and DSP) could be used.

The electronic device 4514 also includes memory 4579 in electronic communication with the processor 4585. That is, the processor 4585 can read information from and/or write information to the memory 4579. The memory 4579 may be any electronic component capable of storing electronic information. The memory 4579 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 4583a and instructions 4581a may be stored in the memory 4579. The instructions 4581a may include one or more programs, routines, sub-routines, functions, procedures, etc. The instructions 4581a may include a single computer-readable statement or many computer-readable statements. The instructions 4581a may be executable by the processor 4585 to implement one or more of the methods, functions and procedures described herein. Executing the instructions 4581a may involve the use of the data 4583a that is stored in the memory 4579. FIG. 45 shows some instructions 4581b and data 4583b being loaded into the processor 4585 (which may come from instructions 4581a and data 4583a).

The electronic device 4514 may also include one or more communication interfaces 4589 for communicating with other electronic devices. The communication interfaces 4589 may be based on wired communication technology, wireless communication technology, or both. Examples of different types of communication interfaces 4589 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 4514 may also include one or more input devices 4591 and one or more output devices 4595. Examples of different kinds of input devices 4591 include a keyboard, mouse, microphone, remote control device, button, joystick, trackball, touchpad, lightpen, etc. For instance, the electronic device 4514 may include one or more microphones 4593 for capturing acoustic signals. In one configuration, a microphone 4593 may be a transducer that converts acoustic signals (e.g., voice, speech) into electrical or electronic signals. Examples of different kinds of output devices 4595 include a speaker, printer, etc. For instance, the electronic device 4514 may include one or more speakers 4597. In one configuration, a speaker 4597 may be a transducer that converts electrical or electronic signals into acoustic signals. One specific type of output device which may be typically included in an electronic device 4514 is a display device 4599. Display devices 4599 used with configurations disclosed herein may utilize any suitable image projection technology, such as a cathode ray tube (CRT), liquid crystal display (LCD), light-emitting diode (LED), gas plasma, electroluminescence, or the like. A display controller 4501 may also be provided, for converting data stored in the memory 4579 into text, graphics, and/or moving images (as appropriate) shown on the display device 4599.

The various components of the electronic device 4514 may be coupled together by one or more buses, which may include a power bus, a control signal bus, a status signal bus, a data bus, etc. For simplicity, the various buses are illustrated in FIG. 45 as a bus system 4587. It should be noted that FIG. 45 illustrates only one possible configuration of an electronic device 4514. Various other architectures and components may be utilized.

Figure 46:
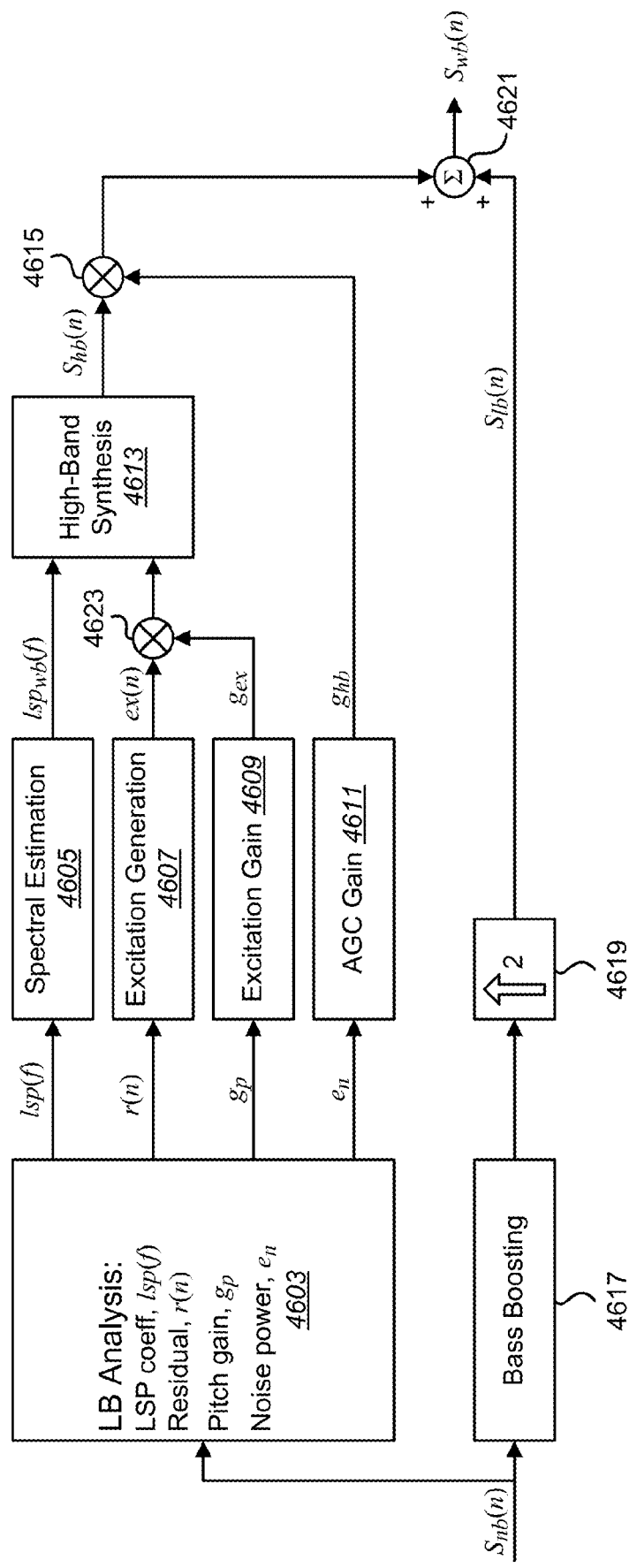
FIG. 46 is a block diagram illustrating an example of one approach for bandwidth extension.

FIG. 46 is a block diagram illustrating an example of one approach for bandwidth extension. Specifically, FIG. 46 illustrates a low-band (LB) analysis module 4603, a spectral estimation module 4605, an excitation generation module 4607, an excitation gain module 4609, an automatic gain control (AGC) gain module 4611, a high-band synthesis module 4613, a bass boosting module 4617, an up-sampling module 4619, mixers or multipliers 4615, 4623, and a summer 4621. One or more of the elements and/or modules described in connection with FIG. 46 may be implemented in an electronic device (e.g., electronic device 102, 302, 2914). For example, the bandwidth extension module 1567 described in connection with FIG. 15 may include one or more of the elements and/or modules described in connection with FIG. 46. It should also be noted that in FIG. 46, $S_{nb}(n)$ denotes a narrow-band signal, $S_{wb}(n)$ denotes a wide-band signal, $S_{lb}(n)$ denotes a low-band up-sampled signal, $S_{hb}(n)$ denotes a high-band synthesized signal, lsp(f) denotes narrow-band line spectral pair (LSP) coefficients, $lsp_{wb}(f)$ denotes wide-band LSP coefficients, r(n) denotes a residual signal, ex(n) denotes a high-band excitation signal, $g_p$ denotes pitch gain, $g_{ex}$ denotes excitation gain, $e_n$ denotes noise power and $g_{hb}$ denotes high-band synthesis gain.

In some configurations, the narrowband signal (e.g., $S_{nb}(n)$) may be a time-domain version of the combined subband signal (e.g., $X_{in\_first\_second}$). For example, an electronic device (e.g., electronic device 102, 302, 2914) may perform an inverse short-time Fourier transform (ISTFT) on the combined subband signal (e.g., $X_{in\_first\_second}$, 0-4 kHz) to obtain the time-domain narrowband signal (e.g., $S_{nb}(n)$). Additionally or alternatively, an electronic device (e.g., electronic device 102, 302, 2914) may perform a short-time Fourier transform (STFT) on the output of the bandwidth extension module 1576 (e.g., $S_{wb}(n)$) and only take a third subband (e.g., $X_{be}$, 4-8 kHz) for processing after the bandwidth extension.

More specifically, for example, the narrowband signal (e.g., $S_{nb}(n)$) may be provided to the LB analysis module 4603 and the bass boosting module 4617. The LB analysis module 4603 may produce LSP coefficients (e.g., lsp(f)), a residual signal (e.g., r(n)), a pitch gain (e.g., $g_p$) and a noise power (e.g., $e_n$).

The narrow-band LSP coefficients (e.g., lsp(f)) may be provided to the spectral estimation module 4605. The spectral estimation module 4605 may determine wide-band LSP coefficients (e.g., $lsp_{wb}(f)$) based on the narrow-band LSP coefficients. The wide-band LSP coefficients may be provided to the high-band synthesis module 4613.

The residual signal (e.g., r(n)) may be provided to the excitation generation module 4607. The excitation generation module 4607 may generate a high-band excitation signal (e.g., ex(n)) based on the residual signal. The high-band excitation signal may be provided to a mixer or multiplier 4623.

The pitch gain (e.g., $g_p$) may be provided to the excitation gain module 4609. The excitation gain module 4609 may determine an excitation gain (e.g., $g_{ex}$) based on the pitch gain. The excitation gain may be provided to the mixer or multiplier 4623. The mixer or multiplier 4623 may mix or multiply the high-band excitation signal with the excitation gain. The resulting product (e.g., a gain adjusted high-band excitation signal) may be provided to the high-band synthesis module 4613.

The high-band synthesis module 4613 may produce a high-band synthesized signal (e.g., $S_{hb}(n)$) based on the wide-band LSP coefficients and the gain-adjusted high-band excitation signal. The high-band synthesized signal may be provided to the mixer or multiplier 4615.

The noise power (e.g., $e_n$) may be provided to the AGC gain module 4611. The AGC gain module 4611 may determine a high-band synthesis gain (e.g., $g_{hb}$) based on the noise power. The high-band synthesis gain may be provided to a mixer or multiplier 4615. The mixer or multiplier 4615 may mix or multiply the high-band synthesis gain with the high-band synthesized signal. The resulting product (e.g., a gain-adjusted high-band synthesized signal) may be provided to the summer 4621.

The bass boosting module 4617 may boost (e.g., amplify, apply a gain to, etc.) the narrow-band signal. For example, the bass boosting module 4617 may boost all or a portion (e.g., a lower portion) of the narrow-band signal. The boosted signal may be provided to the up-sampling module 4619. The up-sampling module 4619 may up-sample the boosted signal to produce a low-band up-sampled signal (e.g., $S_{lb}(n)$). For example, the up-sampling module 4619 may double the number of samples of the boosted signal (e.g., up-sample the boosted signal by a factor of 2). The low-band up-sampled signal may be provided to the summer 4621.

The summer 4621 may sum the low-band up-sampled signal and the gain-adjusted high-band synthesized signal to produce the wide-band signal (e.g., $S_{wb}(n)$). As described above, an electronic device (e.g., electronic device 102, 302, 2914) may perform a short-time Fourier transform (STFT) on the output of the bandwidth extension module 1576 (e.g., the wide-band signal, $S_{wb}(n)$) and only take a third subband of the wide-band signal (e.g., $X_{be}$, 4-8 kHz) for processing after the bandwidth extension.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

It should be noted that one or more of the features, functions, procedures, components, elements, structures, etc., described in connection with any one of the configurations described herein may be combined with one or more of the functions, procedures, components, elements, structures, etc., described in connection with any of the other configurations described herein, where compatible. In other words, any compatible combination of the functions, procedures, components, elements, etc., described herein may be implemented in accordance with the systems and methods disclosed herein.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-Ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for speech restoration by an electronic device, comprising:
   obtaining a noisy speech signal;
   suppressing noise in the noisy speech signal to produce a noise-suppressed speech signal, wherein the noise-suppressed speech signal has a bandwidth comprising at least three subbands; and
   iteratively restoring each of the at least three subbands, wherein each of the at least three subbands is restored based on a combination of all previously restored subbands of the at least three subbands, wherein iteratively restoring each of the at least three subbands reduces more distortions over the bandwidth than restoring the noise-suppressed speech signal over the bandwidth without a basis on a restored subband.

2. The method of claim 1, wherein all previously restored subbands are lower in frequency than a current subband being restored.

3. The method of claim 1, further comprising:
   analyzing a first subband of the at least three subbands; and
   cleaning the first subband based on the analysis.

4. The method of claim 1, wherein restoring a first subband of the at least three subbands comprises:
   modeling an envelope of the first subband;
   modeling a phase of the first subband; and
   adjusting the first subband based on the envelope and the phase.

5. The method of claim 1, wherein iteratively restoring each of the at least three subbands comprises:
   searching a codebook based only on a first subband of the at least three subbands to determine a selected entry, wherein entries of the codebook span a bandwidth of the first subband and a second subband of the at least three subbands; and
   adjusting the second subband of the noise-suppressed speech signal based on the selected entry.

6. The method of claim 1, wherein iteratively restoring each of the at least three subbands comprises:
   determining a modeling confidence;
   determining a scaling factor based on the modeling confidence; and
   mixing envelopes corresponding to one or more of the at least three subbands based on the scaling factor.

7. The method of claim 1, wherein iteratively restoring each of the at least three subbands comprises:
   detecting a microphone level for voiced frames;
   detecting a processed speech level for the voiced frames;
   determining a gain based on the microphone level and the processed speech level; and
   applying the gain to a processed speech signal over the bandwidth.

8. The method of claim 1, wherein iteratively restoring each of the at least three subbands comprises:
   restoring a first subband of the at least three subbands to produce a restored first subband;
   restoring, based on the restored first subband, a second subband of the at least three subbands to produce a restored second subband; and
   restoring, based on the restored first subband and the restored second subband, a third subband of the at least three subbands to produce a restored third subband.

9. The method of claim 1, comprising restoring each of the at least three subbands, comprising pooling a restored first subband and a restored second subband of the at least three subbands.

10. The method of claim 1, comprising restoring each of the at least three subbands, comprising pooling a previously restored first subband and a previously restored second subband of the at least three subbands, and predicting a third subband of the at least three subbands based on the pooled restored first subband and restored second subband.

11. The method of claim 1, wherein each previously restored subband is nested within a combined frequency range of any previously restored subband and a current subband being restored.

12. An electronic device for speech restoration, comprising:
    a processor;
    memory in electronic communication with the processor;
    instructions stored in memory, the instructions being executable to:
       obtain a noisy speech signal;
       suppress noise in the noisy speech signal to produce a noise-suppressed speech signal, wherein the noise-suppressed speech signal has a bandwidth comprising at least three subbands; and
       iteratively restore each of the at least three subbands, wherein each of the at least three subbands is restored based on a combination of all previously restored subbands of the at least three subbands, wherein iteratively restoring each of the at least three subbands reduces more distortions over the bandwidth than restoring the noise-suppressed speech signal over the bandwidth without a basis on a restored subband.

13. The electronic device of claim 12, wherein all previously restored subbands are lower in frequency than a current subband being restored.

14. The electronic device of claim 12, wherein the instructions are further executable to:
    analyze a first subband of the at least three subbands; and
    clean the first subband based on the analysis.

15. The electronic device of claim 12, wherein restoring a first subband of the at least three subbands comprises:
    modeling an envelope of the first subband;
    modeling a phase of the first subband; and
    adjusting the first subband based on the envelope and the phase.

16. The electronic device of claim 12, wherein iteratively restoring each of the at least three subbands comprises:
    searching a codebook based only on a first subband of the at least three subbands to determine a selected entry, wherein entries of the codebook span a bandwidth of the first subband and a second subband of the at least three subbands; and
    adjusting the second subband of the noise-suppressed speech signal based on the selected entry.

17. The electronic device of claim 12, wherein iteratively restoring each of the at least three subbands comprises:
    determining a modeling confidence;
    determining a scaling factor based on the modeling confidence; and
    mixing envelopes corresponding to one or more of the at least three subbands based on the scaling factor.

18. The electronic device of claim 12, wherein iteratively restoring each of the at least three subbands comprises:
    detecting a microphone level for voiced frames;
    detecting a processed speech level for the voiced frames;

determining a gain based on the microphone level and the processed speech level; and applying the gain to a processed speech signal over the bandwidth.

19. The electronic device of claim 12, wherein iteratively restoring each of the at least three subbands comprises:

restoring a first subband of the at least three subbands to produce a restored first subband;

restoring, based on the restored first subband, a second subband of the at least three subbands to produce a restored second subband; and restoring, based on the restored first subband and the restored second subband, a third subband of the at least three subbands to produce a restored third subband.

20. The electronic device of claim 12, wherein the instructions are executable to restore each of the at least three subbands, comprising pooling a restored first subband and a restored second subband of the at least three subbands.

21. The electronic device of claim 12, wherein the instructions are executable to restore each of the at least three subbands, comprising pooling a previously restored first subband and a previously restored second subband of the at least three subbands, and predicting a third subband of the at least three subbands based on the pooled restored first subband and restored second subband.

22. The electronic device of claim 12, wherein each previously restored subband is nested within a combined frequency range of any previously restored subband and a current subband being restored.

23. An apparatus for speech restoration, comprising:

means for obtaining a noisy speech signal;

means for suppressing noise in the noisy speech signal to produce a noise-suppressed speech signal, wherein the noise-suppressed speech signal has a bandwidth comprising at least three subbands; and means for iteratively restoring each of the at least three subbands, wherein each of the at least three subbands is restored based on a combination of all previously restored subbands of the at least three subbands, wherein iteratively restoring each of the at least three subbands reduces more distortions over the bandwidth than restoring the noise-suppressed speech signal over the bandwidth without a basis on a restored subband.

24. The apparatus of claim 23, wherein the means for iteratively restoring a first subband of the at least three subbands comprises:

means for modeling an envelope of the first subband;
means for modeling a phase of the first subband; and
means for adjusting the first subband based on the envelope and the phase.

25. The apparatus of claim 23, wherein the means for iteratively restoring each of the at least three subbands comprises:

means for searching a codebook based only on a first subband of the at least three subbands to determine a selected entry, wherein entries of the codebook span a bandwidth of the first subband and a second subband of the at least three subbands; and means for adjusting the second subband of the noise-suppressed speech signal based on the selected entry.

26. A computer-program product for speech restoration, comprising a non-transitory computer-readable medium having instructions thereon, the instructions comprising:

code for causing an electronic device to obtain a noisy speech signal;

code for causing the electronic device to suppress noise in the noisy speech signal to produce a noise-suppressed speech signal, wherein the noise-suppressed speech signal has a bandwidth comprising at least three subbands; and code for causing the electronic device to iteratively restore each of the at least three subbands, wherein each of the at least three subbands is restored based on a combination of all previously restored subbands of the at least three subbands, wherein iteratively restoring each of the at least three subbands reduces more distortions over the bandwidth than restoring the noise-suppressed speech signal over the bandwidth without a basis on a restored subband.

27. The computer-program product of claim 26, wherein the code for causing the electronic device to iteratively restore a first subband of the at least three subbands comprises:

code for causing the electronic device to model an envelope of the first subband;

code for causing the electronic device to model a phase of the first subband; and code for causing the electronic device to adjust the first subband based on the envelope and the phase.

28. The computer-program product of claim 26, wherein the code for causing the electronic device to iteratively restore each of the at least three subbands comprises:

code for causing the electronic device to search a codebook based only on a first subband of the at least three subbands to determine a selected entry, wherein entries of the codebook span a bandwidth of the first subband and a second subband of the at least three subbands; and code for causing the electronic device to adjust the second subband of the noise-suppressed speech signal based on the selected entry.

* * * * *